United States Patent
Ito et al.

(10) Patent No.: US 6,800,569 B2
(45) Date of Patent: Oct. 5, 2004

(54) FILM FORMING METHOD, FILM FORMING APPARATUS, PATTERN FORMING METHOD, AND MANUFACTURING METHOD OF SEMICONDUCTOR APPARATUS

(75) Inventors: Shinichi Ito, Yokohama (JP); Tatsuhiko Ema, Kamakura (JP); Kei Hayasaki, Kamakura (JP); Rempei Nakata, Kamakura (JP); Nobuhide Yamada, Tokyo (JP); Katsuya Okumura, Tokyo (JP)

(73) Assignee: Kabushiki Kaisha Toshiba, Tokyo (JP)

(*) Notice: Subject to any disclaimer, the term of this patent is extended or adjusted under 35 U.S.C. 154(b) by 0 days.

(21) Appl. No.: 10/352,954

(22) Filed: Jan. 29, 2003

(65) Prior Publication Data

US 2003/0211756 A1 Nov. 13, 2003

(30) Foreign Application Priority Data

Jan. 30, 2002 (JP) ....................... 2002-022382
Feb. 8, 2002 (JP) ....................... 2002-031911
Apr. 2, 2002 (JP) ....................... 2002-100516

(51) Int. Cl.$^7$ ............................................. H01L 21/31
(52) U.S. Cl. .................. 438/780; 438/758; 438/782
(58) Field of Search ....................... 438/780, 758, 438/782; 427/240, 294, 350

(56) References Cited

U.S. PATENT DOCUMENTS 5,803,970 A * 9/1998 Tateyama et al. ........... 118/319
5,952,050 A * 9/1999 Doan .......................... 427/336
5,965,200 A * 10/1999 Tateyama et al. ........... 427/240

(List continued on next page.)

FOREIGN PATENT DOCUMENTS

| JP | 2-220428 | 9/1990 |
| JP | 6-151295 | 5/1994 |
| JP | 7-321001 | 12/1995 |
| JP | 9-92134 | 4/1997 |
| JP | 2000-77307 | 3/2000 |
| JP | 2000-77326 | 3/2000 |
| JP | 2000-79366 | 3/2000 |
| JP | 2000-188251 | 7/2000 |

(List continued on next page.)

OTHER PUBLICATIONS

Shinichi Ito, "Liquid Film Forming Method and Solid Film Forming Method", U.S. application No. 10/202,657, filed Jul. 25, 2002.

Nobuhide Yamada et al., "Method of Forming Coating Film, Method of Manufacturing Semiconductor Device and Coating Solution", U.S. application No. 10/112,951, filed Apr. 2, 2002.

Shinichi Ito et al., "Film Formation Method, Semiconductor Element and Method Thereof, and Method of Manufacturing a Disk-Shaped Storage Medium", U.S. application No. 09/842,403, filed Apr. 26, 2001.

Tatsuhiko Ema et al., Film-Forming Method, Film-Forming Apparatus and Liquid Film Drying Apparatus, U.S. application No. 09/961,288, filed Sep. 25, 2001.

*Primary Examiner*—John F. Niebling
*Assistant Examiner*—Olivia T. Luk
(74) *Attorney, Agent, or Firm*—Finnegan, Henderson, Farabow, Garret & Dunner, L.L.P.

(57) ABSTRACT

There is disclosed a film forming method comprising continuously discharging a solution adjusted so as to spread over a substrate by a given amount to the substrate through a discharge port disposed in a nozzle, moving the nozzle and substrate with respect to each other, and holding the supplied solution onto the substrate to form a liquid film, wherein a distance h between the discharge port of the nozzle and the substrate is set to be not less than 2 mm and to be in a range less than $5 \times 10^{-5}$ qγ (mm) given with respect to a surface tension γ (N/m) of the solution, discharge speed q (m/sec) of the solution continuously discharged through the discharge port, and a constant of $5 \times 10^{-5}$ (m·sec/N).

13 Claims, 29 Drawing Sheets

U.S. PATENT DOCUMENTS

| | | | | |
|---|---|---|---|---|
| 6,062,288 A | * | 5/2000 | Tateyama | 156/584 |
| 6,063,190 A | * | 5/2000 | Hasebe et al. | 118/52 |
| 6,092,937 A | * | 7/2000 | Snodgrass et al. | 396/611 |
| 6,120,834 A | * | 9/2000 | Terauchi | 427/96 |
| 6,162,745 A | | 12/2000 | Ito et al. | |
| 6,231,917 B1 | | 5/2001 | Ito et al. | |
| 6,410,080 B1 | | 6/2002 | Ito | |
| 6,416,583 B1 | * | 7/2002 | Kitano et al. | 118/680 |
| 6,475,285 B2 | | 11/2002 | Ikegami et al. | |
| 6,506,453 B2 | * | 1/2003 | Ema et al. | 427/424 |
| 6,709,699 B2 | * | 3/2004 | Ema et al. | 427/240 |

FOREIGN PATENT DOCUMENTS

| | | |
|---|---|---|
| JP | 2001-148338 | 5/2001 |
| JP | 2001-168021 | 6/2001 |
| JP | 2001-170546 | 6/2001 |
| JP | 2001-176765 | 6/2001 |
| JP | 2001-176781 | 6/2001 |
| JP | 2001-176786 | 6/2001 |
| JP | 2001-232250 | 8/2001 |
| JP | 2001-232269 | 8/2001 |
| JP | 2001-237179 | 8/2001 |

* cited by examiner

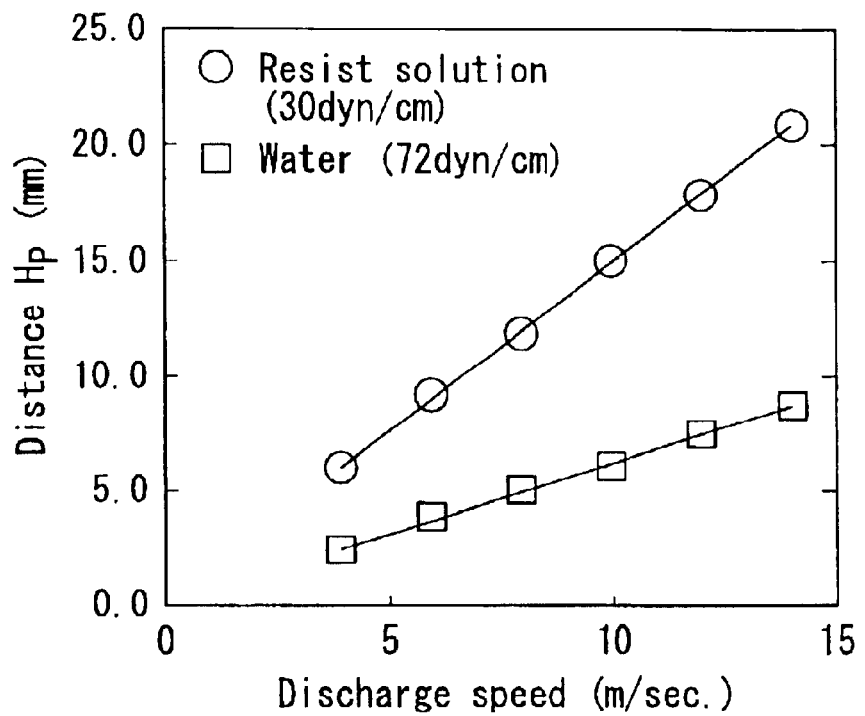
FIG. 4
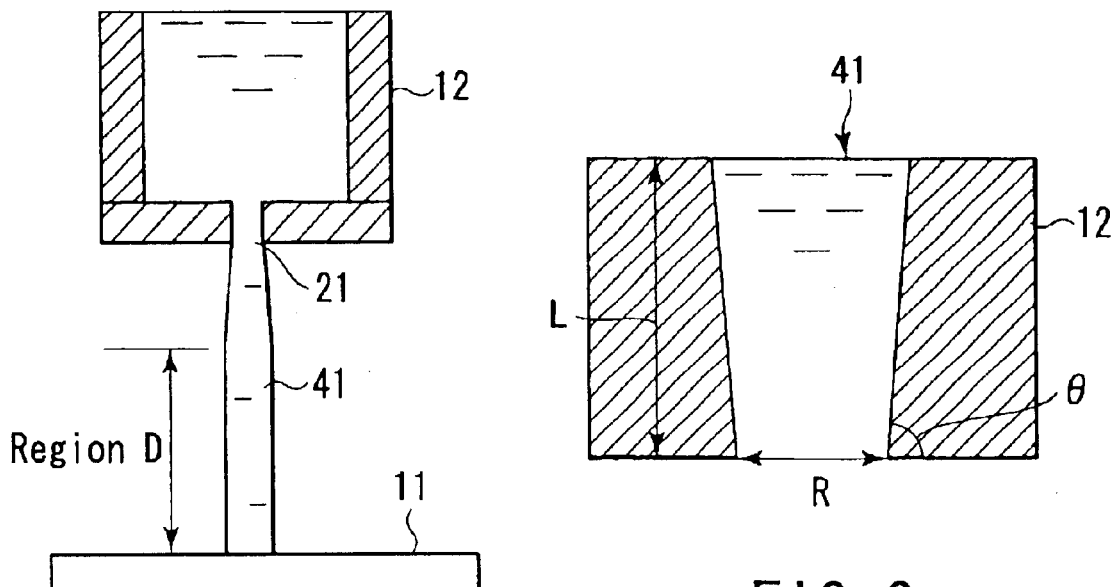
FIG. 5
FIG. 6

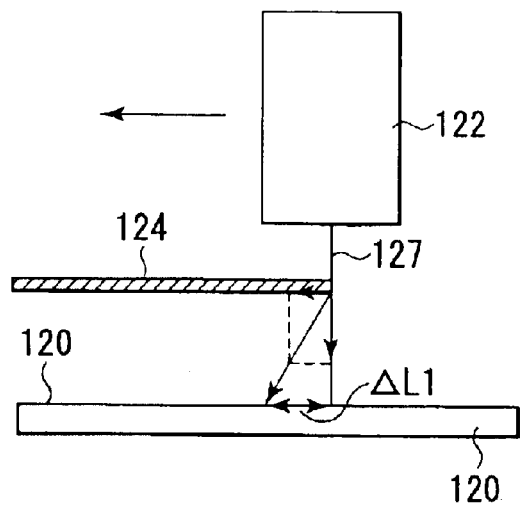
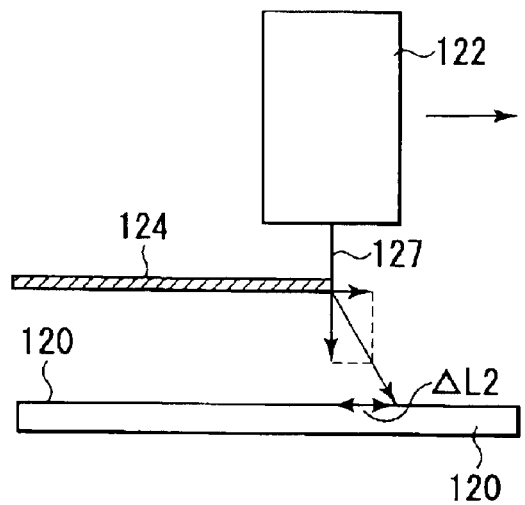
FIG. 15A  FIG. 15B
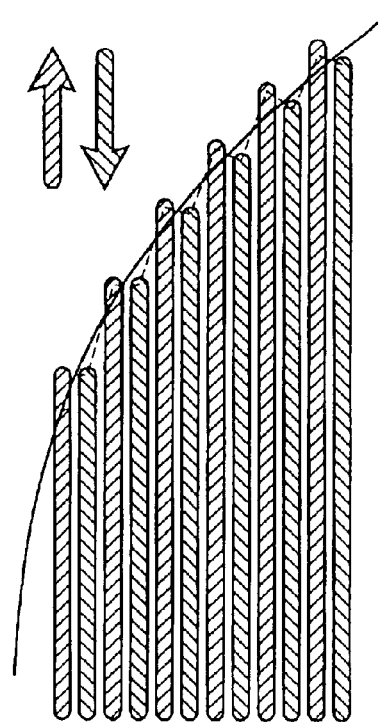
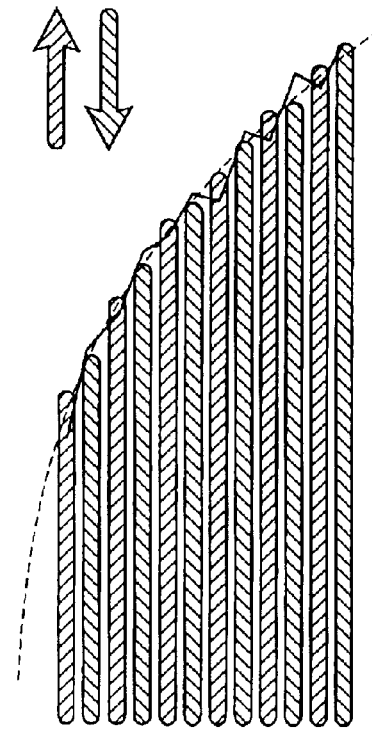
FIG. 16  FIG. 17

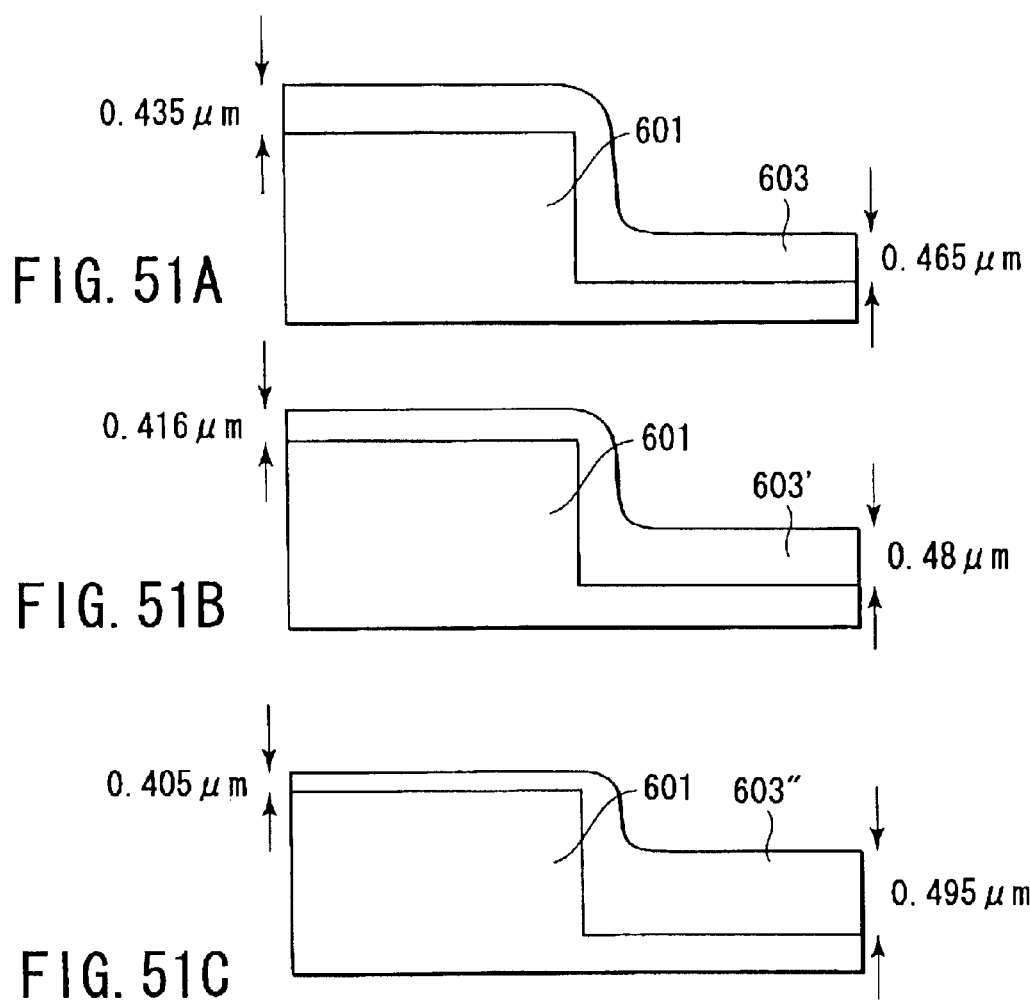
FIG. 51A
FIG. 51B
FIG. 51C
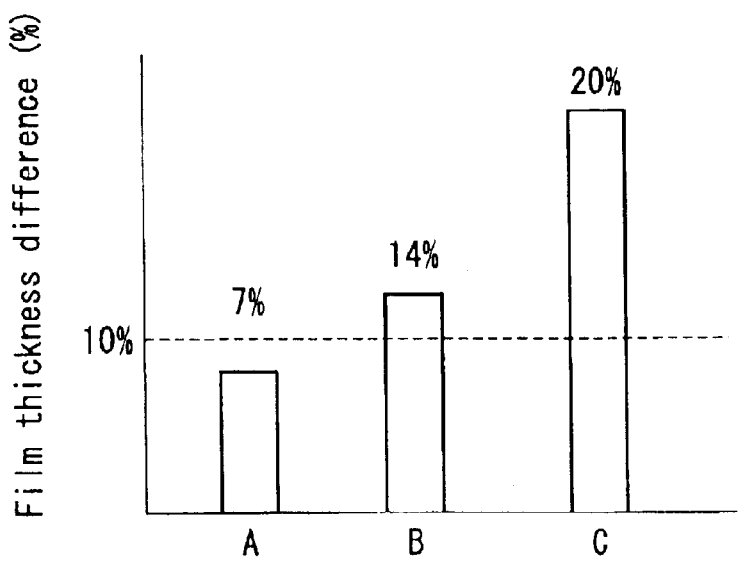
FIG. 52

FILM FORMING METHOD, FILM FORMING APPARATUS, PATTERN FORMING METHOD, AND MANUFACTURING METHOD OF SEMICONDUCTOR APPARATUS

CROSS-REFERENCE TO RELATED APPLICATIONS

This application is based upon and claims the benefit of priority from the prior Japanese Patent Applications No. 2002-22382, filed Jan. 30, 2002; No. 2002-31911, filed Feb. 8, 2002; and No. 2002-100516, filed Apr. 2, 2002, the entire contents of both of which are incorporated herein by reference.

BACKGROUND OF THE INVENTION

1. Field of the Invention

The present invention relates to a film forming method comprising: moving a substrate and nozzle with respect to each other; dropping solution onto the substrate from a solution discharge nozzle; and forming a liquid film of the solution on the substrate.

2. Description of the Related Art

To use a spin coating method in a lithography process and interlayer film formation, most of the solution dropped onto a substrate is discharged off the substrate, and a film is formed with the remaining several percent of the solution. Therefore, there is much waste, and the environment is adversely affected. Moreover, there has been a problem that turbulence is generated in an outer peripheral portion of a square substrate or a circular substrate having a large diameter of 12 inches or more, making the film thickness non-uniform in that portion.

As a method of uniformly coating the whole surface of the substrate without wasting in Jpn. Pat. Appln. KOKAI Publication No. 2-220428, a method is described which comprises: dropping resist from a large number of nozzles arranged in one row; and spraying a gas or solution onto a film forming surface from behind the nozzles to obtain a uniform film. Further, in Jpn. Pat. Appln. KOKAI Publication No. 6-151295, a large number of spray ports are disposed in a bar; and the resist is dropped onto the substrate from the ports to obtain a uniform film. Furthermore, in Jpn. Pat. Appln. KOKAI Publication No. 7-321001, a method is described comprising: using a spray head in which a large number of jet holes are formed to spray the resist; and moving the head with respect to the substrate to coat the substrate. In all of these coating apparatuses, a plurality of dropping or spray nozzles are transversely arranged in a row, so as to scan the nozzles along the substrate surface and a the uniform film. In addition to these coating methods, there is a method using one solution discharge nozzle, and scanning the nozzle to form a liquid film. This method has a problem that the treatment time per substrate depends on the operation method of the nozzles, and the amount of solution used becomes enormous.

As an apparatus for solving the problem, in Jpn. Pat. Appln. KOKAI Publication No. 9-92134, a method is disclosed which comprises: reciprocating/moving the solution discharge nozzle over the substrate to drop the solution onto the substrate. The method further comprises: stopping liquid supply in each terminal end of the reciprocating/moving on the substrate; and re-supplying the solution in a start point to form the coating film. However, the solution amount supplied onto the substrate slightly differs due to uneven liquid supply caused by stoppage and restart of liquid supply at the terminal end and start point, and a problem has occurred that film thickness uniformities of the liquid film and solid film formed from the liquid film are deteriorated.

On the other hand, in Jpn. Pat. Appln. KOKAI Publication Nos. 2000-77307, 2000-77326, 2000-79366, 2000-188251, 2001-148338, 2001-168021, 2001-170546, 2001-176781, 2001-176786, 2001-232250, and 2001-232269, a method is disclosed comprising: maintaining the discharge of the solution even in a turn-back portion in the reciprocating movement of the solution discharge nozzle; and supplying a coating film in which a film thickness distribution at an edge vicinity (the vicinity of turn-back of reciprocating movement) is not deteriorated. However, in the coating apparatus described in these publications, a distance between the solution discharge nozzle and substrate is not considered. Depending on the discharge speed from the solution discharge nozzle, surface tension of the solution, and distance between the solution discharge nozzle and substrate, in a process of spread of liquid flow before the solution reaches the substrate, liquid drops are produced by the surface tension of the liquid, and the liquid drops which have reached the substrate are sputtered, causing a problem of mist or vapor.

Moreover, in the above-described forming method in the liquid film, in each region of the substrate surface to be treated, because of differences of physical properties, discharge pressure of the nozzle, further variations in discharge amount of the solution, or turbulence of air currents at the coating time, the film thickness of the liquid film does not become uniform, and sometimes varies over the whole surface of the substrate. When a solvent in the liquid film is vaporized in this state, a film of a solid content (=solid film) is formed on the substrate with low flatness in accordance with the film thickness distribution of the liquid film.

Moreover, even when the liquid film is formed in a excellent flatness state, when a drying process is thereafter executed so as to vaporize the solvent, aggregation occurs toward the middle portion of the substrate. In this manner, the solid content moves with the movement of the liquid film in a transverse direction, and a difference in film thickness is generated in the movement direction.

When a such photo resist film which is formed using the such method is subjected to exposure and development processes to form a pattern, a critical dimension (CD) error is generated in the pattern. In a process in which this pattern is used as a mask to subject a lower layer film (e.g.: insulating film, and conductive wiring film) to etching processing, the CD error is further enlarged. This was an effect of reducing the yield.

As disclosed in Jpn. Pat. Appln. KOKAI Publication No. 2001-237179, with respect to the variation in thickness of the liquid film, there has heretofore been a method comprising: forming the liquid film; subsequently exposing the film to a solvent vapor to promote fluidity of the solution; and performing a so-called leveling treatment so that the surface of the liquid film is flatted by the surface tension.

However, in the prior-art leveling treatment, the solvent is unnecessarily supplied to the surface of the liquid film, and the film thickness is uneven. Inclination is generated in the film thickness of the liquid film (e.g., peripheral edge) by an inadequate condition.

Additionally, a manufacturing process of the semiconductor apparatus comprises: coating the substrate surface with a resist solution in which resist materials such as a resin, dissolution inhibitor (dissolution inhibitor group), and acid generating material (acid generation group) are dissolved in organic solvent (ethyl lactate, etc.) to form the liquid film; and subsequently evaporating the solvent in the liquid film to form the resist film. The resist film formed on the substrate is exposed to light, then bake-treated, cooled, and developed to form a resist pattern.

Some of the resist patterns formed as described above have a problem that the upper part of the resist pattern is rounded. Since the upper surface of the resist film is exposed to a developing liquid for a long time, the upper part becomes rounded. To solve this problem, a layer containing many dissolution inhibitor can be formed in the surface layer.

However, to form the layer containing many dissolution inhibitor in the surface layer, a prior art method has to comprise: coating the substrate with a first resist solution film; baking and forming a first resist film; coating the first resist film with a second resist solution film using a resist solution which containing the dissolution inhibitor more than the resist solution used in forming the first resist film; and baking and forming the second resist film. In this method, two resist films have to be separately formed, which lengthens manufacturing time.

As a prior-art method of forming the coating film on the substrate, there is a method comprising: relatively moving a discharge nozzle which discharges a given amount of solution on the substrate; discharging the solution over the whole surface of the substrate to form a liquid film; and thereafter evaporating the solvent by an appropriate dry method to form the film. In this method, a solution which has a small solid content and has a low viscosity in a range of about 0.001 Pa·s to 0.010 Pa·s (1 cp to 10 cp) is used. When the liquid film is formed on a substrate having a stepped portion in this coating method, the formed liquid film is fluidized by gravity, and a concave/convex portion is smoothed. A difference is generated in the thickness of the finally prepared coated film, that is, the film thickness of the concave portion increases and that of the convex portion decreases. As a result, there is a problem that a film having a uniform thickness cannot be formed on the substrate surface.

BRIEF SUMMARY OF THE INVENTION (1) According to one aspect of the present invention, there is provided a film forming method of discharging a solution from a discharge port of a nozzle onto the substrate, and then providing relative movement between the nozzle and the substrate while keeping the liquid discharging on the substrate, so as to form a liquid film on the substrate, wherein a distance h between the discharge port of the nozzle and the substrate is set to be not less than 2 mm and to be less than $Aq\gamma$ (mm), wherein q (m/sec) denotes a discharge speed of the solution continuously discharged through the discharge port, $\gamma$ (N/m) denotes a surface tension of the solution, and A (m·sec/N) is $5 \times 10^{-5}$.

(2) According to another aspect of the present invention, there is provided a film forming method comprising:

registering a surface tension $\gamma$ (N/m) of a solution adjusted so as to spread over the substrate by a given amount;

calculating a distance h between a discharge port of a nozzle and a substrate, which is not less than 2 mm and is less than $5 \times 10^{-5}$ q$\gamma$ (mm), from a discharge speed q (m/sec) of the. solution continuously discharged to the substrate through the discharge port of the nozzle, surface tension $\gamma$ (N/m) of the solution, and constant of $5 \times 10^{-5}$ (m·sec/N); and discharging a solution from a discharge port of a nozzle onto the substrate, and then providing relative movement between the nozzle and the substrate while keeping the liquid discharging on the substrate.

(3) According to further aspect of the present invention, there is provided a film forming method comprising: combining a linear movement in a column direction in which a nozzle passes along a substrate from one end of the substrate to the other end of the substrate with a movement in a row direction inside or outside the substrate to move the nozzle and substrate with respect to each other; continuously discharging a solution adjusted so as to spread over the substrate by a given amount through a discharge port disposed in the nozzle; holding the discharged solution on the substrate; and forming a liquid film, further comprising:

obtaining a deviation amount of a discharge amount of the solution from a desired value with respect to a discharge position of the solution, when the solution is discharged onto the substrate from the nozzle moving in a first column; and controlling the discharge amount in an arbitrary position in a second column so as to compensate for the deviation amount obtained in an adjacent discharge position on the first column, when the solution is discharged onto the substrate from the nozzle moving on a second column disposed adjacent to the first column.

(4) According to still another aspect of the present invention, there is provided a film forming method comprising: moving a nozzle in a diameter direction of a substrate over the substrate which rotates; continuously discharging a solution adjusted so as to spread over the substrate by a given amount through a discharge port disposed in the nozzle; and holding the supplied solution on the substrate to form a liquid film, further comprising:

obtaining a deviation amount of a supply amount of the solution from a desired value with respect to a discharge position of the solution, when the solution is supplied onto the substrate from the nozzle; and controlling the supply amount of the solution discharged to a first position, so as to compensate for the deviation amount in a second position which is disposed adjacent to the first discharge position in the diameter direction of the substrate and to which the solution has already been discharged, during the supply of the solution into the first position of the substrate from the nozzle.

(5) According to further aspect of the present invention, there is provided a film forming method comprising: combining a linear movement in a column direction in which a nozzle passes along a substrate from one end of the substrate to the other end of the substrate with a movement in a row direction inside or outside the substrate to move the nozzle and substrate with respect to each other; continuously discharging a solution adjusted so as to spread over the substrate by a given amount through a discharge port disposed in the nozzle; holding the discharged solution on the substrate; and forming a liquid film, further comprising:

cutting off the solution discharged onto the substrate from the nozzle so that a supply start point and supply end point of the solution discharged onto the substrate from the nozzle reach a liquid film edge forming position apart from each edge of the substrate by a given width d during the movement of the nozzle in the column direction.

(6) According to further aspect of the present invention, there is provided a film forming method comprising: combining a linear movement of a column direction in which a nozzle passes along a circular substrate from one end of the circular substrate through the other end of the substrate with a movement of a row direction in the vicinity of an edge of the circular substrate to move the nozzle and substrate with respect to each other; continuously discharging a solution adjusted so as to spread over the circular substrate by a given amount to the substrate through a discharge port disposed in the nozzle; holding the discharged solution onto the substrate; and forming a liquid film over the whole surface of the substrate to an end position from a start position, wherein a movement speed of the column direction of the nozzle in the vicinity of the start position is set to be lower than the movement speed of the column direction of the nozzle in a middle position of the substrate; and the movement speed of the column direction of the nozzle in the vicinity of the end position is set to be higher than the movement speed of the column direction of the nozzle in the middle position of the substrate.

(7) According to further aspect of the present invention, there is provided a film forming method comprising: combining a linear movement of a column direction in which a nozzle passes along a circular substrate from one end of the circular substrate through the other end of the substrate with a movement of a row direction in the vicinity of an edge of the circular substrate to move the nozzle and substrate with respect to each other; continuously discharging a solution adjusted so as to spread over the circular substrate by a given amount to the substrate through a discharge port disposed in the nozzle; holding the discharged solution onto the substrate; and forming a liquid film over the whole surface of the substrate to an end position from a start position, wherein a movement distance of the row direction of the nozzle in the vicinity of the start position is set to be longer than the movement distance of the row direction of the nozzle in a middle position of the circular substrate; and the movement distance of the row direction of the nozzle in the vicinity of the end position is set to be shorter than the movement distance of the row direction of the nozzle in the middle position of the substrate.

(8) According to further aspect of the present invention, there is provided a film forming method comprising: combining a linear movement of a column direction in which a nozzle passes along a circular substrate from one end of the circular substrate through the other end of the substrate with a movement of a row direction in the vicinity of an edge of the circular substrate to move the nozzle and substrate with respect to each other; continuously discharging a solution adjusted so as to spread over the circular substrate by a given amount to the substrate through a discharge port disposed in the nozzle; holding the discharged solution onto the substrate; and forming a liquid film over the whole surface of the substrate to an end position from a start position, wherein a time interval from when the solution supply to the substrate by the movement of the column direction of the nozzle including the movement of the row direction of the nozzle is temporarily discontinued until the solution supply to the substrate by the movement of the column direction of the nozzle is restarted is set to be constant.

(9) According to one aspect of the present invention, there is provided a film forming method comprising:

forming a liquid film constituted of a solution including a first solvent and solid content on a substrate;

containing the substrate in a container;

starting a leveling treatment to flat the surface of the liquid film in a state in which an atmosphere including a second solvent is formed in the container;

measuring flatness of the surface of the liquid film during the leveling treatment;

controlling at least one of the atmosphere in the container and temperature of the substrate based on the measured flatness during the leveling treatment to enhance the flatness of the surface of the liquid film;

ending the leveling treatment; and forming a solid film including the solid content on the substrate.

(10) According to further aspect of the present invention, there is provided a film forming method comprising:

forming a liquid film including a solid content and solvent on a substrate;

starting a drying treatment to remove the solvent in the liquid film;

measuring flatness of the surface of the liquid film during the drying treatment;

controlling at least one of the atmosphere of environment in which the substrate exists, temperature of the substrate, and rotation speed of the substrate based on the measured flatness during the drying treatment to enhance the flatness; and ending the drying treatment to form a solid film including the solid content on the substrate.

(11) According to one aspect of the present invention, there is provided a film forming apparatus comprising:

a support unit to support a substrate on the surface of which a liquid film including a first solvent is formed;

a container including the support unit disposed in an inner space;

a gas supply unit which includes a discharge port and which supplies gas including a second solvent into the container through the discharge port;

an exhaust unit which exhausts air from the atmosphere in the container;

an optical system which irradiates the liquid film on the substrate supported on the support unit with light, receives reflected light from the liquid film, and obtains reflected light intensity; and an analysis unit which analyzes the reflected light intensity obtained by the optical system to measure flatness of the liquid film surface and which controls the exhaust unit and gas supply unit so as to enhance the measured flatness.

(12) According to another aspect of the present invention, there is provided a film forming method comprising:

forming a liquid film including a solution in which a first material is dissolved in a solvent on a substrate;

removing the solvent from the liquid film, until a substrate side of the liquid film solidifies and the solvent remains on a side opposite to the substrate side;

supplying a second material into the liquid film in a state in which the solvent remains in a surface layer of the liquid film; and removing the solvent remaining in the liquid film to form a solid film.

(13) According to further aspect of the present invention, there is provided a film forming method comprising:

preparing a substrate which includes a concave/convex portion having a stepped portion height of d and in which a rate of an area of the convex portion to the whole area is a (1>a>0) and a rate of an area of the concave portion to the whole area is 1−a;

discharging a solution in which a solid content is dissolved in a solvent, moving a discharge nozzle and substrate with respect to each other, and forming a liquid film on the substrate; and removing the solvent in the liquid film, and forming a solid film including the solid content, wherein the liquid film is formed so that a thickness h of the liquid film satisfies a relation of h>(11−a)d.

BRIEF DESCRIPTION OF THE SEVERAL VIEWS OF THE DRAWING

FIG. 4 is a diagram showing a relation of a discharge speed of the solution with a distance $H_p$ from the discharge port in a liquid drop state;

FIG. 5 is an explanatory view showing definition of a region D in which spread of the solution discharged through the discharge port is stabilized;

FIG. 6 is an enlarged view of a section of the discharge port of the solution discharge nozzle;

FIGS. 15A, 15B are diagrams showing an error of a coat region generated in a shutter;

FIG. 16 is a diagram showing an edge profile of the liquid film formed by a related-art shutter position;

FIG. 17 is a diagram showing the edge profile of the liquid film formed by the shutter position according to the present embodiment;

FIGS. 51A to 51C are a sectional view showing the film thickness distribution of the resist film formed on the substrate which has a stepped portion;

FIG. 52 is a graph showing a ratio of a film thickness difference with respect to an average film thickness;

DETAILED DESCRIPTION OF THE INVENTION

Embodiments of the present invention will be described hereinafter with reference to the drawings.

First Embodiment

Figure 1:
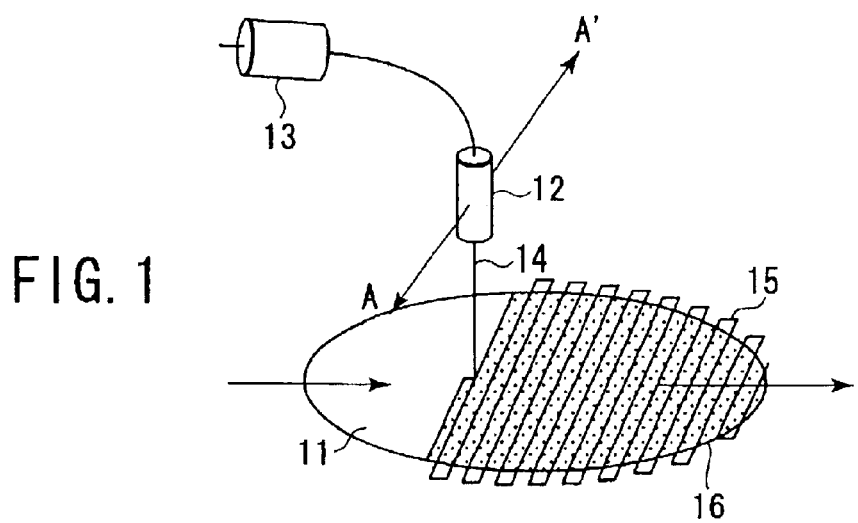
FIG. 1 is a diagram showing a schematic constitution of a liquid film forming apparatus according to a first embodiment.

FIG. 1 is a diagram showing a schematic constitution of a liquid film forming apparatus according to a first embodiment. FIGS. 2A to 2D are sectional views showing a film forming process according to the first embodiment of the present invention.

As shown in FIG. 1, a substrate 11 is horizontally laid on a substrate movement mechanism (not shown). A solution discharge nozzle 12 is disposed above the substrate 11. The solution discharge nozzle 12 reciprocates/moves in a direction crossing at right angles to a movement direction of the substrate 11 by a nozzle movement mechanism (not shown). The solution discharge nozzle 12 includes a discharge port through which a solution 14 supplied from a solution supply pump 13 is discharged with respect to the substrate 11.

A method of forming a liquid film on the substrate 11 comprises: discharging the solution 14 onto the substrate 11 through a discharge port of the solution discharge nozzle 12; reciprocating/moving the solution discharge nozzle 12 in a column direction; and linearly discharging the solution onto the substrate 11. Moreover, when the solution discharge nozzle 12 is positioned in a region other than a region on the substrate 11 or outside a desired film forming region in the substrate, the substrate 11 is moved in a row direction crossing at right angles to the column direction of the solution discharge nozzle 12. Note that numeral number 15 in FIG. 1 denotes the track of the discharged port on the substrate.

The solution linearly supplied onto the substrate 11 spreads by fluidity of the solution itself, and linear solutions disposed adjacent to one another join up, forming liquid film 16.

Figure 2A:
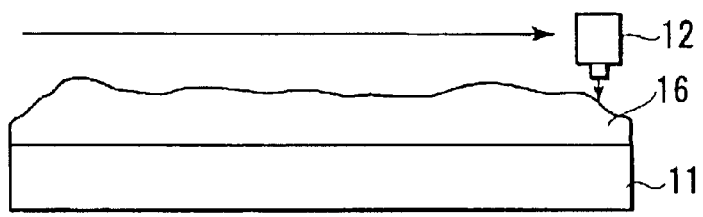
FIGS. 2A to 2D are sectional views showing a film forming process according to the first embodiment.

When the nozzle moves in the row direction as one direction to a liquid film forming end position from a liquid film forming start position, the supply of the solution is performed with respect to substantially the whole substrate 11, and the liquid film 16 is formed substantially over the whole surface of the substrate 11 (FIG. 2A).

Figure 2B:
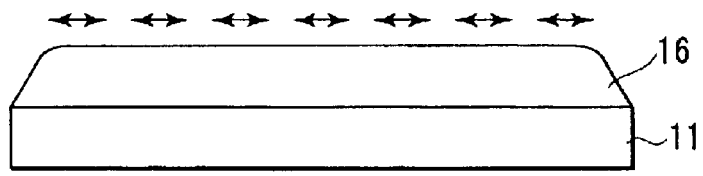

According to circumstances, the unit of FIG. 1 or apparatus (not shown) is used to perform a leveling treatment by leaving the film to stand in an atmosphere containing a solvent, and the surface of the liquid film 16 is flatted (FIG. 2B). That is, when the solution discharges, the discharge amount fluctuates, and a concave/convex portion is formed in the surface of a liquid film 16. Then, if necessary, first the leveling treatment is performed to flat the surface of the liquid film 16.

Figure 2C:
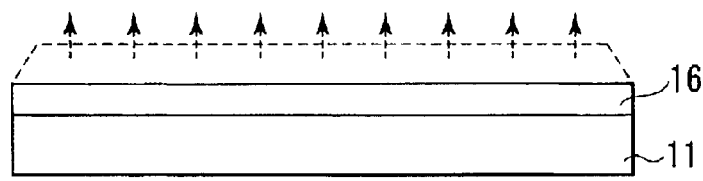
Figure 2D:
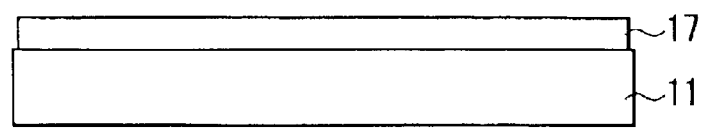

The substrate 11 is conveyed into a drying apparatus (not shown). The solvent in the liquid film 16 is removed by a pressure reduction or heating mechanism in the drying apparatus (FIG. 2C). A solid film 17 having a predetermined thickness is formed on the substrate 11 (FIG. 2D).

In the present embodiment, a procedure will be described comprising: optimizing a distance between the discharge port of the solution discharge nozzle 12 and the substrate 11 and produced position of liquid drops; and supplying the solution onto the substrate from the solution discharge nozzle in this state, so that a satisfactory film thickness distribution having few defects is provided.

Figure 3:
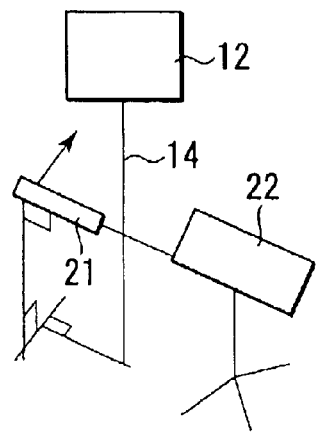
FIG. 3 is a diagram showing concept of an observation system for use in obtaining a distance between a discharge port of a solution discharge nozzle and a substrate.

FIG. 3 is a diagram showing the concept of an observation system for use in obtaining the distance between the discharge port of the solution discharge nozzle and the substrate.

As shown in FIG. 3, a laser light source 21 and video camera for observation 22 are disposed so as to hold the solution 14 discharged through the discharge port of the solution discharge nozzle 12. It can easily be judged whether the solution 14 discharged through the discharge port has a liquid drop state by judging whether or not the laser beam emitted to the solution 14 is scattered. A region in which scattering is confirmed is regarded as a liquid drop forming region.

This observation optical system was used to conduct an experiment in which a relation of a discharge speed with a distance Hp from the discharge port in the liquid drop state was obtained with respect to a resist solution including ethyl lactate in the solvent and including a solid content of 2%. Note that the surface tension of the resist solution is $30 \times 10^{-3}$ N/m and this is substantially the same as that of the solvent.

FIG. 4 shows the relation of the discharge speed with the distance Hp from the discharge port through which the solution is in the liquid drop state. As shown in FIG. 4, it has been found that the discharge speed has a proportional relation with the distance Hp for the resist solution used in the experiment. FIG. 4 also shows a result of similar measurement performed with respect to pure water. With water, the proportional relation is obtained between the discharge speed and distance Hp. In addition to these solutions, an experiment was also carried out with respect to various solutions of solvents having different surface tensions, such as methanol (surface tension=$22.6 \times 10^{31}$ $^3$ N/m) and hexane (surface tension=$18.4 \times 10^{-3}$ N/m). In all experiments, a proportional relation was obtained. From these proportional relations, a relation of a discharge speed q (m/sec) from the solution discharge nozzle with the distance Hp (mm) is further represented by the following equation (2) using a surface tension γ (N/m) of the solution.

$$Hp \geq 5 \times 10^{-5} \, q\gamma \quad (1)$$

wherein a dimension of a constant $5 \times 10^{-5}$ is m·sec/N.

It is seen from the equation (1) that the distance h between the discharge port of the solution discharge nozzle and the substrate is as follows in supplying the solution having the surface tension γ (N/m) onto the substrate at the discharge speed q (m/sec):

$$h < 5 \times 10^{-5} \, q\gamma \leq Hp \quad (2)$$

In the present example, in order to obtain a liquid film having an average thickness of 15 μm, a constant movement speed of the solution discharge nozzle on the substrate was set to 1 m/sec, a pitch of liquid lines on the substrate was set to 0.4 mm, and the resist solution (surface tension=$30 \times 10^{-3}$ N/m) including the solid content of 2% was discharged through the discharge port having a diameter of 40 μm at a discharge speed of 4.77 m/s. In this case, from the equation (2), an upper limit $h_{max}$ of the distance h was determined as follows:

$$h_{max} < 0.05[\text{m·s/N}] \times 4.77[\text{m/s}] \times 30 \times 10^{-3} [\text{N/m}] = 7.16 \, [\text{mm}] \quad (3)$$

A lower limit of the distance between the discharge port of the solution discharge nozzle and the substrate was determined as a distance to obtain a region D in which the spread of the solution discharged through the discharge port is substantially stabilized. FIG. 5 shows a defined region of the stabilized region D. The solution 41 discharged through a discharge port 21 of the solution discharge nozzle 12 rapidly spreads immediately after the discharge, thereafter slowly spreads, and reaches the substrate 11. The spread differs according to diameter, shape (taper angle), and length of the discharge port 21 shown in FIG. 6, and viscosity of the solution. In the above-described coating method, a diluted solution is obtained at about several times $10^{-3}$ Pa·s. Moreover, the discharge port 21 of the solution discharge nozzle 12 having a shape of (length of discharge port)/(diameter of discharge port)≥2 and a taper angle of 70° to 110° was used. Moreover, the discharge port 21 having a diameter of about 20 to 100 μm was used.

Note that the stabilized region D is defined as a region where a spread width of 0.8 $D_W$ or more is obtained with respect to a spread width $D_W$ of the solution discharged in $h=5\times10^{-5}$ qγ. The viscosity of the solution was set to a range of 1 to $8\times10^{-3}$ Pa·s, the discharge port shape of the solution discharge nozzle (length of discharge port)/(diameter of discharge port) was set to a range of 2 to 5, and the taper angle θ of the discharge port was set to a range of 70° to 110°. In these ranges, a plurality of nozzles were manufactured on trial in which the diameter of the discharge port was changed in a range of 20 to 100 μm. The observation system shown in FIG. 3 was used to change the discharge speed and measure the distance to the region D from the discharge port. It has been found that the liquid spread is influenced particularly by the discharge speed and the taper angle of the discharge port, but the stabilized region D is obtained in any condition when the distance from the discharge port was between 1 and 2 mm. It was confirmed that the stabilized region D was reached at h=1 mm, but with the discharge in this state, the solution reaching the substrate bounces back and dirties the surface of the nozzle disposed opposite the substrate. The distance h was changed to confirm the degree of contamination, and it has been found that the problem can be solved by making the distance h of 2 mm or more. From these studies, the lower limit of the distance between the solution discharge nozzle and substrate may be set to 2 mm. Note that with the supply of the solution onto the substrate at a distance of 2 mm or less, the spread of the solution on the substrate by the fluidity cannot sufficiently be obtained, or the nozzle is contaminated. Therefore, uniformity of the liquid film thickness was ±10% or more, and only a liquid film inappropriate for practical use can be obtained.

It is apparent from the above-described studies that the distance h between the discharge port of the solution discharge nozzle and the substrate is preferably set as follows:

$$2\text{ [mm]} < h < 5\times10^{-5}\text{ q}\gamma \tag{4}$$

The apparatus of FIG. 1 was used to adjust the distance h in a range of 0.5 mm to 10 mm, an 8-inch wafer was coated with the resist solution to form the liquid film, and further the solvent in the solution was dried/removed to form a solid film. Here, the solvent was removed, after the substrate with the liquid film formed thereon was exposed to an atmosphere of ethyl lactate as that of the solvent included in the liquid film and the liquid film was leveled. The substrate on which the liquid film was leveled was moved into a pressure reduction chamber, the pressure inside the pressure reduction chamber was reduced, and the solvent was removed in the state of the pressure held in the vicinity of a saturated vapor pressure of ethyl lactate. Furthermore, after the pressure was returned to normal, the substrate was conveyed out of the pressure reduction chamber, heated at 140° C. on a hot plate, and any remaining solvent present in the film was removed. Note that the substrate may directly be heated by a baker, instead of using a hot plate in times of the solvent in the solution was dried/removed exposing the substrate to reduced pressure. Moreover, the substrate may be rotated, and dried by air.

Figure 7:
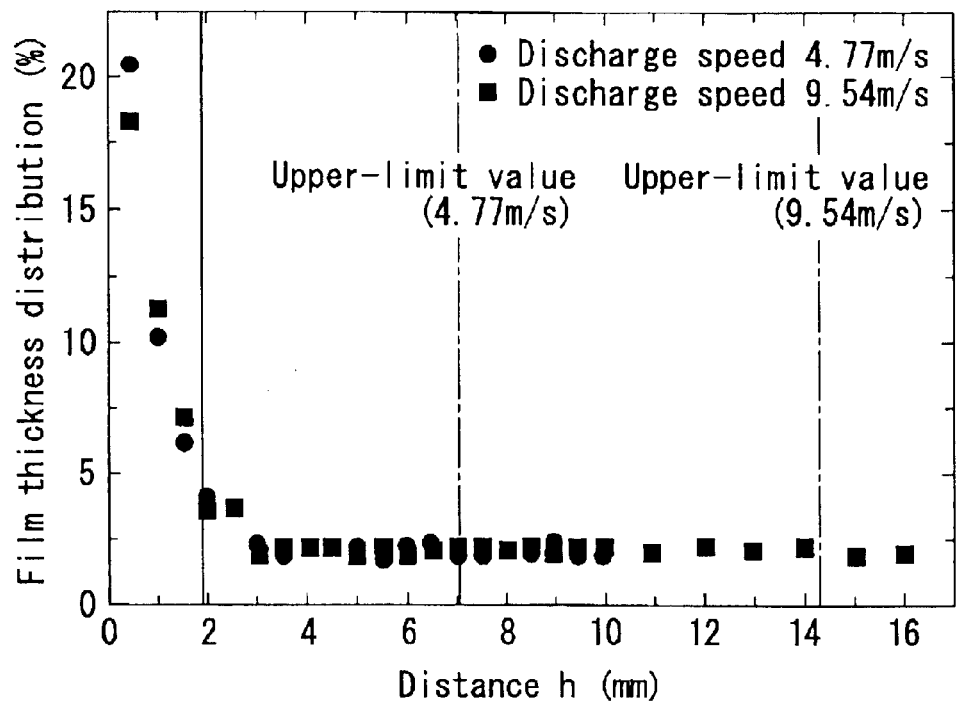
FIG. 7 is a diagram showing a relation of a film thickness distribution in a wafer surface to a distance h between the discharge nozzle of the solution discharge nozzle and the substrate.

The discharge speed from the discharge port of the solution discharge nozzle was set to 4.77 m/sec and doubled to 9.54 m/sec, and the liquid film was formed. Note that the movement speed of the solution nozzle was set to 1 m/sec with the discharge speed of 4.77 m/sec and the movement speed of the solution discharge nozzle was set to 2 m/sec with the discharge speed of 0.54 m/sec so as to obtain the same liquid film thickness at both the discharge speeds. Moreover, when the discharge speed was 4.77 m/s, an upper-limit distance Hp was 7.16 mm. When the discharge speed was 9.54 m/s, the upper-limit distance Hp was 14.3 mm With respect to the formed solid film, a relation of a film thickness distribution (range %) in a wafer surface to the distance h between the discharge nozzle of the solution discharge nozzle and the substrate is shown in FIG. 7. Moreover, a relation of the number of particles per wafer with respect to the discharge port-substrate distance h is shown in FIG. 8.

As seen from FIG. 7, with the resist solution, for the film thickness uniformity, when the discharge port-substrate distance h was set to 3 mm or more, it was possible to obtain a stabilized value. Note that to form interlayer films or to apply a solution including a low-dielectric material, a range of film thickness uniformity of about 5% is sufficient, and therefore the distance is preferably 2 mm or more.

Figure 8:
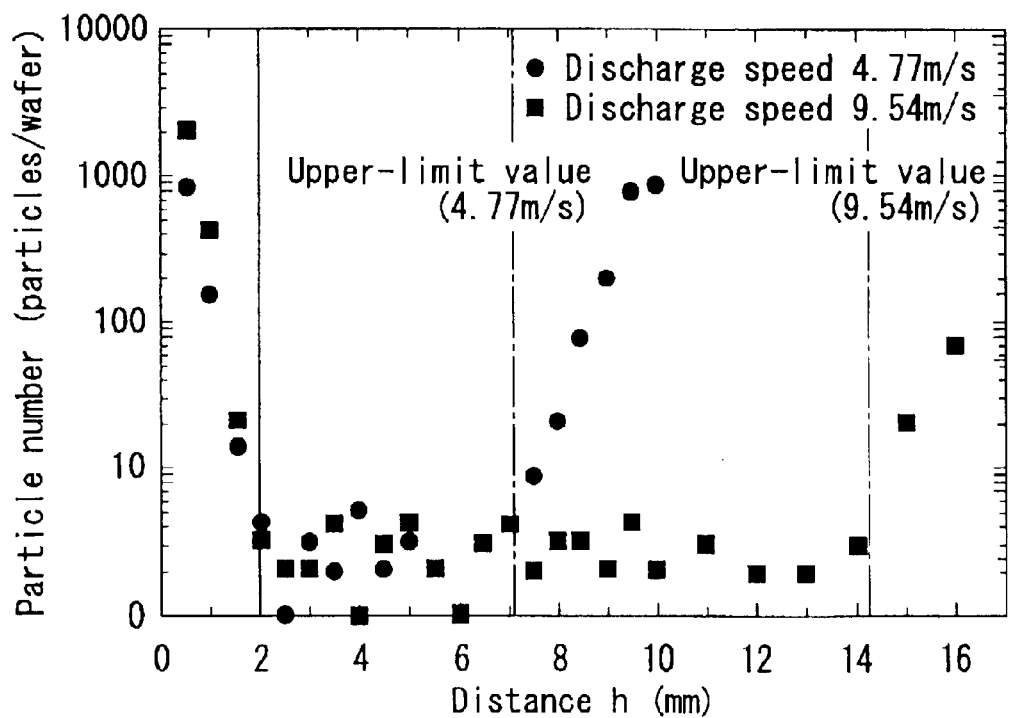
FIG. 8 is a diagram showing a relation of the number of particles per wafer with respect to distance h between the discharge port and substrate.

For the result of particles of FIG. 8, a satisfactory result was obtained in a range which satisfied the equation (4) with respect to each discharge speed, and the result was also obtained that the number of defects increased in another region. The reason why there are many defects with h≦2 mm is that the distance between the nozzle and substrate is short, therefore the solution sputtered on the substrate stuck to the nozzle, and this discharged onto the substrate, generating defects, or that the solution contacting the nozzle was scattered as a mist, and stuck to the substrate, generating defects. One reason why the particles increase at an upper-limit distance Hp or more distance is thought to be that a part of the solution discharged as described above forms micro liquid drops, providing a mist which generates the particles. Due to this, the distance h between the discharge port of the solution discharge nozzle and the substrate may be set in the range which satisfies the condition of the equation (4).

It is possible to automatically set the distance h between the discharge port of the solution discharge nozzle and the substrate in the coating apparatus. In this case, the coating apparatus is constituted so that the surface tension γ (N/m) of the solution to be applied can be registered. On an apparatus side, an appropriate distance h may be calculated by the equation (4) in accordance with the registered surface tension γ and discharge speed q (m/sec) at this time. The distance between the discharge port of the solution discharge nozzle and the substrate is adjusted so as to reach the obtained appropriate distance h before the solution is supplied to the substrate. For the adjustment of the distance, the substrate may be moved upwards/downwards, a solution discharge nozzle driving system may be moved, or both may be moved.

Figure 9:
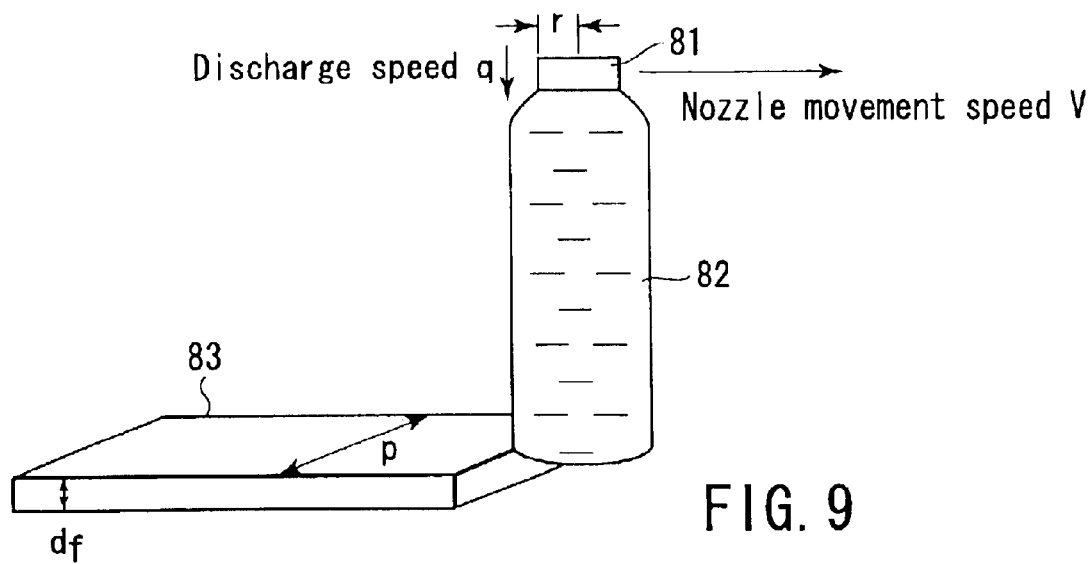
FIG. 9 is an explanatory view of a method of calculating a discharge speed q of the solution.

The discharge speed q (m/sec) may directly be inputted by an operator, or is preferably automatically calculated in the coating apparatus. FIG. 9 is an explanatory view of a method of calculating the discharge speed q of the solution, when relative movement of the solution discharge nozzle and substrate is constituted of a combination of linear movement of the column direction of the solution discharge nozzle passing along the substrate from one end of the substrate through to the other end of the substrate with movement of the row direction outside the substrate. As shown in FIG. 9, assuming that for a discharge speed q (m/sec) of a solution 82, a desired average liquid film thickness of a liquid film 83 is df, a movement pitch of the row direction of the nozzle is p (=width of unit liquid film), a radius of a discharge hole 81 of the solution discharge nozzle is r, and the speed of the linear movement of the column direction of the solution discharge nozzle passing along the substrate from one end of the substrate to the other end of the substrate is v (m/s), the following relation is established from a relation in which a liquid amount of a coat region is equal to an amount of discharged liquid:

$$d_l[m] \times p[m] \times v[m/s] = \pi (r[m])^2 q[m/s] \quad (5)$$

When this relation is organized with respect to the discharge speed q of the solution 82, the following relation is obtained:

$$q = d_l \times p \times v / \pi r^2 \quad (6)$$

Note that the average liquid film thickness can easily be obtained using a desired average film thickness of the solid film, solid content concentration in the solution, and density of solid and liquid films by means described in a conventional chemistry textbook.

For the relative movement of the solution discharge nozzle and substrate, even when the solution discharge nozzle moves in a spiral form toward an outer periphery from the center of the substrate or inwards from the outer periphery, the following relation is established:

$$d_l[m] \times p[m] \times v[m/s] \approx \pi (r[m])^2 q[m/s] \quad (7)$$

wherein the desired average liquid film thickness is assumed to be $d_l$, movement pitch of the discharge nozzle of the diameter direction per one rotation of the substrate in an outermost periphery is p, the discharge hole radius of the solution discharge nozzle is r, and a relative linear velocity of the solution discharge nozzle with respect to the substrate in the outermost periphery is v.

When this equation is organized with respect to q, the following relation can be obtained:

$$q = d_l \times p \times v / \pi r^2 \quad (8)$$

Note that the distance h may be in any region within the range obtained by the equation (4). To simply obtain the distance in the apparatus, the distance may also be determined as an intermediate value between the upper and lower limits. Moreover, when a solution cut-off function such as a shield plate is disposed between the solution discharge nozzle and substrate, and the position of the solution cut-off function is apart from the discharge port of the solution discharge nozzle by 2 mm or more, it is necessary to regard the position of solution discharge nozzle as the lower limit and set h.

Moreover, when the solution is supplied onto the substrate by the combination of the movement of the column direction of the nozzle with the movement of the row direction, the method described in the present embodiment can be applied not only to a circular substrate but also to a rectangular substrate.

Second Embodiment

For a second embodiment, in the coating method using the coating apparatus shown in FIG. 1, supply amount correction will be described with respect to a liquid line discharged, supplied, and formed on the substrate while linearly moving the nozzle.

The liquid film was prepared under the same conditions as that of the first embodiment, and further the solvent was dried/removed to form the solid film. The solvent in the liquid film was dried in the same manner as in the first embodiment.

Prior-art control of the movement and discharge speeds of the solution discharge nozzle was executed along a time axis under the control of PID. This control is fed back so that the movement and discharge speeds of the solution discharge nozzle indicate the set values. Moreover, when one line is drawn by the discharged solution, the control was fed back with respect to a front part of the solution discharge nozzle in a proceeding direction. However, a real uniform film cannot be obtained only with this control method. Preferably a control is executed to make a correction between adjacent lines.

Figure 10:
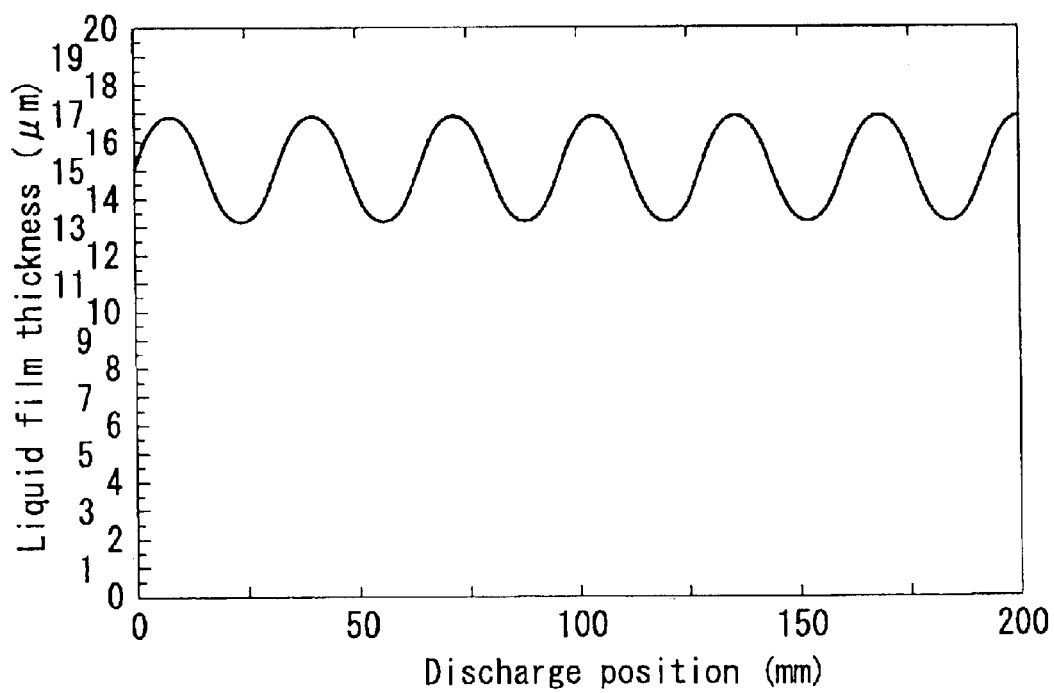
FIG. 10 is a diagram showing a liquid film thickness (supply amount) with respect to a discharge position, when a liquid film is formed by a PID control.

For example, in the related art, when the PID control is executed with respect to deviations of the discharge and movement speeds, as shown in FIG. 10, the film thickness of the liquid film formed on the substrate with respect to the discharge position of the solution changes. Note that the liquid film thickness in FIG. 10 is exchanged from a supply amount to the discharge position and obtained in consideration of the spread of the solution discharged onto the substrate.

Figure 12:
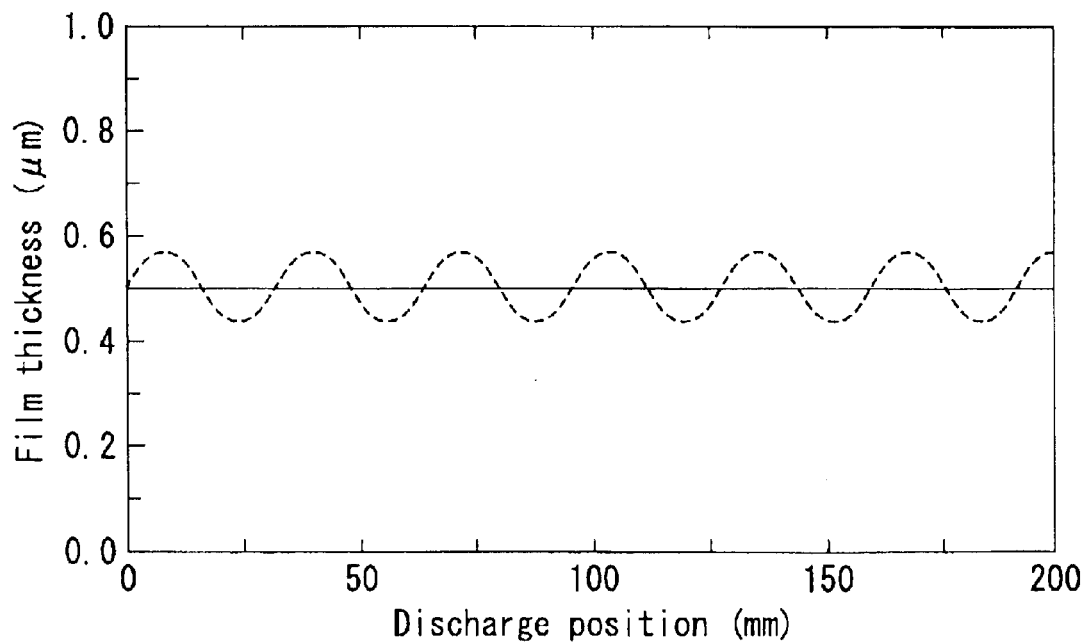
FIG. 12 is a diagram showing a film with respect to the discharge position of a solid film obtained by removing a solvent in the liquid film formed by the control method according to the related art and present embodiment.

When the supply amounts of the solution to the discharge positions are compared in the regions disposed adjacent to each other, the supply amount changes substantially in the same track. As a result, as shown by a broken line of FIG. 12, there is a problem that the film thickness variation is generated along the column direction of the solution discharge nozzle in the finally formed solid film.

Figure 11:
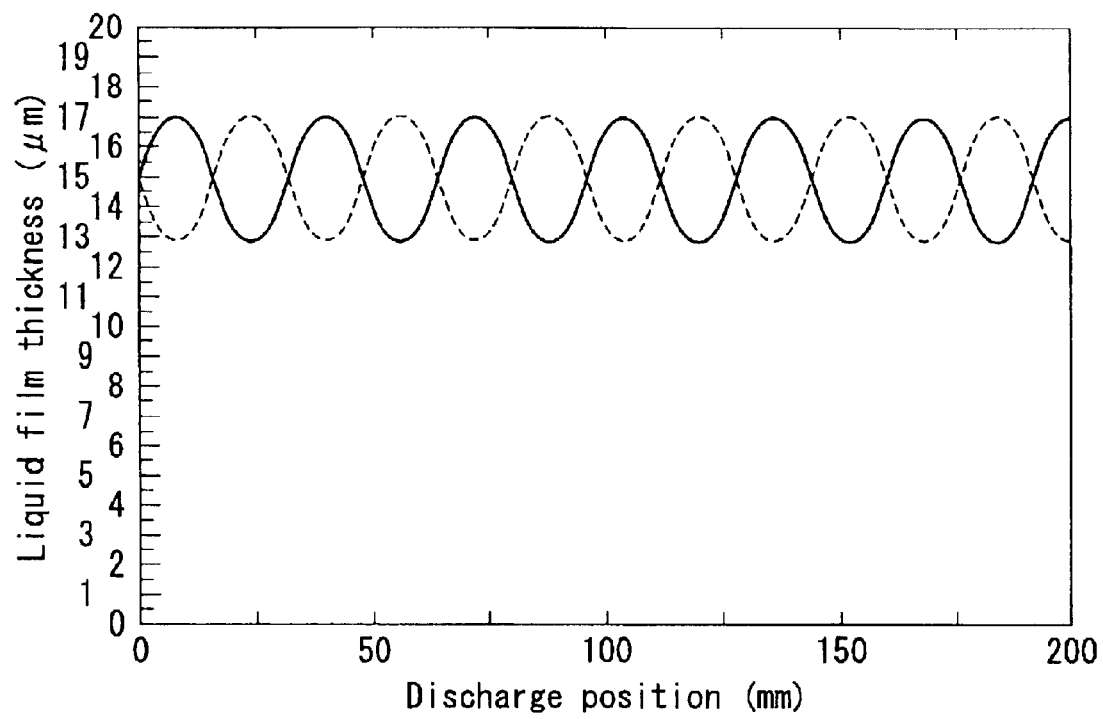
FIG. 11 is a diagram showing a liquid film thickness (supply amount) with respect to the discharge position, when the liquid film is formed by a control method according to a second embodiment.

To solve the problem, the method of the present embodiment comprises: storing a deviation amount of the supply amount; and obtaining the deviation of the supply amount with respect to the discharge position, when one line is drawn with the discharged solution in the column direction. The liquid film thickness (corresponding to the supply amount) with respect to the discharge position at this time is shown by a solid line in FIG. 11. Note that the liquid film thickness in FIG. 11 is exchanged from the supply amount to the discharge position and obtained in consideration of the spread of the solution discharged onto the solution. Also noted that the deviation amount of the supply amount is generated, for example, by deviation of the discharge speed from the solution discharge nozzle, and deviation of the movement speed of the solution discharge nozzle.

Moreover, a discharge amount in an arbitrary position in a region (second column) disposed adjacent to a track (first column) in which the deviation amount of the supply amount is obtained is controlled so as to compensate for the deviation amount of the supply amount obtained in the adjacent discharge position. The supply amount of the solution is controlled by controlling at least one of the discharge speed and the movement speed of the solution discharge nozzle. In the adjacent discharge region, a fluctuation of the liquid film thickness is shown by a broken line in FIG. 11.

As a result, since the directions of fluctuations of the liquid film thickness are reverse to each other in the adjacent lines, the fluctuations are offset and the uniform liquid film thickness can be obtained. As a result, the film thickness of the solid film obtained after removing the solvent in the liquid film is flat, irrespective of the discharge position, as shown by a solid line in FIG. 12.

Note that the deviation amount of the discharge speed can be measured, for example, by monitoring the change of discharge pressure. Moreover, the deviation amount of the movement speed of the solution discharge nozzle can be obtained as a differential value with respect to time, when position information of the nozzle is obtained with a laser interferometer.

Note that the present embodiment can of course be applied to a method comprising: rotating the substrate; moving the solution discharge nozzle in the diameter direction of the substrate; and discharging the solution in a spiral form onto the substrate to form the liquid film. In this case, the deviation of the discharge speed of the solution from the solution discharge nozzle, the deviation of the movement speed of the solution discharge nozzle, and the deviation of the rotation speed of the substrate are measured to obtain the deviation of the supply amount. Moreover, to supply the solution into a first position of the substrate from the solution discharge nozzle, the supply amount of the solution supplied to the first position is controlled so as to compensate for the deviation amount in the second position in which the solution has already been discharged and which is disposed adjacent to the first discharge position in the diameter direction of the substrate. The solution supply amount is controlled by controlling at least one of the discharge speed of the solution from the solution discharge nozzle, movement speed of the solution discharge nozzle, and rotation speed of the substrate.

Moreover, the substrate may also be dried using only a baker. Furthermore, the substrate may be rotated, and air blown one's it to dry it.

Furthermore, to supply the solution onto the substrate by the combination of the movement of the column direction of the nozzle with the movement of the row direction, the method described in the present embodiment can be applied not only to a circular substrate but also to a rectangular substrate.

Third Embodiment

Figure 13A:
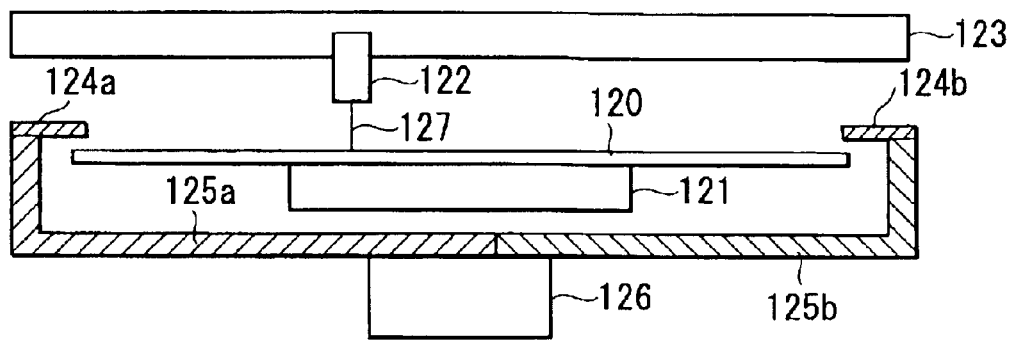
FIGS. 13A, 13B are diagrams showing a schematic constitution of a liquid film forming apparatus according to a third embodiment.
Figure 13B:
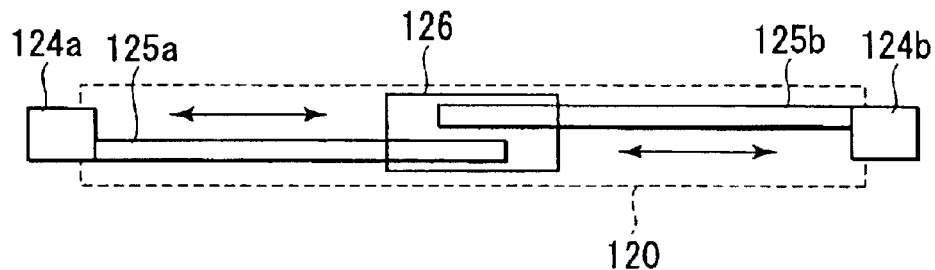

FIGS. 13A, 13B are diagrams showing a schematic constitution of a liquid film forming apparatus according to a third embodiment of the present invention. FIG. 13A is a side view of the apparatus, and FIG. 13B is a plan view of the apparatus.

As shown in FIGS. 13A, 13B, a substrate 120 is horizontally disposed on a substrate driving system 121. Above the substrate 120, a solution discharge nozzle 122, and a nozzle driving system 123 for reciprocating/moving the nozzle 122 are disposed above the substrate 120. The solution discharge nozzle 122 is controlled so as to discharge the solution and to reciprocate/move leftwards/rightwards along a sheet surface (this direction is regarded as the column direction) above the substrate 120, and shield plates 124a, 124b disposed in a space between the substrate 120 and solution discharge nozzle 122 by the nozzle driving system 123.

Figure 14:
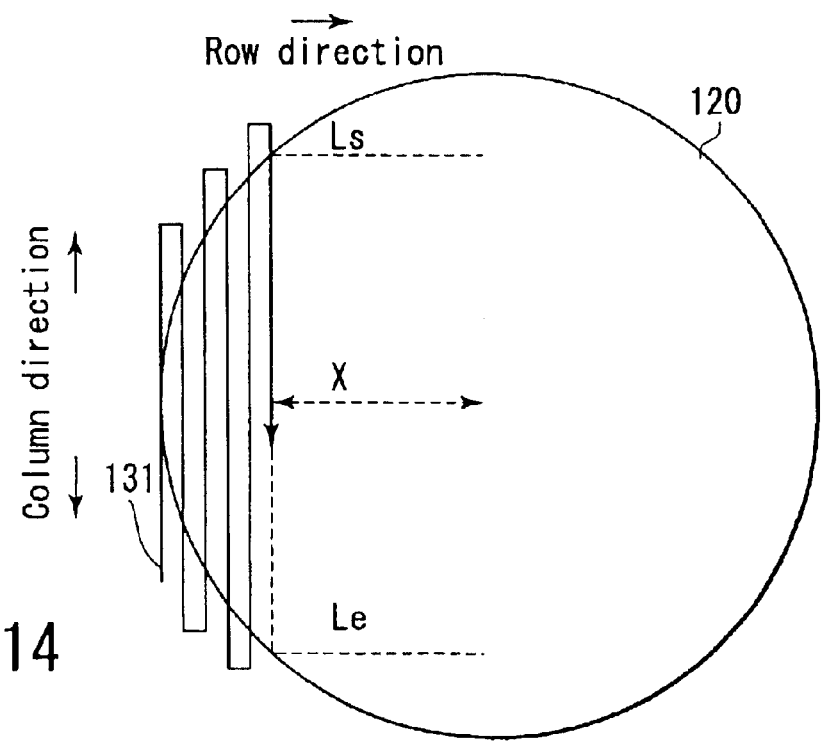
FIG. 14 is a diagram showing an installation relation of a shutter position with respect to a track of the solution discharge nozzle.

Every time the solution discharge nozzle 122 moves in one direction above the substrate 120, the substrate 120 is controlled so as to move a predetermined pitch in a predetermined row direction backwards or forwards by the substrate driving system 121. As shown in FIG. 14, when this operation is repeated, the track of the discharge position of the solution discharged onto the substrate 120 forms a line shown by a numeral number 131. The track 131 of the discharge position is linear, and the linearly supplied solution spreads on a basis of a reach position on the substrate by fluidity of the solution, and is connected to the adjacent liquid line to finally form one liquid film. For this, viscosity of the solution, and movement pitch of the row direction are determined beforehand.

The shield plates 124a, 124b disposed in the space between the substrate 120 and solution discharge nozzle 122 move along an outer edge of the substrate 120 by a cut-off mechanism driving system 126, and arms 125a, 125b, stop discharge of solution 127 from the solution discharge nozzle 122, thus prevent the solution from reaching the substrate 120.

In a related-art method for coating a circular substrate, the column direction positions of the shield plates 124, that is, a coating start side cut-off position $L_s$ and coating end side cut-off position $L_e$ are determined as follows, assuming that a substrate origin is O and using a radius r of the substrate, edge cut width (distance between a substrate edge and liquid film edge forming position) d, and distance X from the liquid line of the solution from the solution discharge nozzle:

$$|L_S|=|L_e|=((r-d)^2-x^2)^{0.5} \qquad (9)$$

FIGS. 15A, 15B schematically show the reach position of the solution actually cut off at this time on the substrate. The solution discharge nozzle 122 moves forwards in an arrow direction at v (m/sec). On the other hand, it is assumed that the discharge speed of the solution 127 from the nozzle 122 is q (m/sec). Further, it is assumed that the distance between the shield plate and substrate (height of cut off of the solution on the basis of the substrate) is z(m). To usually apply the diluted solution with this coating apparatus, the discharge speed is about q=5 to 15 m/sec, and distance is about z=0.001 to 0.005 m. Since a distance z between the discharge port of the solution discharge nozzle 122 and the substrate 120 is very small as compared with the discharge speed, the speed change in the discharge distance can be assumed to be substantially 0. Errors $\Delta L_1$ and $\Delta L_2$ of the solution reach position onto the substrate from a cut-off position under this condition can be represented as follows:

$$|\Delta L_1|=|\Delta L_2|=vz/q \qquad (10)$$

When the movement speed of the solution discharge nozzle is v=1 m/sec, the discharge speed is q=5 m/s, and z=0.003 m, the errors are as follows:

$$|\Delta L_1|=|\Delta L_2|=0.6 \text{ mm} \qquad (11)$$

Therefore, a generated difference of the edges of the solutions drawn adjacent to each other is about 1.2 mm with the rectangular substrate. To coat the circular substrate, a coat film profile in which the edges are further disordered is obtained as shown in FIG. 16.

On the other hand, in the present embodiment, when a liquid line proceeding direction is set to +, fine adjustment is made so as to shift cut-off positions on supply start and end sides from the position determined by the equation (9) by −vz/q. Thereby, the liquid film can be formed along a substrate contour shown in FIG. 17.

The solution supplied onto the substrate spreads by fluidity and forms a liquid film. At this stage, the edge of the liquid film can have an edge profile along the substrate.

The liquid film prepared with the edge profile along the substrate may be rotated centering on the substrate, so that the liquid film can be leveled. Moreover, when the substrate is rotated and dried in a drying step, the solvent can be evaporated from the liquid film in a outer peripheral portion with good balance, and the film thickness variation generated by evaporation can be minimized.

Figure 18A:
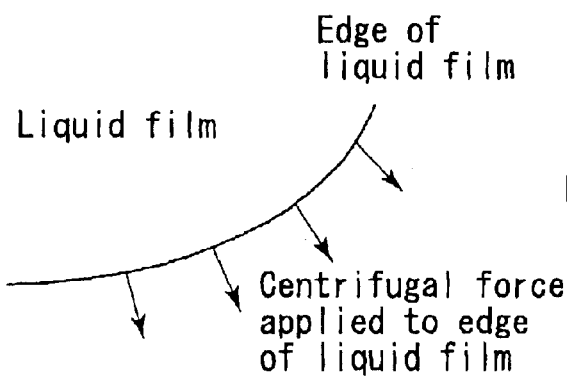
FIGS. 18A, 18B are explanatory views of a force applied to the liquid film edge at a substrate rotation time.
Figure 18B:
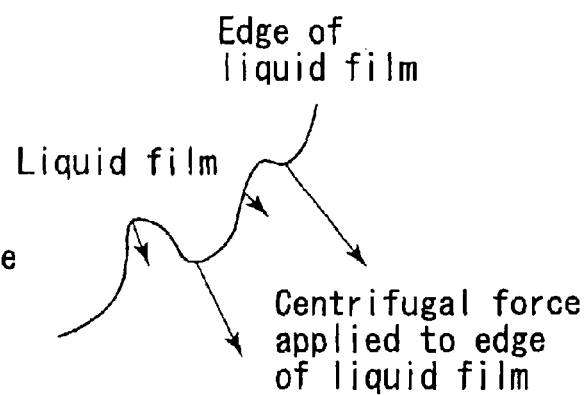

The above-described effect is an effect obtained by forming an edge portion along the substrate. When the substrate is rotated, a centrifugal force applied to the liquid film can equally be scattered in the liquid film edge as shown in FIG. 18A, and the effect can be obtained. With a zigzag edge as in the related art, as shown in FIG. 18B, the centrifugal force is concentrated in a projecting portion of the liquid film, and therefore there is a problem that the liquid flows toward the outside of the substrate from this portion.

Note that a method of removing the solvent from the liquid film may comprise: exposing the substrate on which the liquid film is formed to an atmosphere of ethyl lactate as that of the solvent included in the liquid film to level the liquid film; subsequently moving the substrate into the pressure reduction chamber; reducing the pressure; removing the solvent in the state held at the pressure in the vicinity of the saturated vapor pressure of ethyl lactate; further returning the pressure to normal pressure and thereafter conveying the substrate out of the pressure reduction chamber; and heating the substrate at 140° C. on a hot plate to remove the solvent form the film. Alternatively, the solvent may also be removed by directly heating the substrate, without exposing it to reduced pressure.

In the present embodiment, the correction with respect to the circular substrate has been described, but when a similar correction is made in the coating of a mask for exposure of a rectangular substrate, such as a liquid crystal substrate, it is possible to form a liquid film having an edge along the substrate edge. Also for a rectangular substrate, when the proceeding direction of the solution discharge nozzle is set to +, the cut-off positions on the supply start and end sides may be matched with positions obtained by shifting the cut-off position by the shield plate from the liquid film edge forming position formed in the edge of the rectangular substrate at a constant interval by −vz/q.

Moreover, in addition to the shield plates shown in FIGS. 13A, 13B, the following cut-off mechanisms for preventing the solution from reaching the substrate are considered:

(i) a mechanism for spraying gas to change the track of the liquid, and collecting the solution in a recovery portion disposed in an opposite position; and (ii) a mechanism for sucking the discharged solution to change the track, and collecting the liquid into a liquid recovery portion.

Figure 19A:
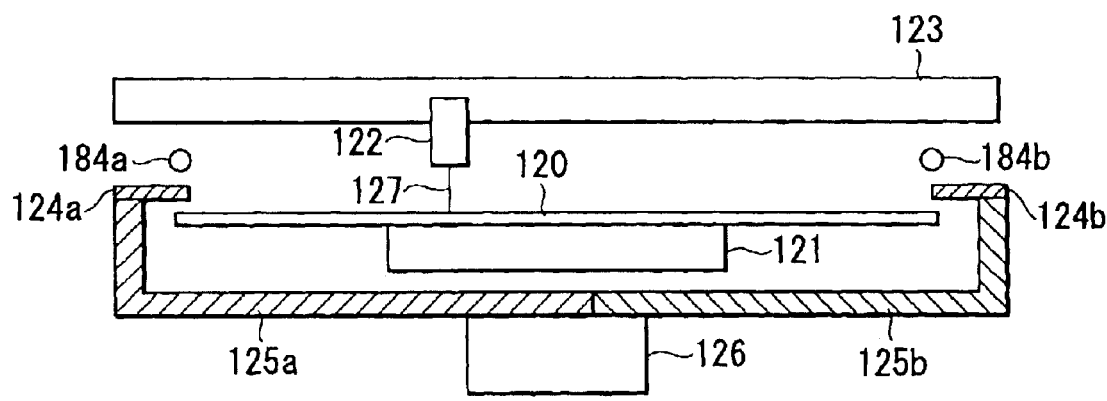
FIGS. 19A, 19B are diagrams showing the schematic constitution of the liquid film forming apparatus according to the third embodiment.
Figure 19B:
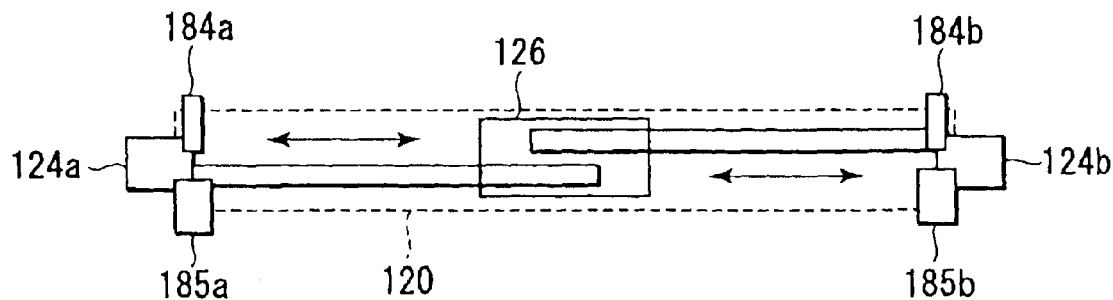

One example of a liquid film forming apparatus including a mechanism different from a gas cut-off mechanism shown in FIGS. 13A, 13B is shown in FIGS. 19A, 19B. As shown in FIGS. 19A, 19B, the present apparatus includes gas emission portions 184a, 184b for emitting gas to the discharged solution, and solution suction portions 185a, 185b for recovering the solution by suction, and a system including both the cut-off mechanisms (i) and (ii) is used. Note that the shield plates 124a, 124b are disposed to prevent the solution which cannot be cut off by the gas emission portions 185a, 185b and solution suction portions 185a, 185b from discharging onto the substrate.

For the driving method, the same control as that of the apparatus shown in FIGS. 13A, 13B is executed, but the distance z is treated as a distance between the gas emission portions 185a, 185b for spraying the gas to cut off the solution and the substrate 120.

Moreover, to supply the solution onto the substrate by the combination of the movement of the column direction of the nozzle with the movement in the row direction, the method described in the present embodiment can be applied not only to a circular substrate but also to a rectangular substrate.

Fourth Embodiment

FIGS. 20A, 20B, 21A, 21B are explanatory views of problems according to a fourth embodiment of the present invention, and are explanatory views of problems generated when the solution discharge nozzle turns back along the contour of the circular substrate to form the coat film as shown in FIG. 1.

The solution linearly discharged onto the substrate from the solution discharge nozzle is regarded as the liquid line. Moreover, when the adjacent liquid lines stick to each other to form the liquid film, a portion formed by one liquid line is regarded as a unit liquid film.

Figure 20A:
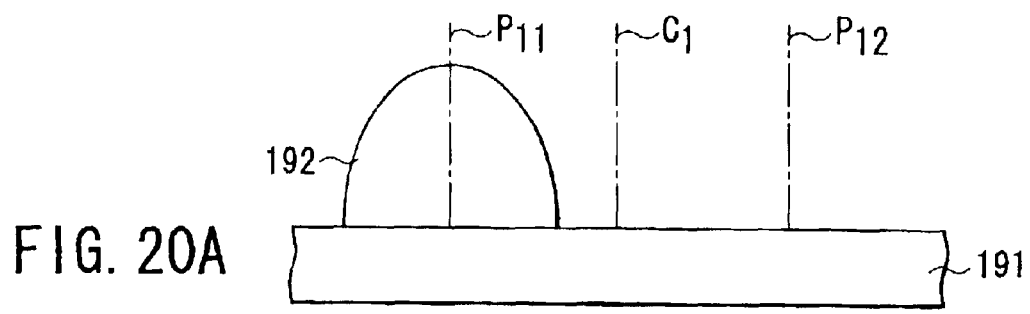
FIGS. 20A, 20B are diagrams schematically showing a spread state of a liquid line applied in a first column at a coating time of a second column, and boundary of a unit liquid film in the finally obtained liquid film in a coating start/end portion at a time of preparation of the liquid film using the coating apparatus of FIG. 1 according to a fourth embodiment.
Figure 20B:
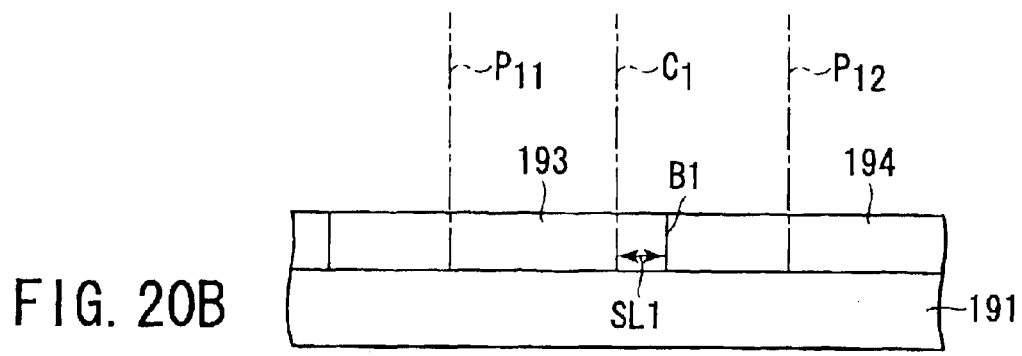
Figure 21A:
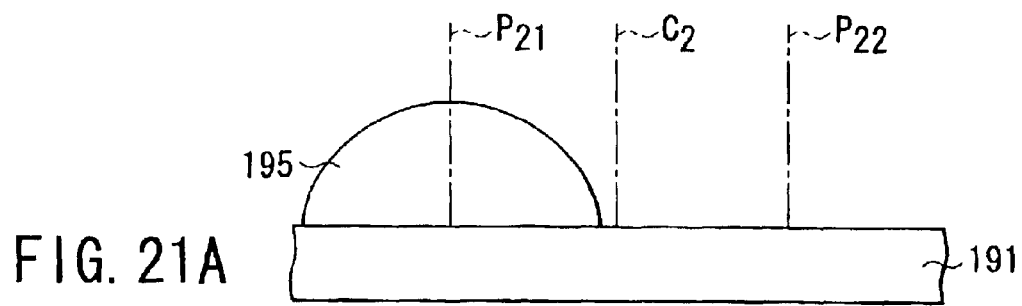
FIGS. 21A, 21B are diagrams schematically showing the spread state of the liquid line applied in the first column at the coating time of the second column, and boundary of the unit coat film in the finally obtained liquid film in the vicinity of a substrate center at the preparation time of the liquid film using the coating apparatus of FIG. 1 according to the fourth embodiment.
Figure 21B:
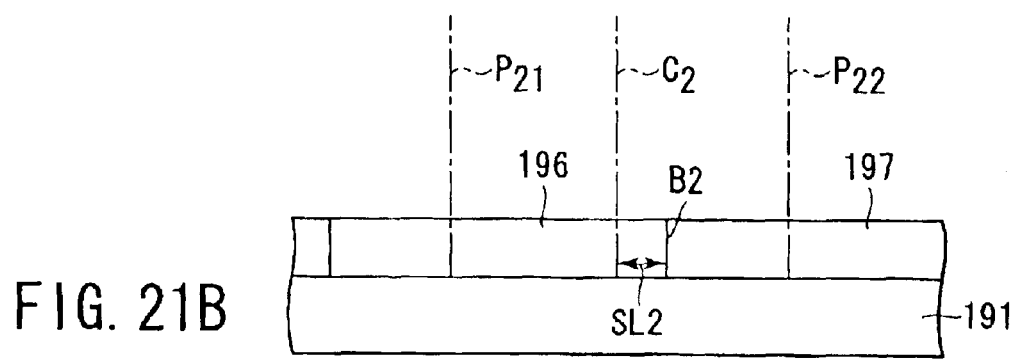

FIGS. 20A, 20B schematically show a spread state of the liquid line applied in a first column at a coating time of a second column, and boundary of the unit liquid film in the finally obtained liquid film in a coating start/end portion at a time of preparation of the liquid film using the coating apparatus of FIG. 1. FIGS. 21A, 21B schematically show the spread state of the liquid line applied in the first column at the coating time of the second column, and boundary of the unit coat film in the finally obtained liquid film in the vicinity of a substrate center.

In the coating start and end portions, the nozzle movement distance in the column direction is short. A time from when the coating of the first column ends and the solution supply to the substrate is temporarily discontinued until the coating of the second column starts and the solution supply to the substrate is restarted (column direction coating time interval) is short as compared with the coating of the substrate center portion having substantially the same diameter as that of the substrate. This time difference gives a difference to the spread of the solution line of the first column in applying the solution line of the second column.

As shown in FIG. 20A, in the vicinity of the coating start and end, the spread of a liquid line 192 of the first column at the coating time of the second column is insufficient. Therefore, as shown in FIG. 20B, a boundary $B_1$ of unit liquid films 193, 194 is determined on a discharge position $P_{12}$ side of the second column slightly from a center line $C_1$ of a discharge position $P_{11}$ of the first column and discharge position $P_{12}$ of the second column. In FIG. 20B, an interval between the center line $C_1$ and position $P_{12}$ is set to SL1.

However, in the vicinity of the center, as shown in FIG. 21A, since the column direction coating time interval is large, a liquid line 195 of the first column considerably spreads at the coating time of the second column. Therefore, as shown in FIG. 21B, a boundary $B_2$ of unit liquid films 196, 197 is determined further on the discharge position $P_{12}$ side of the second column as compared with the vicinity of the coating start and end. In FIG. 21B, an interval between the center line $C_2$ and position $P_{22}$ is set to SL2 (SL2>SL1).

Figure 22:
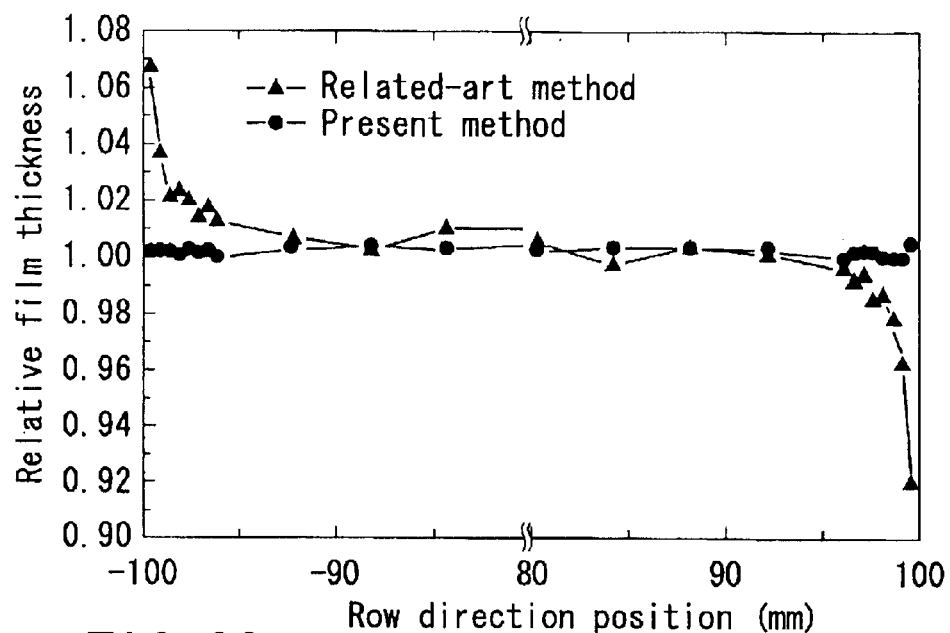
FIG. 22 is a diagram showing a relative thickness of a row direction of the film formed according to the related art and fourth embodiment.

Such difference of the boundary position of the unit liquid film is a cause of deterioration of film thickness uniformity. Since the boundary of the unit liquid film shifts toward a start point side from the center in the coating start and end portions, a finally obtained amount of solid content value apparently moves on the start point side. Therefore, a problem occurs that the solid film is thick on the coating start side and thin on the end side. In FIG. 22, plotted triangular marks indicate a relative film thickness with respect to the film thickness of the substrate center observed in related-art coating.

When the solution supply amount proportional to an inverse number of the relative film thickness is given to the corresponding column based on the relative film thickness plotted by the triangular marks of FIG. 22, the film thickness uniformity in the row direction can be enhanced. The solution supply amount is adjusted by setting the discharge speed from the solution discharge nozzle to a value obtained by multiplying the related-art discharge speed by the inverse number of the relative film thickness obtained in the related-art coating method as a coefficient. Results of the relative film thickness obtained by the method of the present embodiment are shown by circular marks of FIG. 22. A uniform film thickness can be obtained in the whole row direction of the substrate.

The present embodiment is characterized in that the solution supply amount to the substrate in the coating start vicinity is set to be smaller than in the center portion, and that the solution supply amount to the substrate in the coating end vicinity is set to be larger than in the center portion. Therefore, the effects of the present embodiment can also be achieved by the following control.

(1) The discharge speed from the solution discharge nozzle is changed in proportion to the inverse number of the relative film thickness. Note that the same value as that in the related art is set for other conditions such as the column-direction movement speed and row-direction movement pitch of the solution discharge nozzle.

As shown in FIG. 22, the solid film is thick on the liquid film forming start side, and thin on the liquid film forming end side. Therefore, the discharge speed in moving the nozzle in the column direction is set to be smaller than the discharge speed of the middle position of the substrate in the vicinity of the liquid film forming start position, and set to be larger than the discharge speed of the middle position of the substrate in the vicinity of the liquid film forming end position.

(2) The row-direction movement pitch of the solution discharge nozzle is changed in proportion to the row-direction relative film thickness. Note that the same value as that in the related art is set the for other conditions such as the column-direction movement speed and discharge speed of the solution discharge nozzle.

As shown in FIG. 22, the solid film is thick on the liquid film forming start side, and is thin on the liquid film forming end side. Therefore, the row-direction movement distance in moving the nozzle in the row direction is set to be larger than the row-direction movement distance of the middle position of the substrate in the vicinity of the liquid film forming start position, and set to be smaller than the row-direction movement distance of the middle position of the substrate in the vicinity of the liquid film forming end position.

(3) The movement of the solution discharge nozzle in a state in which the solution is not supplied to the substrate is controlled to adjust time. Preferably, an adjustment speed is adjusted, when the solution discharge nozzle moves in the row direction. Alternatively, the adjustment speed at the column-direction movement time of the nozzle is adjusted. Moreover, the adjustment speed in the row and column-directions movement time may also be controlled. To decrease the time interval, the adjustment speed may be increased. To lengthen the time interval, the adjustment speed may be decreased. Note that the adjustment of the adjustment speed also comprises: temporarily stopping the movement of the nozzle.

In the present embodiment, the coating condition is set on the basis of the film thickness distribution of the film coated in the related-art method, but this is not limited. The setting method comprises: discharging the solution through the nozzle; supplying one coating line onto the substrate; observing the spread of the line in the row direction by a CCD camera or video; and obtaining a speed of spread of the liquid line. On the other hand, a column-direction coating time interval generated in drawing the line with the coating apparatus is measured or obtained from specifications by desk calculation work. The above-described spread amount and column-direction coating time interval are obtained. In this case, the condition is easily determined by the method (3). Moreover, with the adjustment in the method (1), the discharge speed in coating each column may be obtained. With the adjustment in the method (2), the movement pitch of the row direction may be determined.

The present invention is not limited to the above-described embodiments, and can variously be modified within a range of the scope in an implementation stage. For example, the liquid film forming method described above in the respective embodiments can be applied to a semiconductor process including the coating of a reflection preventive agent, or resist agent for use in a lithography process, and the coating of low or high dielectric material, and to any other film forming process including an ornamental process such as plating.

Fifth Embodiment

In a fifth embodiment, a semiconductor substrate having a diameter (f)=200 mm was used, and a photoresist solution for chemical amplification was used as one concrete example in the solution. Here, it is assumed that the photoresist solution for chemical amplification includes a solid content of 3.0%. This solid content indicates a ratio of the solid content included in the solution of the photoresist. The solid content remains as a solid film after a drying and baking treatment. Moreover, it is assumed that a film to be processed (e.g., insulating film) is formed on a semiconductor substrate beforehand by a known method.

First, the substrate is introduced into a scan coating treatment unit, and laid and fixed on a stage. Thereafter, while a solution A is discharged through a nozzle for solution supply, the nozzle is reciprocated/moved along a column-direction at a speed of 1 m/sec by a nozzle driving unit. Moreover, the stage is simultaneously moved in an row-direction at a pitch interval of 0.6 mm by a stage driving unit. Here, the whole surface (=plane) of the substrate is coated with the solution A, and the liquid film is formed with a film thickness of about 10 $\mu$m. At this time, the concave/convex portion was formed in the liquid film on the substrate at a flatness of about 10 $\mu$m±10%. Note that the same degree of concave/convex portion is observed in the liquid on the substrate even with the use of meniscus coating using the capillary phenomenon.

Subsequently, a leveling treatment is performed to flat the liquid film on the substrate. Usually after the liquid film is formed on the substrate, the surface of the liquid film is not completely smooth as described above, and the concave/convex portion exists because of the fluctuation of the discharge amount in discharging the solution. To solve the problem, if necessary, first the leveling treatment is performed to flat the surface of the liquid film. Thereafter, the drying treatment is carried out to vaporize the solvent of the photoresist solution constituting the liquid film, and a photoresist coat film including the solid content is formed.

Figure 23:
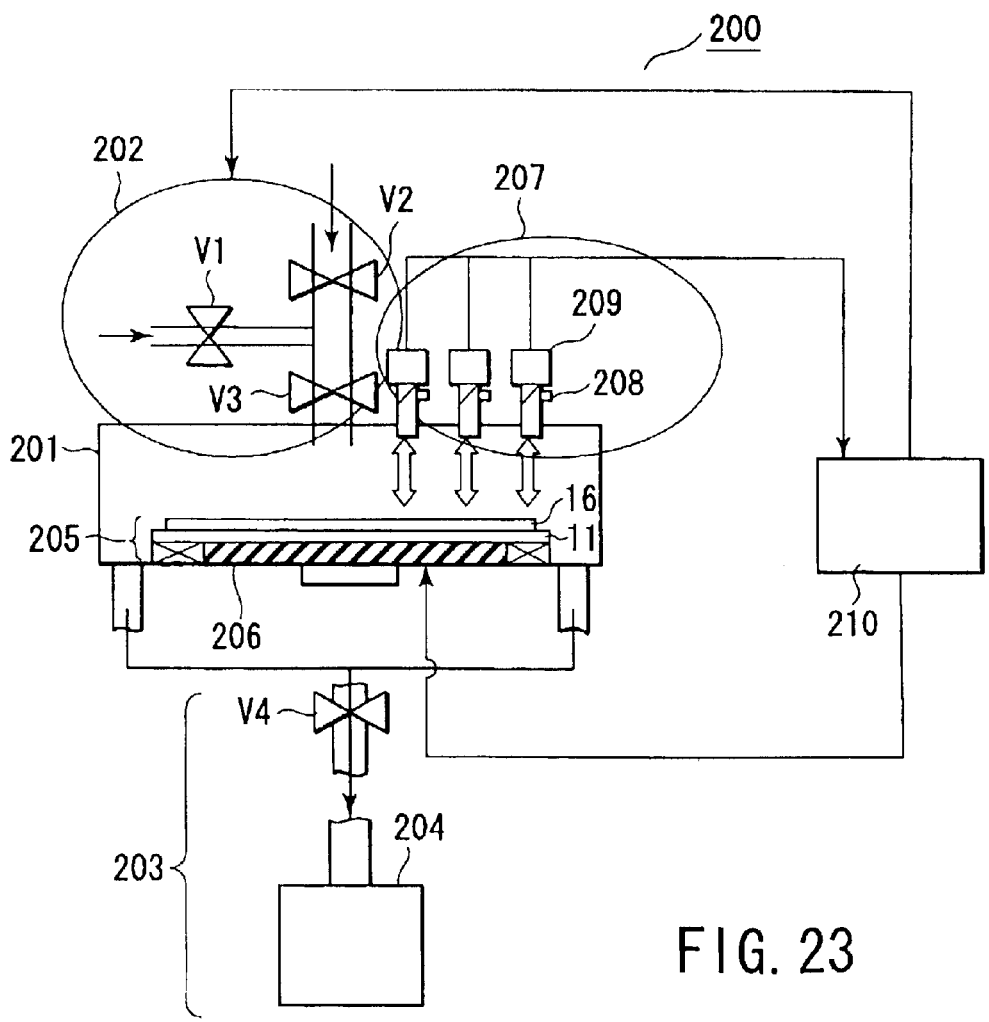
FIG. 23 is a schematic diagram showing an apparatus for treating the liquid film on the substrate according to a fifth embodiment.

In the present embodiment, in one example, a leveling/drying treatment apparatus 200 shown in FIG. 23 is used to subject the liquid film 16 to the leveling and drying treatment, and a series of treatments is performed so as to form a photoresist film which has a uniform thickness and whose surface is flatted over the whole surface of the substrate 11.

The leveling/drying treatment apparatus 200 is constituted by integrally including a function required for the leveling and drying treatment, so that the treatment is carried out in the same chamber. The constitution and function of the leveling/drying treatment apparatus 200 will be described hereinafter with reference to FIG. 23.

The leveling/drying treatment apparatus 200 includes a chamber 201 in which the substrate 11 (e.g., semiconductor substrate having a diameter (f)=200 nm) is contained, an gas control unit 202, and an exhaust unit 203 which exhausts the atmosphere in the chamber 201. The gas control unit 202 mixes inactive gas for dilution (e.g., $N_2$ gas) and solvent gas at a predetermined ratio, and supplies gas including the solvent at a desired concentration into the chamber 201. This solvent is the same as that included in the resist solution.

Here, a stage 205 on which the substrate 11 is laid and fixed is disposed in the chamber 201. A temperature control plate 206 for adjusting temperature distribution of the substrate 11 is disposed in a position under the stage 205.

Figure 24:
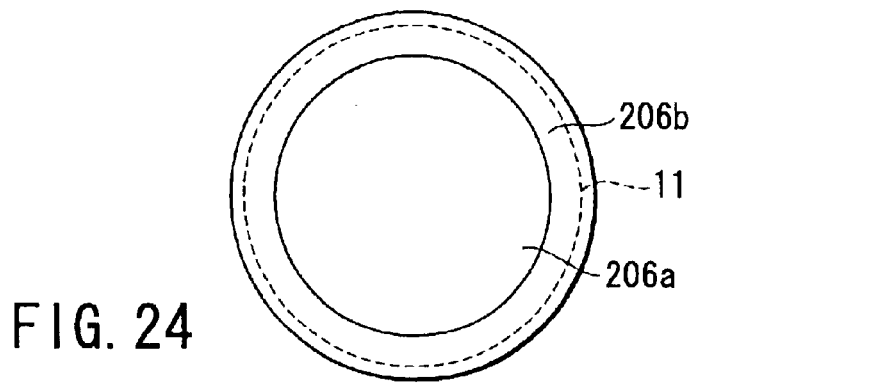
FIG. 24 is a plan view showing a schematic constitution of a temperature control plate according to the fifth embodiment.

The temperature control plate 206 can independently control the temperature of a plurality of regions of the substrate 11. FIG. 24 shows a constitution of the temperature control plate according to the present embodiment. As shown in FIG. 24, the temperature control plate 206 includes a middle plate 206a and peripheral edge plate 206b. The middle plate 206a and peripheral edge plate 206b independently control the temperature of the regions of the peripheral edge portion and middle portion of the substrate 11.

Moreover, the gas control unit 202 includes valves for gas supply $V_1$ to $V_3$. The flow rate of inactive gas for dilution (e.g., $N_2$ gas) is controlled by adjustment of opening of the valve $V_1$. Moreover, the flow rate is controlled by the adjustment of the flow rate of solvent gas and opening of the valve $V_2$. When the openings of the valves $V_1$ and $V_2$ are adjusted, two gases are mixed at a predetermined density. The opening of the valve $V_3$ is adjusted to control the supply amount of mixed gas into the chamber 201.

The exhaust unit 203 has a vacuum pump and valve $V_4$. The valve $V_4$ is inserted into a pipe which connects the chamber 201 to the vacuum pump. When the opening of the valve $V_4$ is adjusted, air current amount and pressure of the atmosphere in the chamber 201 are adjusted. Furthermore, the leveling/drying treatment apparatus 200 includes an optical system for film thickness measurement 207 to measure the film thickness of the liquid film 16 in each treatment step. The optical system for film thickness measurement 207 mainly includes a light irradiation portion 208 and light receiving portion 209. The light irradiation portion 208 is constituted of a light source which emits a light having a wavelength in a visible region. The light receiving portion 209 is constituted of a CCD camera. Moreover, a plurality of sets of light sources 208 and light receiving portions 209 are disposed so as to measure the film thickness of the liquid film 16 in a plurality of positions on the substrate 11.

Additionally, the leveling/drying treatment apparatus 200 includes an analysis unit 210. The analysis unit 210 is connected to the gas control unit 202, temperature control plate 206, and optical system for film thickness measurement 207.

The light source 208 irradiates the liquid film 16 with visible light. The light receiving portion 209 receives the reflected light and measures light intensity. The analysis unit 210 calculates the film thickness of the liquid film 16 from the intensity of the reflected light. Moreover, the analysis unit 210 controls the concentration of the solvent in the gas supplied into the chamber 201, pressure in the chamber 201, temperature of the substrate 11, and exhaust in the chamber 201 in accordance with the calculated film thickness of the liquid film 16.

The leveling/drying treatment apparatus 200 constituted as described above is used to first perform the leveling treatment so that the film thickness of the liquid film 16 is uniform and the surface of the film is flatted in the whole surface of the substrate 11.

Conditions such as the temperature of the substrate at a leveling treatment time, flow rate of the air current in the treatment apparatus, exhaust, concentration of the solvent in the gas, and pressure are changed, and the substrate for test is used to perform the leveling treatment. During the leveling treatment, a film thickness difference of the center and peripheral edge regions of the substrate are observed. A condition on which the difference of the film thickness measured in each region is small is set to an initial condition of the leveling treatment. The film thickness difference is observed by irradiating each region with light and counting the number of interference fringes of the reflected light. When the number of interference fringes is small, the film thickness difference is small.

The procedure of the leveling treatment will concretely be described with reference to FIGS. 25, and 26A to 26C. FIG. 26A is a diagram showing a change of the film thickness of the liquid film in each position on the substrate with time in the leveling treatment according to the fifth embodiment, FIG. 26B is a diagram showing a change of solvent concentration in gas supplied into the chamber with time in the leveling treatment according to the fifth embodiment, and FIG. 26C is a diagram showing a change of temperature of middle and peripheral edge plates in the leveling treatment according to the fifth embodiment.

First, the substrate 11 is conveyed into the chamber 201 of the leveling/drying treatment apparatus 200, and laid and fixed onto the stage 205. At this time, temperature $T_c$ of the middle plate 206a disposed in the stage 205, and temperature $T_r$ of the peripheral edge plate 206b are set around room temperature (e.g., 23° C.)

Thereafter, the leveling treatment is started to flat the surface of the liquid film 16. The openings of the valves for gas supply $V_1$ to $V_3$ of the gas control unit 202 are adjusted, and a mixture gas is generated by mixing the solvent gas and gas for dilution in a predetermined concentration. The mixture gas is supplied into the chamber 201, and the atmosphere including the solvent is formed in the chamber 201. In the present embodiment, the concentration of the solvent in the mixture gas at the start time of the leveling treatment is 100%.

The same solvent as that constituting the liquid film 16, or a similar solvent is used in the solvent gas. When the liquid film 16 is exposed to the atmosphere including the solvent, the fluidity inside the liquid film 16 is promoted, and the surface tension can be used to smooth the surface.

In the present embodiment, in the process of the leveling treatment, the film thickness of the liquid film 16 is measured, a necessary parameter is selected from parameters relating to the treatment in accordance with measurement result, and the value of the parameter is controlled. At this time, the value of the selected parameter is controlled. By this control, during the leveling treatment, the film thickness difference of the liquid film 16 is controlled over the whole surface of the substrate 11. Here, in one example, as the parameter, the concentration of the solvent in the chamber 201, and temperature distribution of the substrate 11 are selected, and the values of these parameters are controlled.

In this case, in the present embodiment, during the leveling treatment, the optical system for film thickness measurement 207 and analysis unit 210 are used to measure the film thickness of the liquid film 16 in a plurality of positions in the peripheral edge from the middle portion of the substrate 11. At this time, the film thickness of the liquid film 16 is measured in a plurality of points $P_1$, $P_2$, $P_3$ on the substrate shown in FIG. 25.

Figure 25:
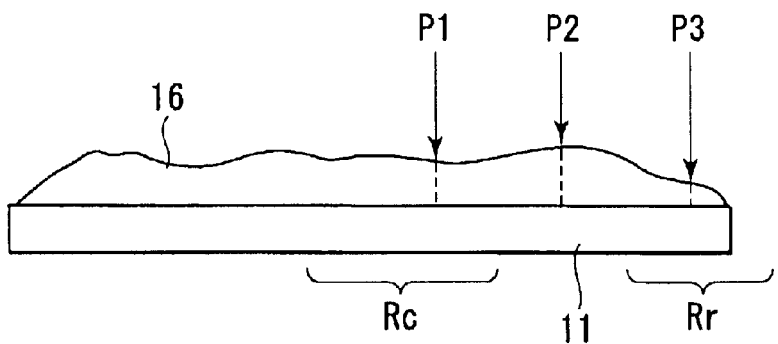
FIG. 25 is a diagram relating to a treatment method of the liquid film on the substrate in the fifth embodiment.
Figure 26A:
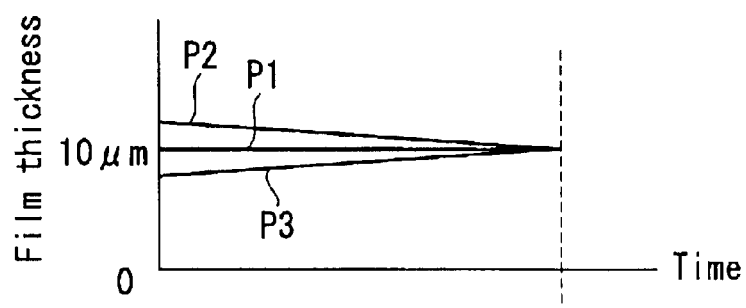
FIG. 26A is a diagram showing a change of the film thickness of the liquid film in each position on the substrate with time in a leveling treatment according to the fifth embodiment.
Figure 26B:
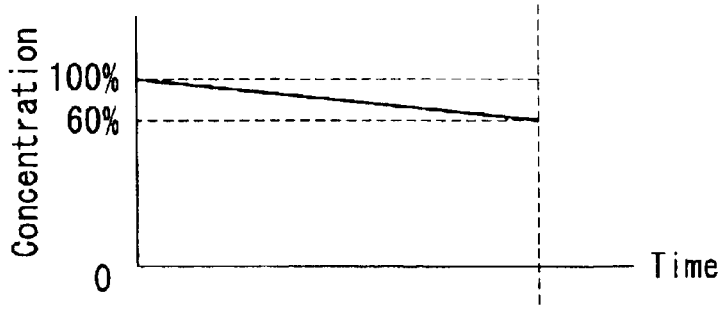
FIG. 26B is a diagram showing a change of solvent concentration in gas supplied into a chamber with time in the leveling treatment according to the fifth embodiment.
Figure 26C:
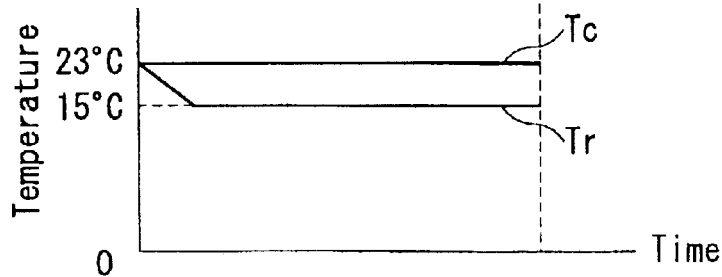
FIG. 26C is a diagram showing a change of temperature of middle and peripheral edge plates in the leveling treatment according to the fifth embodiment.

FIG. 25 shows a sectional view of the substrate 11 and liquid film 16. Here, the point $P_1$ is an arbitrary position on a middle portion $R_c$ of the substrate 11, point $P_3$ is an arbitrary position on a peripheral edge $R_r$ of the substrate 11, and $P_2$ is an arbitrary position between $P_1$ and $P_3$ in the substrate 11.

Note that in the present embodiment, the peripheral edge $R_r$ indicates a region in a width corresponding to about 5% of a substrate diameter from the edge (=endmost portion) of the substrate. Therefore, when the diameter (f) of the substrate is 200 mm, the peripheral edge indicates the region in a width of 10 mm from the edge (=endmost portion).

In the process of the leveling treatment, in the leveling/drying treatment apparatus 200, the optical system for film thickness measurement 207 is used to measure the film thickness of the liquid film 16 in the respective points $P_1$, $P_2$, $P_3$. Moreover, in order to inhibit the film thickness in each point from increasing/decreasing, the analysis unit 210 sends an instruction to the gas control unit 202 and temperature control plate 206, and the concentration of the solvent in the chamber 201 and temperature distribution of the substrate 11 are controlled.

The leveling treatment will concretely be described hereinafter with reference to FIGS. 26A to 26C.

As shown in FIG. 26A, immediately after the leveling treatment is started, the film thickness of the liquid film 16 in the respective points $P_1$, $P_2$, $P_3$ on the substrate 11 largely deviate. Thereafter, on the basis of the preset film thickness (e.g., 10 μm), in the respective points $P_1$, $P_2$, $P_3$ on the substrate 11, the concentration of the solvent in the chamber 201 and temperature distribution of the substrate 11 are controlled so that the film thickness of the liquid film 16 is within a given range.

Concretely, as shown in FIG. 26B, the concentration of the solvent in the mixture gas supplied into the chamber 201 is 100% immediately after the start of the leveling treatment. Thereafter, the concentration of the solvent in the mixture gas is gradually reduced to 60%. Here, the surface of the liquid film 16 is flatted, and the concentration of the solvent in the chamber 201 is gradually decreased so that the film thickness difference of the liquid film 16 is within a substantially constant range in the respective points $P_1$, $P_2$, $P_3$ on the substrate 11.

Moreover, while the concentration of the solvent in the atmosphere is controlled, the temperature of the temperature control plate 206 is simultaneously controlled independently in the middle and peripheral edge portions of the substrate 11. Concretely, when the substrate 11 is laid on the stage 205, the whole temperature control plate 206 is set to a substantially constant temperature. Thereafter, in the process of the leveling treatment, the temperature is controlled independently in the positions of the middle portion corresponding to the point $P_1$ and the peripheral edge corresponding to the point $P_3$.

Here, in one example, first the temperature $T_c$ of the middle plate 206a and temperature $T_r$ of the peripheral edge plate 206b are set at temperature of about 23° C., before the substrate 11 is laid on the stage 205. Thereafter, as shown in FIG. 26C, the temperature $T_c$ of the middle plate 206a is kept at 23° C. The temperature $T_r$ of the peripheral edge plate 206b is lowered to about 15° C. During the leveling treatment, the temperature $T_c$ of the middle plate 206a is controlled to be kept at 15° C. During the leveling treatment, the temperature of the peripheral edge $R_r$ of the substrate 11 is set to be lower than that of the middle portion $R_c$. By this temperature distribution, the solid content is inhibited from flowing in a direction of the middle portion $R_c$ from the peripheral edge $R_r$, and the film thickness distribution is within a constant range.

Thereafter, when the film thickness of the liquid film 16 in the respective points $P_1$, $P_2$, $P_3$ is within the given range on the basis of the preset film thickness, the leveling treatment ends. The leveling treatment ends, when all the valves $V_1$ to $V_3$ of the gas supply system are closed and the supply of the gas into the chamber 201 is stopped.

Note that in one example the film thickness of the liquid film 16 in the respective points $P_1$, $P_2$, $P_3$ is within a range of about ±0.5% on the basis of 10 μm and at this time the leveling treatment of the present embodiment ends.

Subsequently, the drying treatment is performed so as to vaporize the solvent of the liquid film 16 in the state in which the substrate 11 is laid on the stage 205 in the chamber 201. This drying treatment comprises: vaporizing the solvent in the liquid film 16; and leaving the solid content in the liquid film 16 on the substrate 11 to form the solid film on the substrate. As one example, the present embodiment comprises: vaporizing the photoresist solution by a pressure reduction treatment; and forming the photoresist film having a film thickness of about 400 nm as the solid film. Here, after the supply of the mixture gas into the chamber 201 is stopped, first a vacuum pump 204 is used to exhaust the atmosphere in the chamber 201 at a predetermined rate.

For the respective conditions such as the temperature of the substrate at the drying treatment time, air current, concentration of the solvent in the gas supplied into the chamber, and pressure, while a substrate for test is used to change the respective conditions beforehand, the film thickness is measured by reflected light measurement in a plurality of points including at least the center of the substrate, coating start position, and coating end position. Even in the process of the decrease of the film thickness of the liquid film, a condition at a time of reduction of the interference fringes of the reflected light may be determined from these results.

In the present embodiment, in the process of the drying treatment, the film thickness of the liquid film 16 is measured and monitored. Additionally, the necessary parameter is selected from the parameters relating to the treatment, and the value of the parameter is controlled. At this time, while the value of the selected parameter is controlled, and the drying treatment is performed, the film thickness difference of the liquid film 16 is controlled to be within the predetermined range over the whole surface of the substrate 11, the solvent is vaporized, and finally the solid film having a thickness of 400 nm is formed. Here, in one example, the temperature distribution of the substrate 11 is selected as the parameter, and the value is controlled.

In this case, in the present embodiment, during the drying treatment, the optical system for film thickness measurement 207 and analysis unit 210 are used to measure the film thickness of the liquid film in the respective points $P_1$ to $P_3$ in the same manner as in the leveling treatment. At this time, the analysis unit 210 controls each parameter so that the difference of the film thickness in these points $P_1$ to $P_3$ is within the predetermined range. In the present embodiment, in one example, the value of the parameter is controlled so that the film thickness of the points $P_1$ to $P_3$ is within a range of an average film thickness value ±0.5%.

Figure 27A:
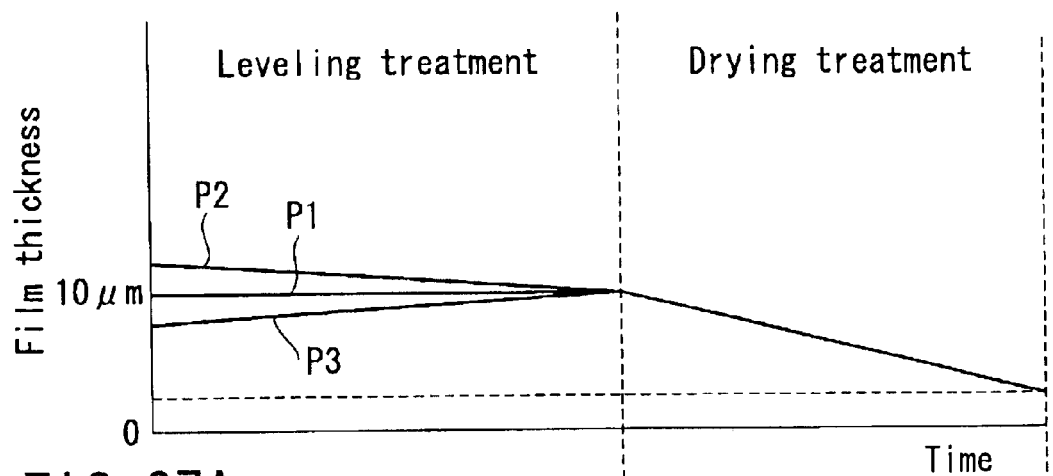
FIG. 27A is a diagram showing the change of the film thickness of the liquid film in each position on the substrate with time in the leveling and drying treatments according to the fifth embodiment.
Figure 27B:
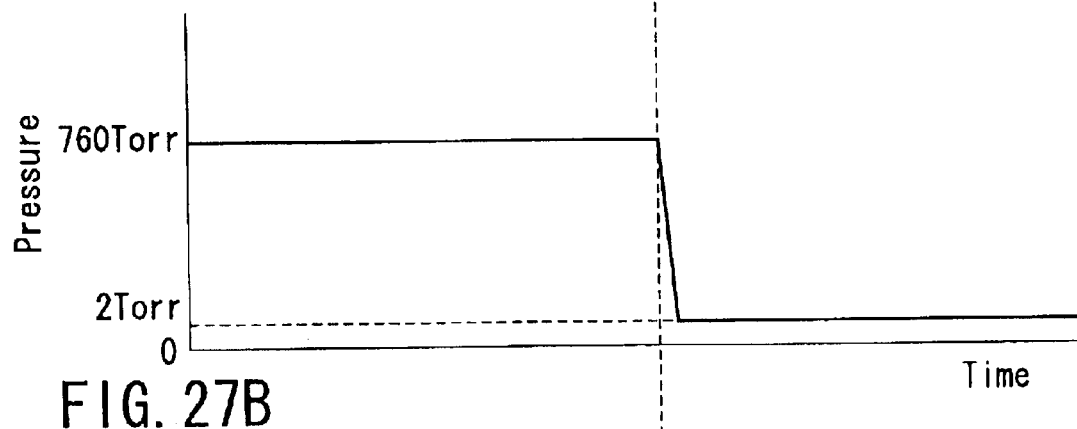
FIG. 27B is a diagram showing the change of pressure in the chamber with time in the leveling and drying treatments according to the fifth embodiment.
Figure 27C:
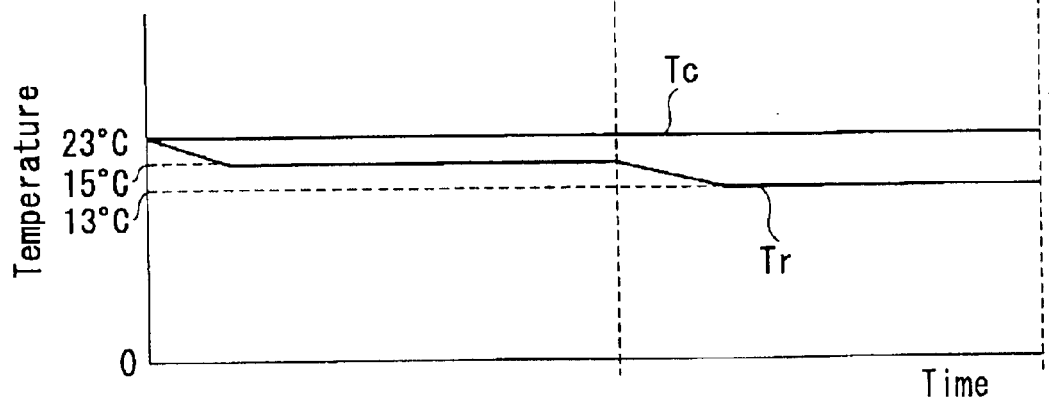
FIG. 27C is a diagram showing the change of temperature of middle and peripheral edge plates in the leveling and drying treatments according to the fifth embodiment.

Here, the drying treatment will concretely be described with reference to FIGS. 27A to 27C. FIG. 27A is a diagram showing the change of the film thickness of the liquid film in each position on the substrate with time in the leveling and drying treatments according to the fifth embodiment, FIG. 27B is a diagram showing the change of pressure in the chamber with time in the leveling and drying treatments according to the fifth embodiment, and FIG. 27C is a diagram showing the change of temperature of the middle and peripheral edge plates in the leveling and drying treatments according to the fifth embodiment. Moreover, FIGS. 27A to 27C show the states of the above-described leveling and drying treatments.

In the present embodiment, as shown in FIG. 27A, the difference of the film thickness is controlled to be within the given range, the drying treatment is carried out until the predetermined film thickness (e.g., 400 nm) is obtained, and the solvent in the liquid film 16 is vaporized.

Moreover, in the present embodiment, the drying treatment is performed in the reduced pressure state in the chamber 201. In order to vaporize the solvent in the liquid film 16, the vacuum pump disposed in the exhaust unit 203 is used to exhaust the atmosphere in the chamber 201 to the outside at −60 Torr/sec. Concretely, as shown in FIG. 27B, the pressure in the chamber 201 is kept at about 760 Torr during the leveling treatment. At the drying treatment time, the atmosphere in the chamber is exhausted at −60 Torr/sec, and pressure is lowered to and kept at about 2 Torr corresponding to the vapor pressure of the solvent.

At this time, in the process of the drying treatment, the temperature of the substrate 11 is controlled. A case in which the measured film thickness of the point $P_3$ tends to be smaller than that of the peripheral edge will be described. Here, as shown in FIG. 27C, the temperature $T_r$ of the peripheral edge plate 206b is gradually lowered to about 13° C. from 15° C. Thereafter, the temperature of the peripheral edge plate 206b is kept at 13° C. On the other hand, the temperature $T_c$ of the middle plate is kept at about 23° C. (=room temperature) in the same manner as in the leveling treatment. During the drying treatment, the temperature of the peripheral edge of the substrate 11 is set to be lower than that of the middle portion. When the temperature distribution of the substrate 11 is controlled in this manner, a vaporization speed of the solvent on the peripheral edge discharges as compared with the middle portion, and it is possible to inhibit the solid content from moving into the middle portion from the peripheral edge.

When the measured film thickness of the point $P_3$ tends to be thicker than that of the peripheral edge, the temperature of the peripheral edge of the substrate 11 is set to be higher than that of the middle portion. When the temperature distribution of the substrate 11 is controlled in this manner, the vaporization speed of the solvent on the middle portion discharges as compared with that on the middle portion, and it is possible to inhibit the solid content from moving into the peripheral edge from the middle portion.

In the present embodiment, the drying treatment ends at a time when the solvent of the liquid film 16 is sufficiently vaporized and the film thickness of the liquid film 16 reaches a predetermined film thickness (e.g., 400 nm) and does not change in the respective points $P_1$, $P_2$, $P_3$ on the substrate 11.

Subsequently, the substrate 11 is conveyed out of the leveling/drying treatment apparatus 200, and introduced into a back treatment portion (not shown). Here, when a heating treatment is performed at 140° C. for about 50 seconds, the film is stabilized.

Figure 28A:
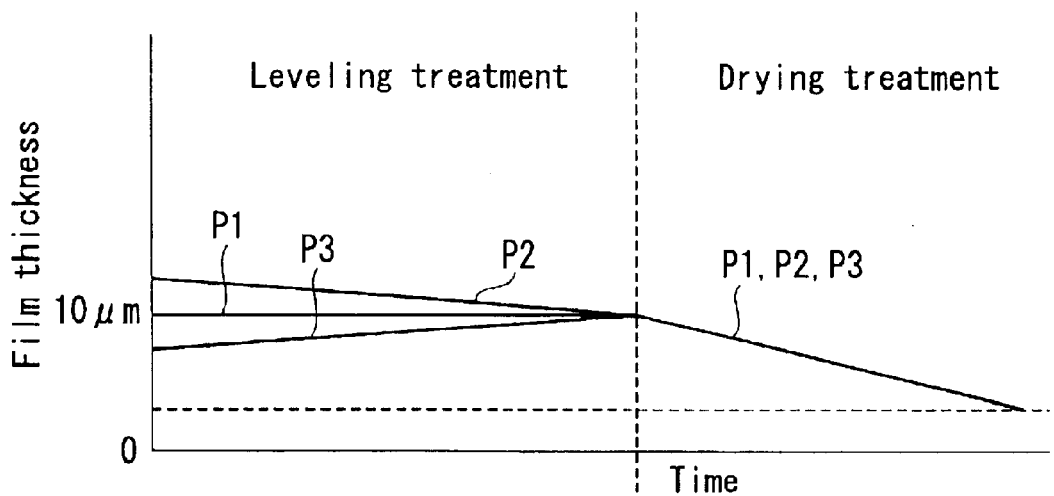
FIG. 28A is a diagram showing the change of the film thickness of the liquid film in each position on the substrate with time in the leveling and drying treatments according to the fifth embodiment.
Figure 28B:
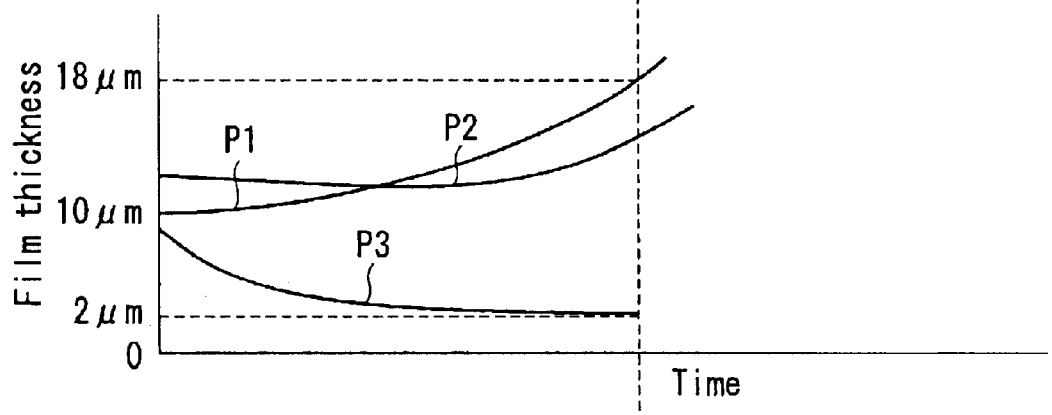
FIG. 28B is a diagram showing the change of the film thickness of the liquid film in each position on the substrate with time in the related-art leveling and drying treatments.
Figure 28C:
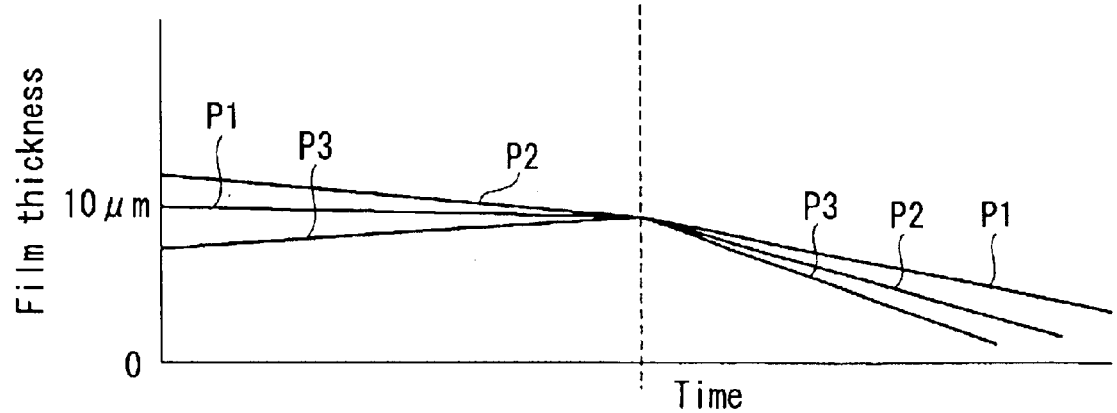
FIG. 28C is a diagram showing the change of the film thickness of the liquid film in each position on the substrate with time in the related-art leveling and drying treatments.
Figure 29A:
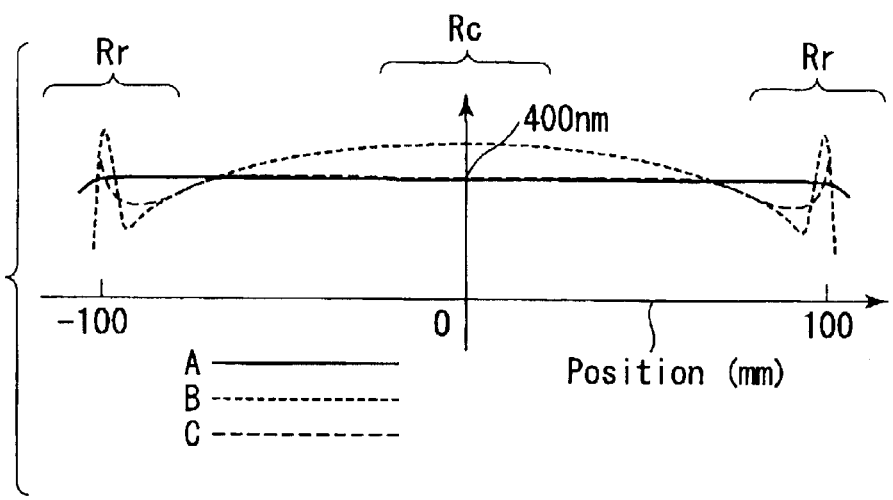
FIGS. 29A, 29B are diagrams showing effects of the fifth embodiment.
Figure 29B:
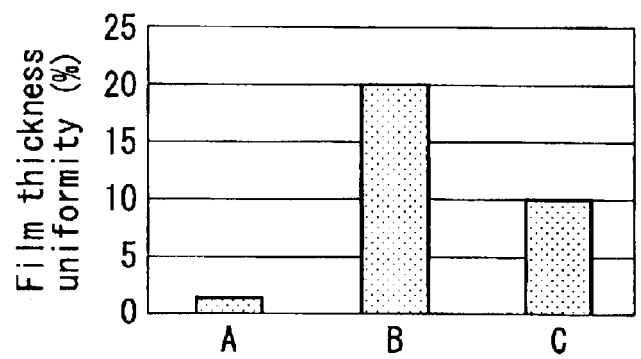

As described above, the coat film of the photoresist with a thickness of about 400 nm (=film of the solid content included in the liquid film 16) is formed as the solid film. Here, the effect of the present embodiment will be described in comparison to the related-art method with reference to FIGS. 28A to 28C and 29A and 29B. FIG. 28A is a diagram showing the change of the film thickness of the liquid film in each position on the substrate with time in the leveling and drying treatments according to the fifth embodiment, FIG. 28B is a diagram showing the change of the film thickness of the liquid film in each position on the substrate with time in the related-art leveling and drying treatments, and FIG. 28C is a diagram showing the change of the film thickness of the liquid film in each position on the substrate with time in the related-art leveling and drying treatments. FIGS. 29A, 29B are diagrams showing the effect of the fifth embodiment.

In the present embodiment, as shown in FIG. 28A, the film thickness of the liquid film is controlled to be within the given range as needed during the leveling and drying treatments.

In the related-art method, without controlling the concentration of the solvent in the chamber 201, and temperature distribution of the substrate 11, the leveling treatment is performed. Concretely, in the process of the leveling treatment, the concentration of the solvent in the gas supplied into the chamber 201 is set to 100% and kept at this value. Moreover, the temperature of the whole temperature control plate 206 is set at 23° C., and kept at this value. Thereafter, the drying treatment is performed so as to vaporize the solvent in the chamber 201 whose pressure has been reduced. At this time, in the related-art method, the film thickness of the liquid film is not measured. Moreover, the temperature of the temperature control plate is kept constant.

In the related-art method, when the film thickness of the liquid film 16 is measured in the respective points $P_1$, $P_2$, $P_3$ during the leveling treatment, as shown in FIG. 28B, the film thickness decreases in the point $P_3$ on the substrate 11. Conversely, it is seen that the film thickness increases in the point $P_1$.

Moreover, at the end time of the leveling treatment, the film thickness of the liquid film 16 in the point $P_1$ was 18 μm, and the film thickness of the liquid film 16 in the point $P_3$ was 2 μm. It is seen that the film thickness difference of the liquid film 16 is large on the middle portion and peripheral edge of the substrate 11. In this manner, in the related-art method, the concave/convex portion in the surface generated in the process of formation of the liquid film disappears by the leveling treatment, and the whole film tends to be thick in the middle portion and thin in the peripheral edge.

Furthermore, thereafter, the drying treatment is performed in the reduced pressure state. In the related-art drying treatment, when the solvent of the liquid film is vaporized, the film thickness is not controlled so as to be within the given range as described above. Therefore, when the drying treatment is performed, film thickness sag (=decrease of the film thickness) of the peripheral edge is further promoted in the process of vaporization of the solvent, and the solid film is formed.

Another method will next be described. In the same manner as in the present embodiment, at the leveling treatment time, this method comprises: measuring and monitoring the film thickness of the liquid film in the respective points $P_1$, $P_2$, $P_3$; controlling the concentration of the solvent in the gas supplied into the chamber 201; and using the temperature control plate to control the temperature distribution of the substrate. Thereafter, the film thickness is not measured at the drying treatment time. Moreover, while the temperature of the temperature control plate is kept to be constant at 23° C., the solvent is vaporized and the drying treatment is performed.

In this method, as shown in FIG. 28C, immediately after the end of the leveling treatment, the film thickness of the liquid film is flatted over the whole surface, but at the drying treatment time the film thickness of the point $P_3$ remarkably decreases as compared with the point $P_1$. The finally formed film is flatted in the middle portion, but the film thickness decreases in the peripheral edge.

FIG. 29A shows the distribution of the film thickness of the solid film formed in temperature profiles shown in FIGS. 28A to 28C. Moreover, FIG. 29B shows the film thickness uniformity of the solid film. In FIGS. 29A, 29B, A denotes the solid film formed in the temperature profile shown in FIG. 28A, B denotes the solid film formed in the temperature profile shown in FIG. 28B, and C denotes the solid film formed in the temperature profile shown in FIG. 28C.

Note that FIG. 29A is a sectional view of the solid film formed on the substrate, and shows the change of the film thickness.

Thereby, it is seen that in B, already at the leveling treatment time, the film thickness of the liquid film largely deviates, and that a large film thickness difference is generated in the positions on the peripheral edge (=coordinate: ±100) and middle portion (=coordinate: 0) after the drying treatment. Moreover, in C, at the leveling treatment time, the film thickness difference is within the given range in each point, but the film thickness difference is generated at the drying treatment time, and the film thickness difference is generated on the peripheral edge and middle portion.

As shown in FIG. 29B, the film thickness uniformity was 20% in B and 10% in C. On the other hand, in A, the solid film whose film thickness is substantially uniform at 400 nm and which has a flatted state is formed over the whole surface of the substrate. Moreover, the film thickness uniformity of A is 1.0%, and is largely enhanced as compared with B and C.

Thereby, when the film thickness of the liquid film at each treatment time is measured and monitored and controlled to be within the given range as needed, as in the present embodiment, a solid film having a flat surface and uniform film thickness can be formed.

As described above, in the present embodiment, during the processes of the leveling and drying treatments, the change of the film thickness of the liquid film 16 is monitored, and each parameter can be adjusted to have the appropriate value while each treatment is performed. Therefore, in the present embodiment, it is possible to obtain a high-precision (i.e., flat) film thickness distribution in the solid film (e.g., photoresist film).

For example, as a result of the monitoring, in the leveling treatment, when the concentration of the solvent in the gas supplied into the chamber is gradually lowered during the treatment step, the solvent can be prevented from being unnecessarily applied to the surface of the liquid film 16 and the film thickness distribution can be prevented from being disordered. Moreover, in the drying treatment, the temperature difference between the peripheral edge and middle portion of the substrate 11 is controlled, and thereby the solid content movement is prevented from being caused by the difference in physical properties of the liquid film between the middle portion and peripheral edge of the substrate with the progress of the drying, that is, vaporization of the solvent.

The present embodiment can be modified without departing from the scope of the present invention.

Figure 30:
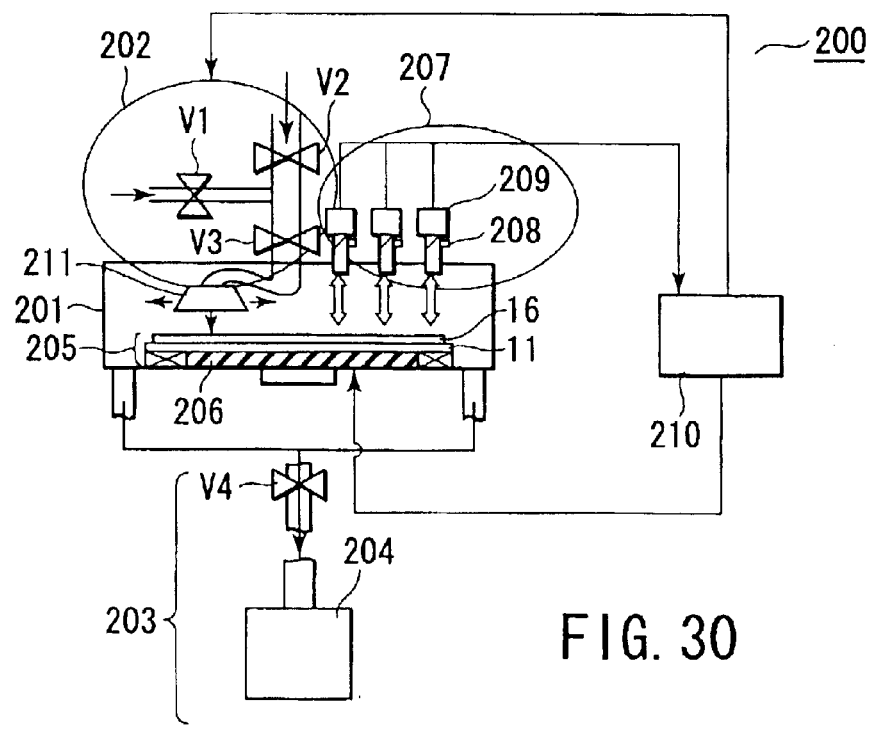
FIG. 30 is a schematic diagram showing an apparatus for treating the liquid film on the substrate according to a change example of the fifth embodiment.

The leveling treatment can be changed as follows. In the present embodiment, the concentration of the solvent in the chamber 201 during the leveling treatment is uniformed in the chamber 201 as a treatment container, but this is not limited. For example, a concentration distribution may be disposed in the plane of the liquid film 16. In this case, as shown in FIG. 30, a supply port 211 for supplying the gas including the solvent into the chamber 201 may be constituted to be movable in the plane of the liquid film 16. Moreover, the substrate 11 itself may be constituted so as to be movable.

In this case, it is possible to adjust the concentration of the solvent in the gas supplied onto the liquid film surface in accordance with the film thickness of the liquid film 16 and to flat the surface. Moreover, with the method for controlling the film thickness of each point to satisfy the desired value, it is unnecessary to control all the parameters, such as the concentration of the solvent and temperature distribution of the substrate 11, and any one parameter may be controlled.

Moreover, in the present embodiment, in the leveling and drying treatments, the concentration of the solvent and the temperature distribution of the temperature control plate are not limited to the above-described values, and can be changed in accordance with type of coating solution used, substrate, and coating method.

Furthermore, the solvent for use in the leveling treatment is not limited to the solvent of the material used in the liquid film 16, and any material that functions with respect to the liquid film 16 so as to promote the fluidity of the liquid film 16 may be used. Additionally, a solvent including a surface-active agent which functions so as to lower the surface tension of the liquid film 16 may also be used.

Moreover, in the present embodiment, the fluidity of the surface is promoted by adding the solvent to the surface of the liquid film 16 and the leveling is performed, but this is not limited.

In the leveling treatment, the gas including the solvent with the given concentration is supplied into the chamber 201, and the temperature control plate 206 is used to control the temperature of the substrate 11, so that the surface can be flatted.

Figure 31A:
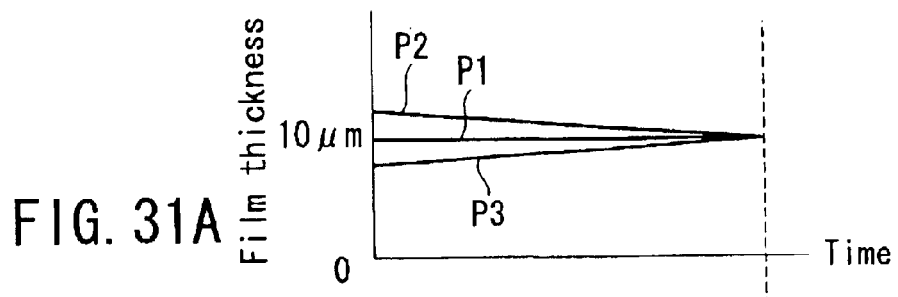
FIG. 31A is a diagram showing the change of the film thickness of the liquid film in each position on the substrate with time in the leveling treatment according to the fifth embodiment.
Figure 31B:
FIG. 31B is a diagram showing the change of solvent concentration in gas supplied into the chamber with time in the leveling treatment according to the fifth embodiment.

Here, the leveling treatment will concretely be described with reference to FIGS. 31A to 31C. FIG. 31A is a diagram showing the change of the film thickness of the liquid film in each position on the substrate with time in the leveling treatment according to the fifth embodiment, FIG. 31B is a diagram showing the change of solvent concentration in gas supplied into the chamber with time in the leveling treatment according to the fifth embodiment, and FIG. 31C is a diagram showing the change of temperature of the middle and peripheral edge plates in the leveling treatment according to the fifth embodiment.

First, the substrate 11 is conveyed into the chamber 201 of the leveling/drying treatment apparatus 200, and laid and fixed onto the stage 205. At this time, the temperature $T_c$ of the middle plate 206a disposed in the stage 205 is set at 30° C., and the temperature $T_r$ of the peripheral edge plate 206b is set at 23° C.

Thereafter, the leveling treatment is started so as to flat the surface of the liquid film 16. At this time, as shown in FIG. 31B, during the leveling treatment, the concentration of the solvent in the gas supplied into the chamber 201 is kept constant. For example, the concentration of the solvent is kept at 50%.

Figure 31C:
FIG. 31C is a diagram showing the change of temperature of the middle and peripheral edge plates in the leveling treatment according to the fifth embodiment.

Immediately after the leveling treatment is started, as shown in FIG. 31C, the film thickness of the liquid film 16 largely deviates in the respective points $P_1$, $P_2$, $P_3$ on the substrate 11.

Moreover, as shown in FIG. 31C, after the leveling treatment starts, the temperature $T_r$ of the peripheral edge plate 206b is lowered to about 30° C. As a result, the temperature of the middle portion of the substrate varies greatly from that of the peripheral edge of the substrate.

In this leveling treatment, the temperature of the middle portion of the substrate 11 is raised, the viscosity of the liquid film 16 is reduced, and the fluidity is further promoted. Thereby, the surface can be flatted in the same manner as in the case in which the solvent is supplied to the surface of the liquid film 16.

Furthermore, at this time, the temperature of the peripheral edge of the substrate 11 is lowered to about 20° C. During the leveling treatment, the temperature of the peripheral edge of the substrate 11 is set to be lower than that of the middle portion. Therefore, it is possible to inhibit the solid content from moving toward the middle portion from the peripheral edge of the substrate 11.

In the present embodiment, in the drying treatment, the inside of the chamber 201 is exhausted, and the solvent of the liquid film is vaporized in this reduced pressure state, but this is not limited, and can be changed as follows.

Figure 32:
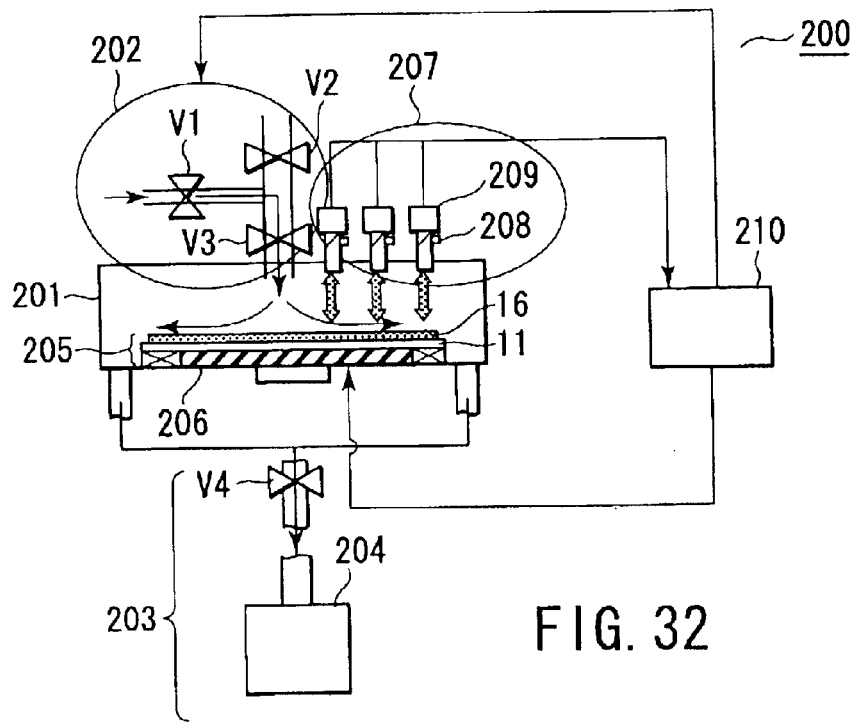
FIG. 32 is a schematic diagram showing the apparatus for treating the liquid film on the substrate according to a modification example of the fifth embodiment.

For example, in order to promote the vaporization of the solvent, the air current by the inactive gas (e.g., $N_2$, Ar) is formed on the surface of the liquid film 16, and the drying treatment can be performed. In this case, as shown in FIG. 32, in the leveling/drying treatment apparatus 200, the gas control unit 202 is used. The inactive gas such as $N_2$ is fed into the chamber 201 from above the substrate 11, the air current is supplied to the surface of the liquid film 16 to vaporize the solvent, and the drying treatment can be performed. Here, as described above, in the leveling/drying treatment apparatus 200, the temperature control plate 206 is disposed on the stage 205 on which the substrate 11 is laid. Moreover, if there is no particular problem, air may be used in forming the air current.

Note that the supply of gas from above the substrate 11 is not limited. In the leveling/drying treatment apparatus 200, the gas is fed into the chamber 201 from below the substrate 11, and may be exhausted from above the substrate 11. Moreover, the air current may flow in one direction (transverse direction) with respect to the surface of the substrate 11. For example, the gas may be supplied through one end of the substrate 11 and exhausted through the other end.

Figure 33A:
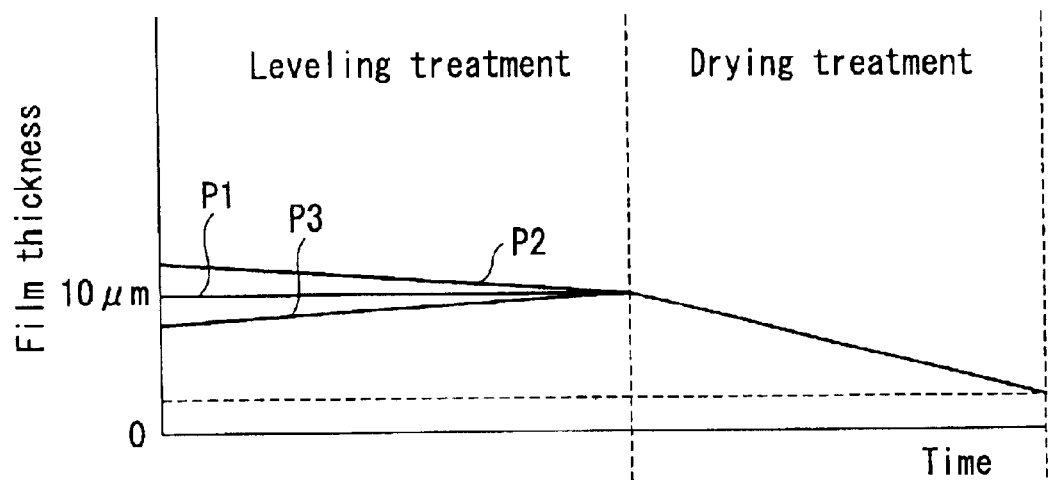
FIG. 33A is a diagram showing the change of the film thickness of the liquid film in each position on the substrate with time in the leveling and drying treatments according to the fifth embodiment.
Figure 33B:
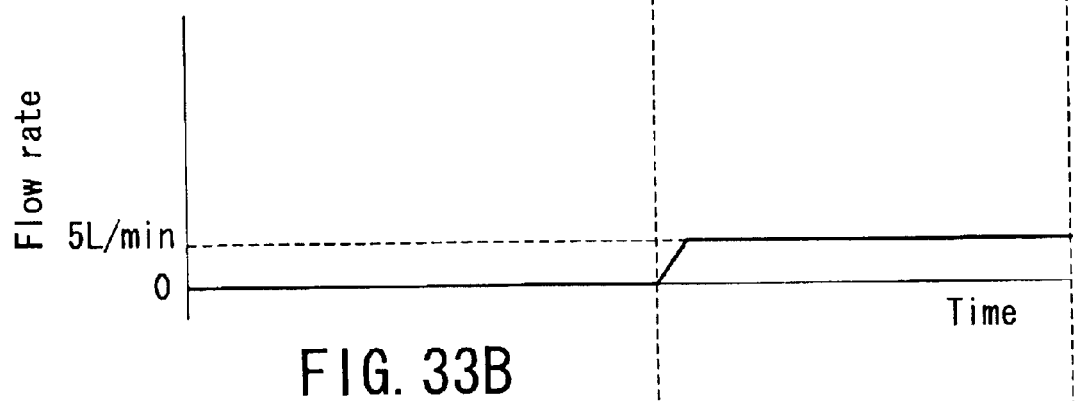
FIG. 33B is a diagram showing a change of a flow rate of $N_2$ gas supplied into the chamber with time in the leveling and drying treatments according to the fifth embodiment.
Figure 33C:
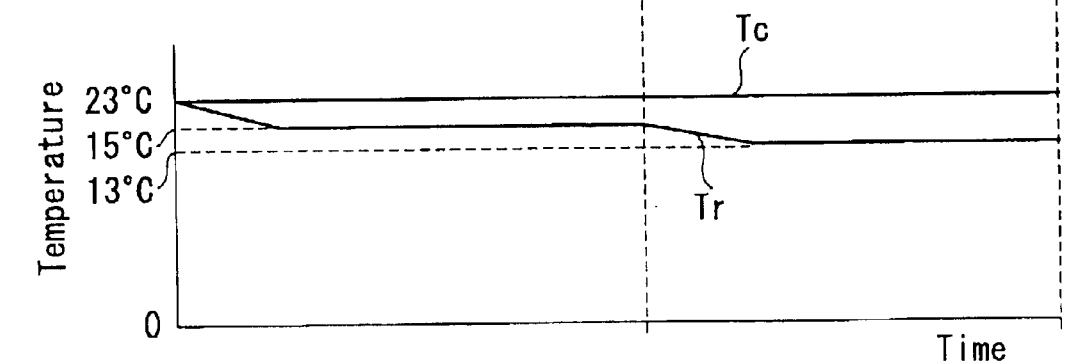
FIG. 33C is a diagram showing the change of temperature of the middle and peripheral edge plates in the leveling and drying treatments according to the fifth embodiment.

Here, this drying treatment will concretely be described with reference to FIGS. 33A to 33C. FIG. 33A is a diagram showing the change of the film thickness of the liquid film in each position on the substrate with time in the leveling and drying treatments according to the fifth embodiment, FIG. 33B is a diagram showing a change of a flow rate of $N_2$ gas supplied into the chamber with time in the leveling and drying treatments according to the fifth embodiment, and FIG. 33C is a diagram showing the change of temperature of the middle and peripheral edge plates in the leveling and drying treatments according to the fifth embodiment. FIGS. 33A to 33C continuously show the states of the above-described leveling and drying treatments.

As shown in FIG. 33A, the leveling treatment is performed, and the difference of the film thickness of each point is controlled to be within the given range. Thereafter, the drying treatment is performed, and the solvent is vaporized until the liquid film 16 obtains a predetermined film thickness (e.g., 400 nm).

After the leveling treatment ends, the drying treatment is performed. In the drying treatment, the inactive gas (e.g., $N_2$, Ar) is fed into the chamber 201, and the air current is formed on the surface of the liquid film 16 to vaporize the solvent in the liquid film. At the drying treatment time, $N_2$ gas is supplied into the chamber 201, and an air current is formed in the surface of the liquid film 16. As shown in FIG. 33B, at the drying treatment time, the flow rate of the $N_2$ gas is increased to about 5 L/min.

Moreover, at this time, in the process of the drying treatment, the temperature of the substrate 11 is controlled. Here, as shown in FIG. 33C, the temperature $T_c$ of the middle plate 206a is kept at about 23° C. as in the leveling treatment time. The temperature $T_r$ of the peripheral edge plate 206b is gradually lowered to about 13° C. from 15° C. of the leveling treatment time. Thereafter, in the process of the drying treatment, the temperature $T_r$ of the peripheral edge plate 206b is kept at about 13° C.

In this manner, during the leveling treatment, the temperature of the peripheral edge of the substrate 11 is set to be lower than that of the middle portion, and it is possible to reduce the movement of the solid content toward the middle portion from the peripheral edge.

In the present embodiment, when the solvent of the liquid film 16 is sufficiently vaporized, and the film thickness of the liquid film 16 reaches the predetermined film thickness in the respective points $P_1$, $P_2$, $P_3$ on the substrate 11 and does not change, the drying treatment is ended.

In the present embodiment, in this case, during the drying treatment, the flow rate of the air current is changed as needed, and the film thickness of the liquid film 16 can be inhibited from being lowered on the peripheral edge of the substrate 11. For example, the temperature of the peripheral edge of the substrate 11 is lowered, and the temperature difference from the middle portion is generated. Additionally, the air current may also be increased toward the end from the initial stage of the drying in accordance with the film thickness in the respective points $P_1$, $P_2$, $P_3$ on the substrate 11. In this method, the solid content of the liquid film moved toward the middle portion from the peripheral edge of the substrate is pushed back toward the peripheral edge and the drying may be performed.

Figure 34A:
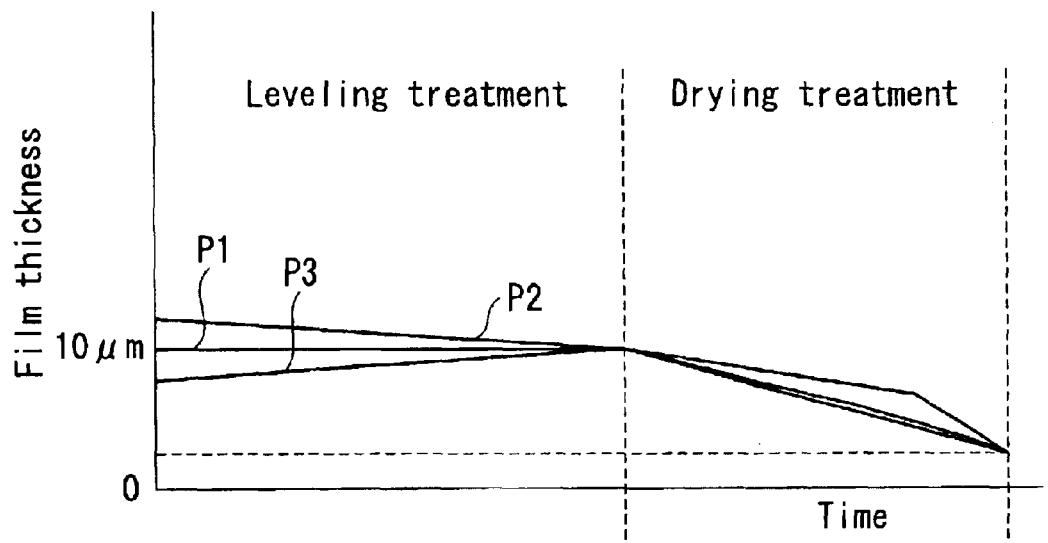
FIG. 34A is a diagram showing the change of the film thickness of the liquid film in each position on the substrate with time in the leveling and drying treatments according to the fifth embodiment.
Figure 34B:
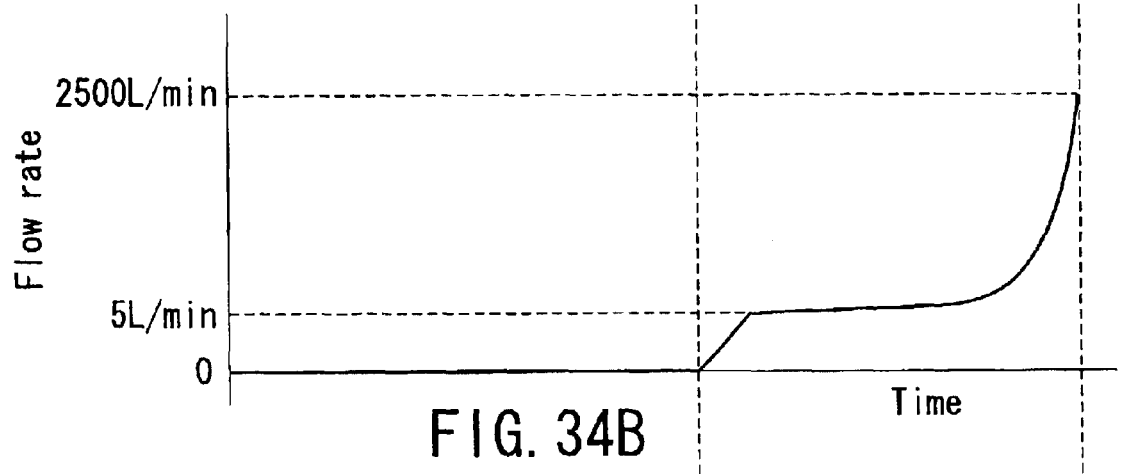
FIG. 34B is a diagram showing the change of the flow rate of $N_2$ gas supplied into the chamber with time in the leveling and drying treatments according to the fifth embodiment.
Figure 34C:
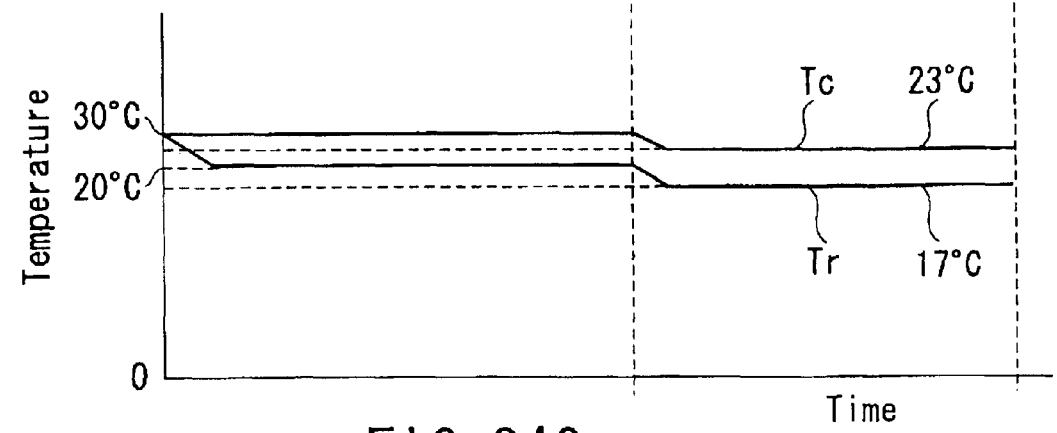
FIG. 34C is a diagram showing the change of temperature of the middle and peripheral edge plates in the leveling and drying treatments according to the fifth embodiment.

Here, this drying treatment will be described with reference to FIGS. 34A to 34C. FIG. 34A is a diagram showing the change of the film thickness of the liquid film in each position on the substrate with time in the leveling and drying treatments according to the fifth embodiment, FIG. 34B is a diagram showing the change of the flow rate of $N_2$ gas supplied into the chamber with time in the leveling and drying treatments according to the fifth embodiment, and FIG. 34C is a diagram showing the change of temperature of the middle and peripheral edge plates in the leveling and drying treatments according to the fifth embodiment. FIGS. 34A to 34C show the states of the above-described leveling and drying treatments.

As shown in FIG. 34A, the leveling treatment is performed, and the difference of the film thickness is controlled to be within the given range. After the leveling treatment, the drying treatment is performed until the liquid film 16 obtains the predetermined film thickness (e.g., 400 nm).

In the drying treatment, an inactive gas (e.g., $N_2$, Ar) is fed into the chamber 201, and an air current is supplied onto the surface of the liquid film 16 to vaporize the solvent. Concretely, $N_2$ gas is fed into the chamber 201, and the air current is formed over the surface of the liquid film 16. At this time, as shown in FIG. 34B, the flow rate of the gas is increased to 5 L/min from the start time of the drying treatment. Thereafter, the flow rate is substantially kept, and increased to about 2500 L/min in an index function manner at the point of end.

In the drying treatment, the temperature of the substrate 11 is controlled. Here, as shown in FIG. 34C, the temperature $T_r$ of the peripheral edge plate 206b is gradually lowered to about 17° C. from the temperature (=20° C.) of the leveling treatment time. Thereafter, in the process of the drying treatment, the temperature $T_r$ is maintained constant. On the other hand, the temperature $T_c$ of the middle plate is lowered to about 23° C. (=room temperature) from the temperature (=30° C.) of the leveling treatment time. Thereafter, the temperature $T_c$ is maintained constant.

In the present embodiment, when the solvent of the liquid film 16 is sufficiently vaporized, and the film thickness of the liquid film 16 reaches a predetermined film thickness (e.g., 400 nm) in the respective points $P_1$, $P_2$, $P_3$ on the substrate 11, and does not change, the drying treatment is ended.

Figure 35:
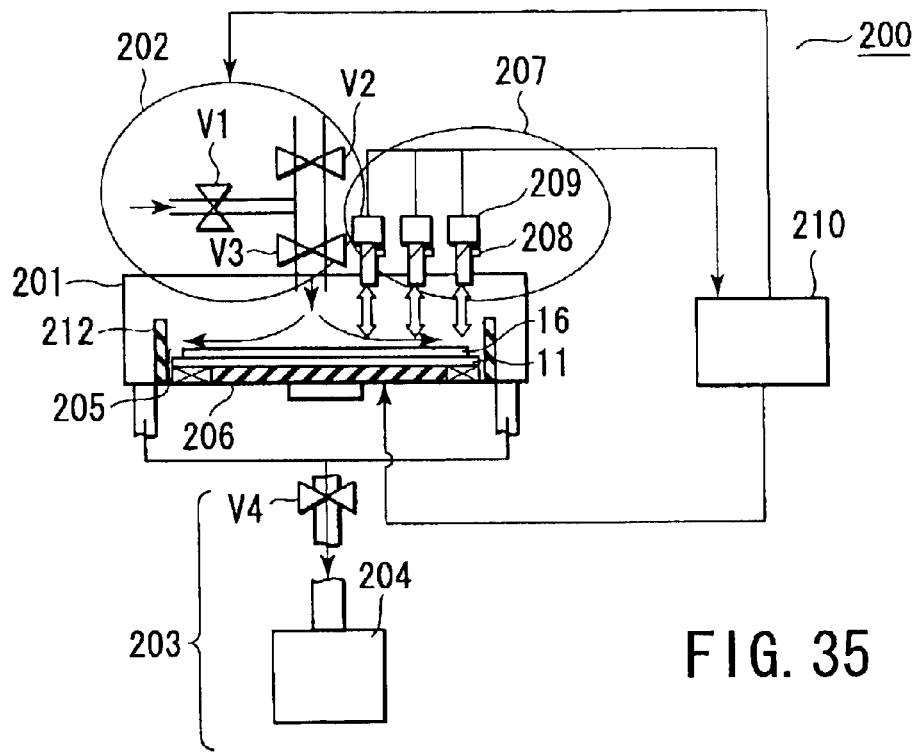
FIG. 35 is a schematic diagram showing the apparatus for treating the liquid film on the substrate according to a modification example of the fifth embodiment.

Moreover, when an air current is supplied to the liquid film 16 to perform the drying treatment, a part of the leveling/drying treatment apparatus 200 is changed, and an air current control plate 212 may be disposed in the position of the outer periphery of the substrate 11 as shown in FIG. 35. Since the air current control wall 212 is disposed in this position, the air current is reduced on the peripheral edge of the substrate 11, and rapid drying (i.e., vaporization of the solvent) can be inhibited. Therefore, controllability of the film thickness of the liquid film 16 is enhanced in the peripheral edge of the substrate 11.

In the present embodiment, when the rotation of the substrate is combined at the drying treatment time, the film thickness difference of the liquid film is controlled to be within the given range, and the solvent can be vaporized.

Figure 36:
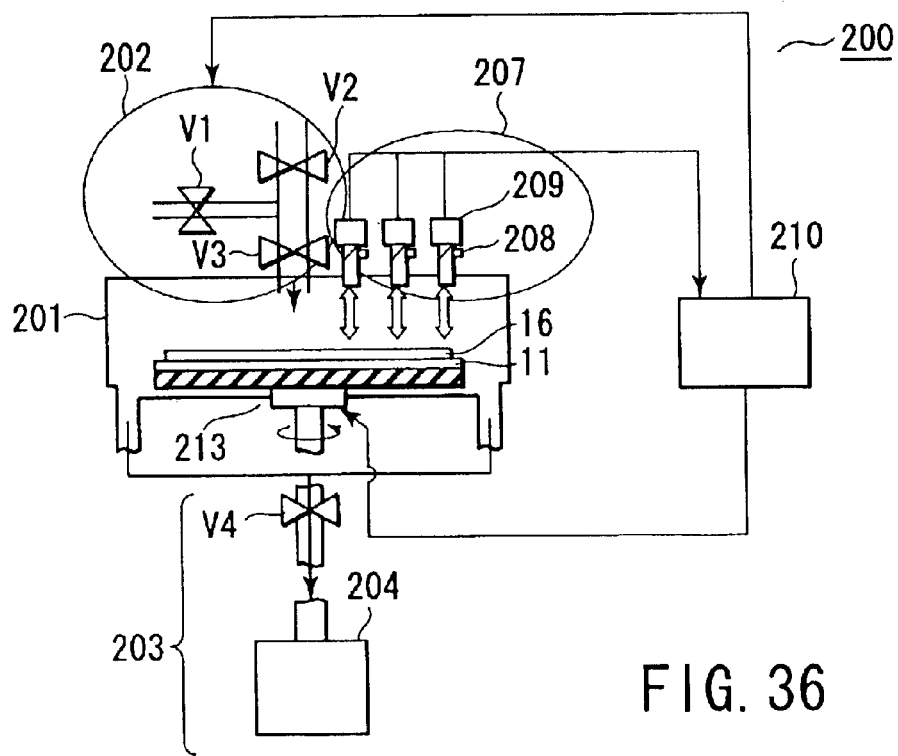
FIG. 36 is a schematic diagram showing the apparatus for treating the liquid film on the substrate according to the modification example of the fifth embodiment.

In this case, a part of the leveling/drying treatment apparatus 200 is changed, and a rotation system stage 213 is disposed as shown in FIG. 36. While the substrate 11 is laid and fixed onto the rotation system stage 213, the leveling and drying treatments are performed. Moreover, the rotation system stage 213 is connected to the analysis unit 210. The analysis unit 210 sends an indication of a rotation speed to the rotation system stage 213 based on the measurement result of the optical system for film thickness measurement 207, and the rotation speed of the substrate 11 is controlled.

For example, after the leveling treatment, the gas in the chamber 201 is exhausted, and the drying treatment is performed in the reduced pressure state. During the drying treatment, the substrate 11 starts to be rotated at a predetermined timing. While the rotation speed of the substrate 11 is increased, the film thickness of the liquid film 16 is controlled in each point.

Figure 37A:
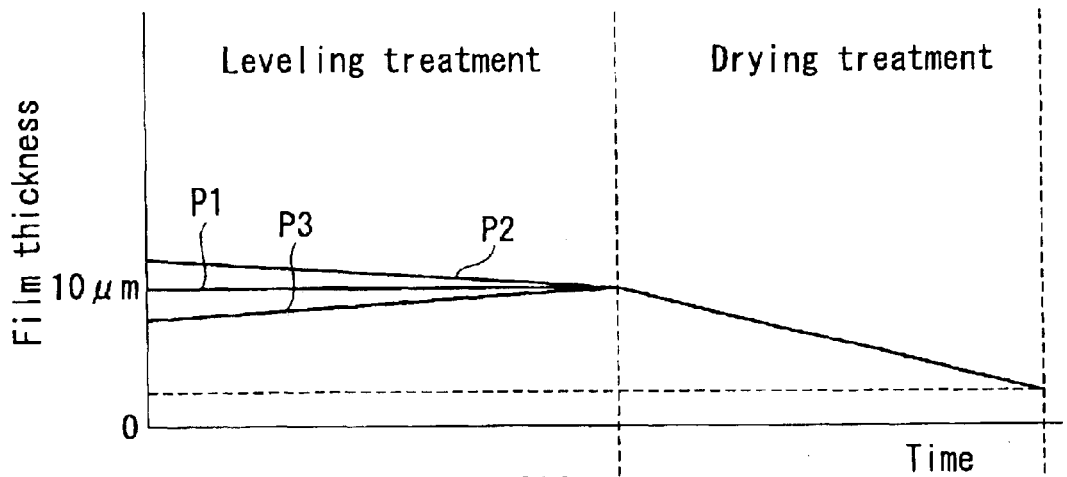
FIG. 37A is a diagram showing the change of the film thickness of the liquid film in each position on the substrate with time in the leveling and drying treatments according to the fifth embodiment.
Figure 37B:
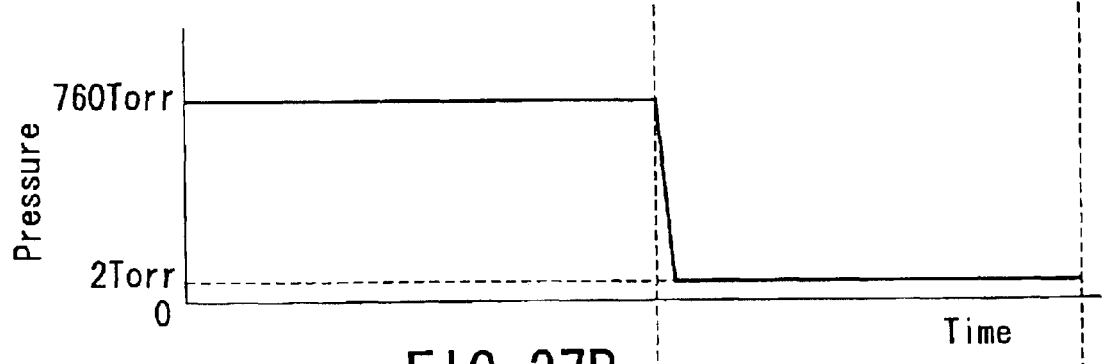
FIG. 37B is a diagram showing the change of the pressure in the chamber with time in the leveling and drying treatments according to the fifth embodiment.
Figure 37C:
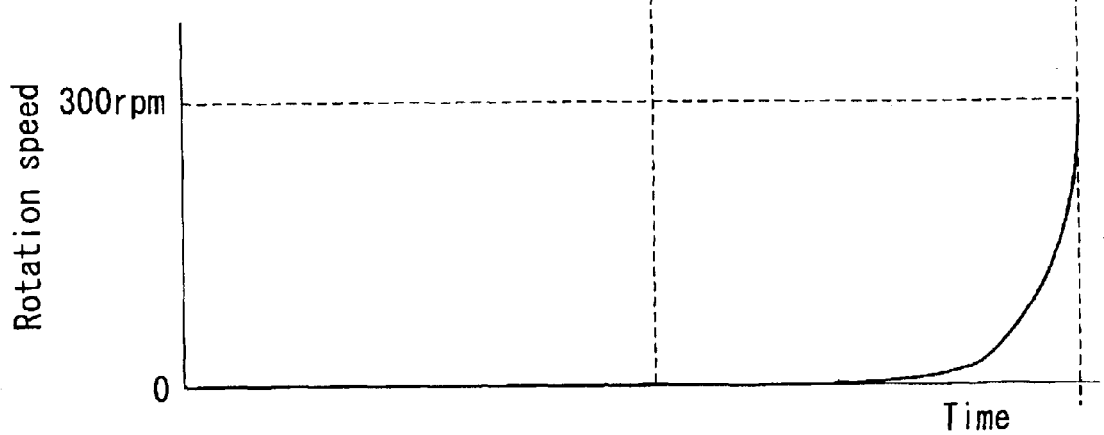
FIG. 37C is a diagram showing a change of rotation speed of the substrate in the leveling and drying treatments according to the fifth embodiment.

This drying treatment will be described with reference to FIGS. 37A to 37C. FIGS. 37A to 37C continuously show the states of the above-described leveling and drying treatments.

As shown in FIG. 37A, after the leveling treatment, the difference of the film thickness in each point is controlled to be within the given range, the solvent of liquid film 16 is vaporized until a predetermined film thickness (e.g., 400 nm) is obtained, and the drying treatment is performed.

At this time, the drying treatment is performed in a reduced pressure state in the chamber 201. In order to vaporize the solvent in the liquid film 16, a vacuum pump disposed in the exhaust unit 203 is used to exhaust the atmosphere in the chamber 201 to the outside at −60 Torr/sec. Concretely, as shown in FIG. 37B, the pressure in the chamber 201 is kept at about 760 Torr during the leveling treatment. Thereafter, the atmosphere in the chamber 201 is exhausted at −60 Torr/sec, and pressure in the chamber 201 is set to about 2 Torr corresponding to the vapor pressure of the solvent. Moreover, during the drying treatment, the pressure in the chamber 201 is kept at 2 Torr.

Moreover, as shown in FIG. 37C, the leveling treatment is performed while the substrate 11 is in a stationary state (=rotation speed of 0 rpm). The substrate 11 is rotated from the middle of the drying treatment. Towards the end of the drying treatment, the rotation speed is rapidly increased in the index function manner until the rotation speed is about 300 rpm.

In this case, the rotation speed of the substrate is increased in accordance with the film thickness of the liquid film 16, the flow of the liquid film 16 to the middle portion from the peripheral edge is inhibited by the centrifugal force, and the solid content can be inhibited from moving onto the middle portion. Moreover, this method can also be applied to the drying treatment in which an air current is supplied, as described above.

Figure 38A:
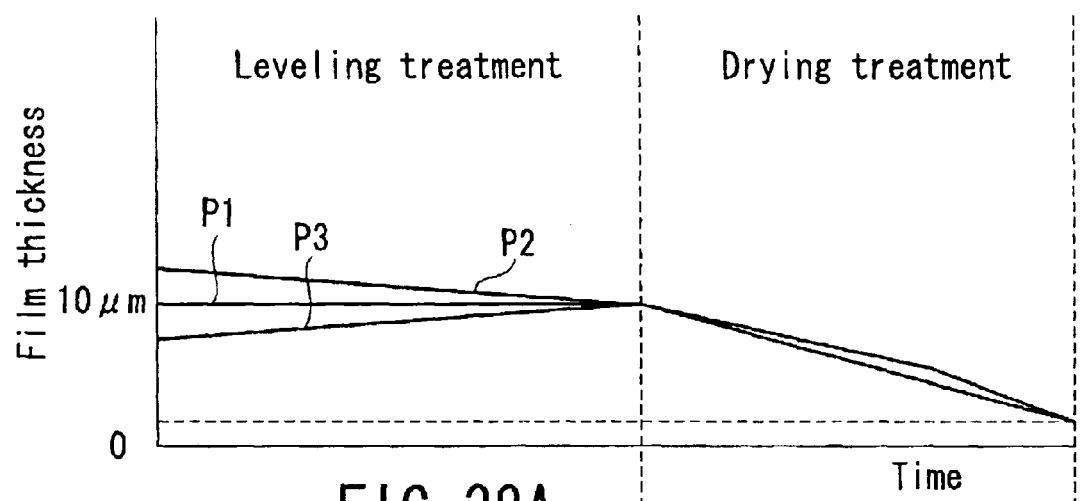
FIG. 38A is a diagram showing the change of the film thickness of the liquid film in each position on the substrate with time in the leveling and drying treatments according to the fifth embodiment.
Figure 38B:
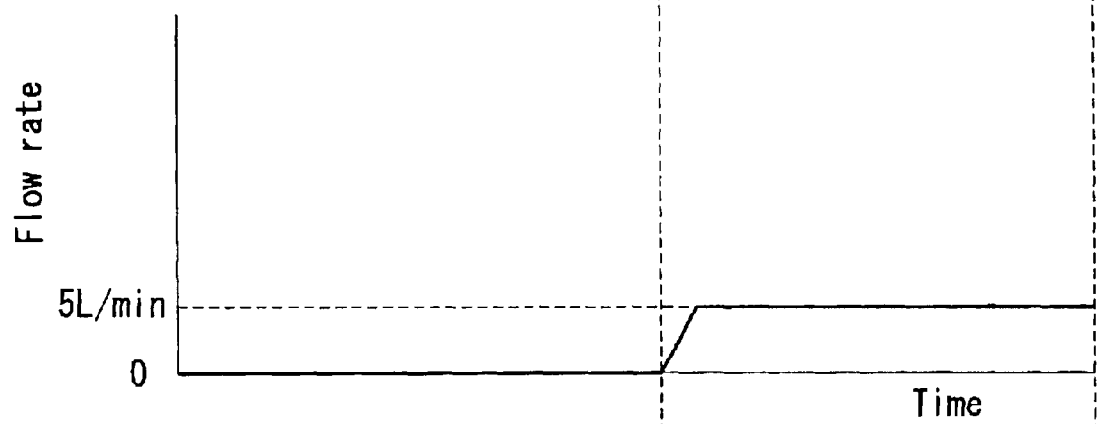
FIG. 38B is a diagram showing the change of the flow rate of $N_2$ gas supplied into the chamber with time in the leveling and drying treatments according to the fifth embodiment.
Figure 38C:
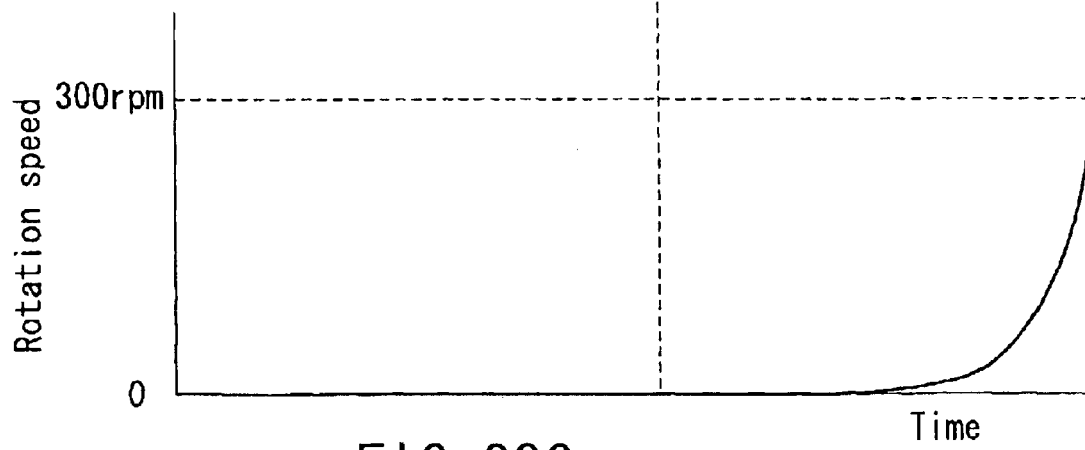
FIG. 38C is a diagram showing the change of rotation speed of the substrate in the leveling and drying treatments according to the fifth embodiment.

This drying treatment will be described with reference to FIGS. 38A to 38C. FIGS. 38A to 38C show the states of the above-described leveling and drying treatments. FIG. 38A is a diagram showing the change of the film thickness of the liquid film in each position on the substrate with time in the leveling and drying treatments according to the fifth embodiment, FIG. 38B is a diagram showing the change of the flow rate of $N_2$ gas supplied into the chamber with time in the leveling and drying treatments according to the fifth embodiment, and FIG. 38C is a diagram showing the change of the rotation speed of the substrate in the leveling and drying treatments according to the fifth embodiment.

As shown in FIG. 38A, after the leveling treatment, the difference in film thickness at each point is controlled to be within a given range, the solvent of liquid film 16 is vaporized until a predetermined film thickness (e.g., 400 nm) is obtained, and the drying treatment is performed.

At this time, after the end of the leveling treatment, an inactive gas (e.g., $N_2$, Ar) is fed into the chamber 201, and the air current is formed on the surface of the liquid film 16 to vaporize the solvent in the liquid film 16. Concretely, as shown in FIG. 38B, $N_2$ gas is fed into the chamber 201 at a flow rate of about 5 L/min, and an air current is formed over the surface of the liquid film 16.

Moreover, as shown in FIG. 38C, the leveling treatment is performed while the substrate 11 is in the stationary state (=rotation speed of 0 rpm). Thereafter, the substrate 11 starts to be rotated during the drying treatment. The rotation speed of the substrate is rapidly increased in the index function manner until the rotation speed reaches about 300 rpm. In this case, the rotation speed is increased in accordance with the film thickness of the liquid film 16. By the centrifugal force, the liquid film 16 is pushed back onto the peripheral edge, and the solid content can be inhibited from moving onto the middle portion.

Note that as a result of the monitoring/controlling of the film thickness of each point, in one example, the flow rate of the air current and the rotation speed are increased in the index function manner, but this is not limited. A timing for controlling the rotation speed of the substrate and starting the rotation can be changed in accordance with the state of the film thickness. For example, when the liquid film obtains a predetermined film thickness, the rotation speed of the substrate may linearly (=linear function manner) be increased to control the film thickness.

Figure 39A:
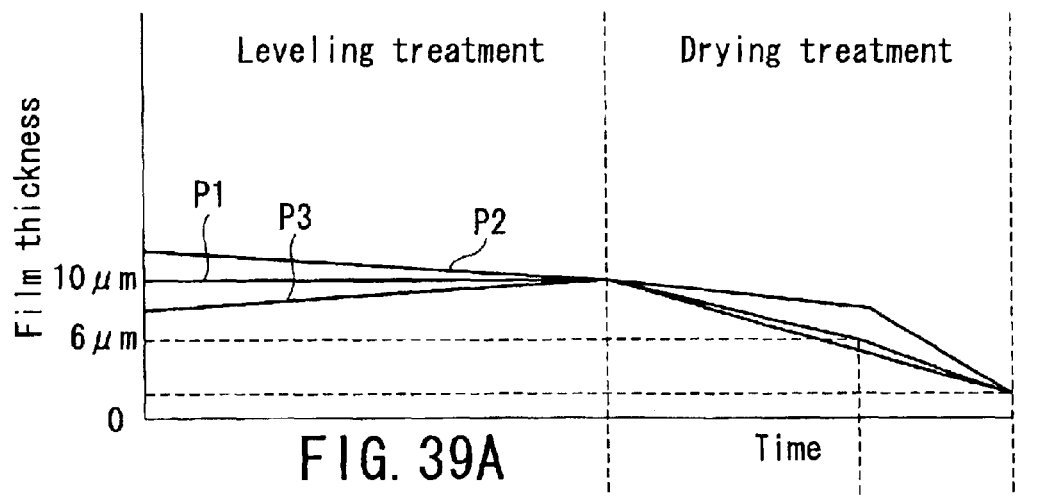
FIG. 39A is a diagram showing the change of the film thickness of the liquid film in each position on the substrate with time in the leveling and drying treatments according to the fifth embodiment.
Figure 39B:
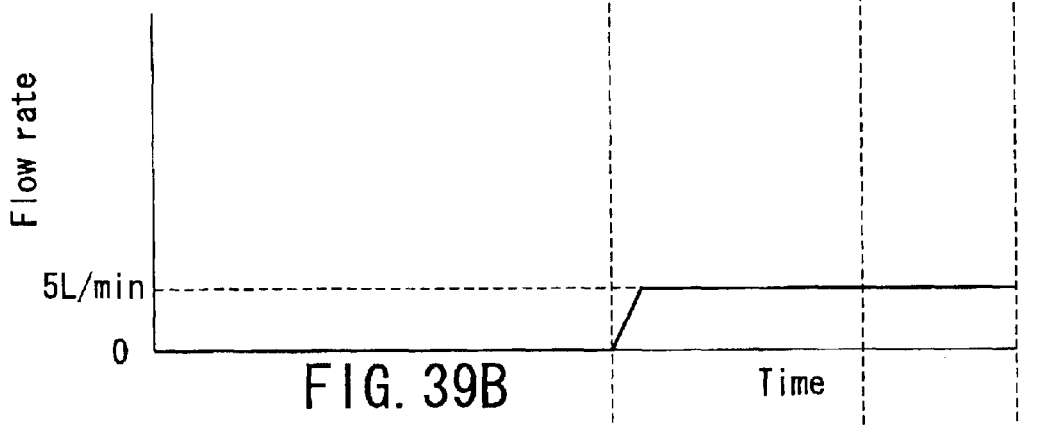
FIG. 39B is a diagram showing the change of the flow rate of $N_2$ gas supplied into the chamber with time in the leveling and drying treatments according to the fifth embodiment.
Figure 39C:
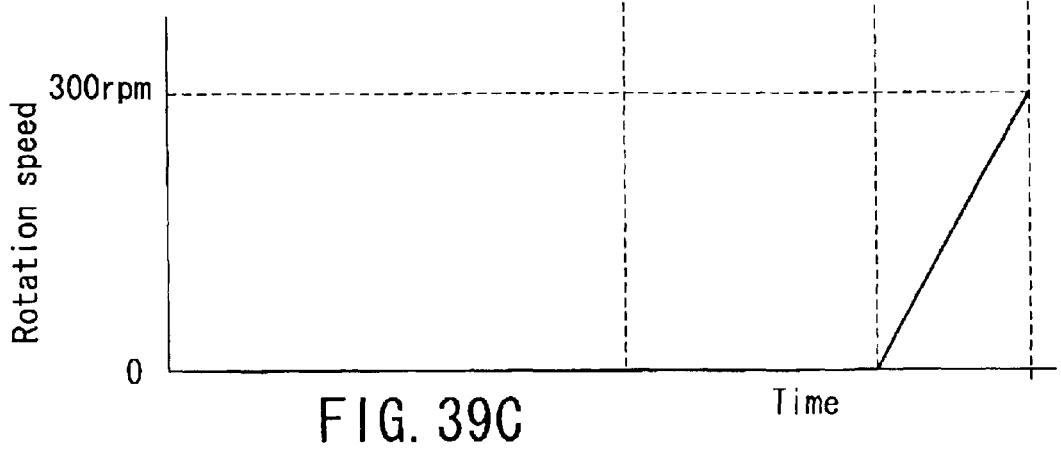
FIG. 39C is a diagram showing the change of rotation speed of the substrate in the leveling and drying treatments according to the fifth embodiment.

This drying treatment will be described with reference to FIGS. 39A to 39C. FIG. 39A is a diagram showing the change of the film thickness of the liquid film in each position on the substrate with time in the leveling and drying treatments according to the fifth embodiment, FIG. 39B is a diagram showing the change of the flow rate of $N_2$ gas supplied into the chamber with time in the leveling and drying treatments according to the fifth embodiment, and FIG. 39C is a diagram showing the change of rotation speed of the substrate in the leveling and drying treatments according to the fifth embodiment. FIGS. 39A to 39C continuously show the states of the above-described leveling and drying treatments.

As shown in FIG. 39A, after the leveling treatment, the difference in the film thickness is controlled to be within a given range in the respective points $P_1$, $P_2$, $P_3$ on the substrate 11, the solvent of the liquid film 16 is vaporized until a predetermined film thickness (e.g., 400 nm) is obtained, and a drying treatment is performed.

At this time, after the leveling treatment ends, an inactive gas (e.g., $N_2$, Ar) is fed into the chamber 201, and an air current is supplied onto the surface of the liquid film 16 to vaporize the solvent. Concretely, as shown in FIG. 39B, $N_2$ is supplied into the chamber 201 at about 5 L/min, and an air current is formed over the surface of the liquid film 16.

Moreover, as shown in FIG. 39C, the leveling treatment is performed while the substrate 11 is in the stationary state (=rotation speed of 0 rpm). At the drying treatment time, when the film thickness of the liquid film 16 reaches the predetermined value, the substrate 11 starts to be rotated. In the present embodiment, when the film thickness of the liquid film 16 reaches 6.0 µm, the substrate 11 starts to be rotated. The rotation speed of the substrate 11 is linearly (=linear function manner) increased to reach about 300 rpm. The rotation speed of the substrate 11 is increased in accordance with the film thickness of the liquid film 16. By the centrifugal force, the liquid film 16 is inhibited from flowing into the middle portion from the peripheral edge, and the solid content can be inhibited from moving onto the middle portion.

In the present embodiment, in one example, the drying treatment is performed until the film thickness of the solid film is substantially obtained (e.g., 400 nm), and the film thickness of the liquid film 16 does not change. Concretely, the treatment is performed until the concentration of the solid content in the liquid film 16 reaches 80% or more. After the drying treatment, a baking treatment is performed to vaporize the remaining solvent, and the film is stabilized. However, the process is not limited to the above-described process. For example, after ending the drying treatment in a stage in which the film thickness of the liquid film still changes, a baking treatment can also be performed. In this case, the drying treatment ends, when the liquid film 16 reaches predetermined film thickness (e.g., 1.0 µm). Thereafter, the baking treatment is performed to stabilize the film, and a solid film having a film thickness of 400 nm is formed.

Note that, here, to prepare for the supply of the air current to the liquid film 16, the air current control wall described above with reference to FIG. 35 can be disposed in the leveling/drying treatment apparatus 200 shown in FIG. 36.

As described above, in the present embodiment, as needed, the film thickness in each point is monitored, the leveling and drying treatments are performed, and the respective treatment parameters (=concentration and pressure of the solvent in the chamber, temperature distribution of the substrate, air current required for the drying treatment, and rotation speed of the substrate) are controlled until these treatments end, but the present invention is not limited to this.

For example, as described hereinafter, in the leveling treatment and in the initial stage of the drying treatment, a control function is derived by fitting the value of each treatment parameter with respect to time. Thereafter, the control may also be executed based on the derived control function until the end of each treatment.

$f(P, t)=0$ $f(T, t)=0$ $f(V, t)=0$ $f(R, t)=0$

P: pressure in the chamber

T: temperature of the substrate

V: flow rate of the air current

R: rotation speed of the substrate t: time

Moreover, as described above, after once deriving the control function, the control function is stored in the analysis unit 210. In the treatment of the second and subsequent substrates, without monitoring the film thickness of the liquid film 16, each treatment can be performed while referring to the control function of the analysis unit 210.

Figure 40A:
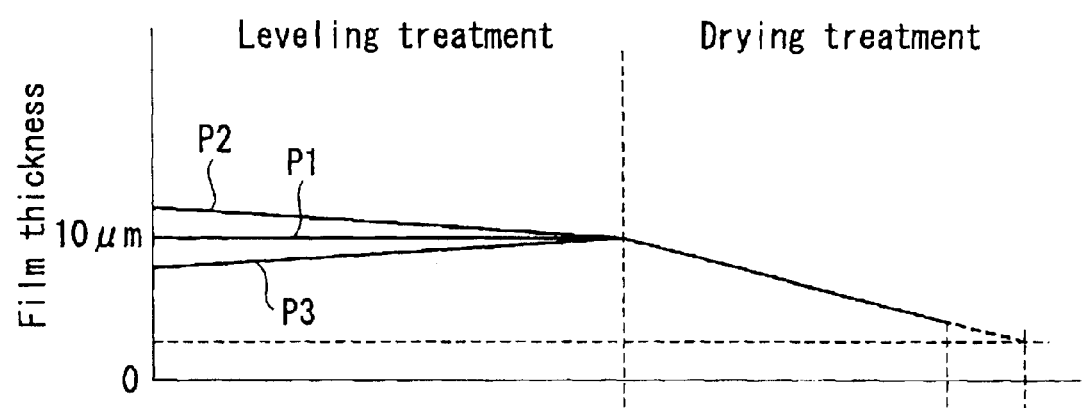
FIG. 40A is a diagram showing the change of the film thickness of the liquid film in each position on the substrate with time in the leveling and drying treatments according to the fifth embodiment.
Figure 40B:
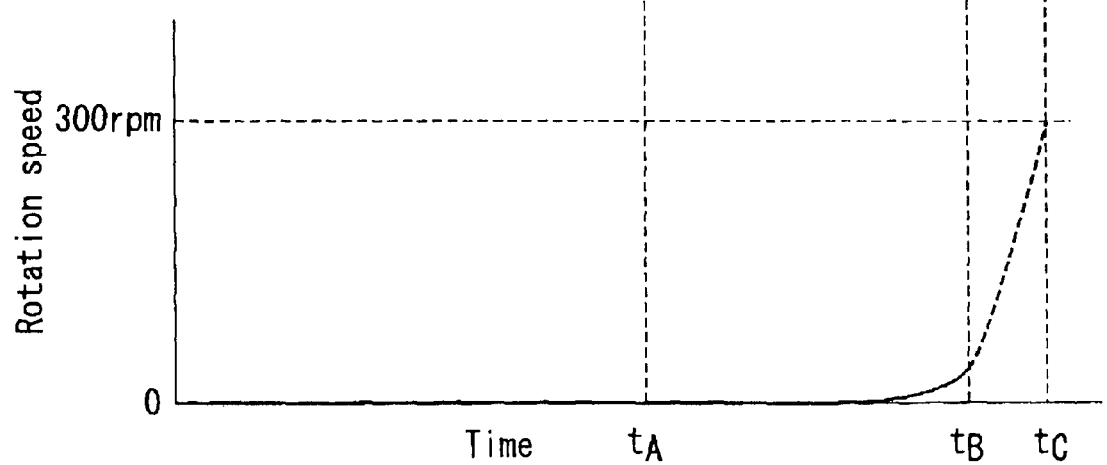
FIG. 40B is a diagram showing the change of rotation speed of the substrate in the leveling and drying treatments according to the fifth embodiment.

For example, to perform the drying treatment by the control of the rotation speed of the substrate 11, from start time $t_A$ of the drying treatment till time $t_B$, the film thickness of the liquid film 16 in each point is measured and monitored, and the rotation speed of the substrate 11 is controlled till the initial stage. FIG. 40A shows tendency of the change of the film thickness of the liquid film 16 at d=−0.16t+10 (d: film thickness, t: time). Moreover, FIG. 40B shows the rotation speed of the substrate in accordance with the film thickness change shown in FIG. 40A. At this time, when the change of the rotation speed of the substrate with respect to the change with time $t_A$ to $t_B$ is derived as the function by the fitting, the rotation speed of the substrate: $R=2.5e^{0.7t}$. Therefore, from time $t_B$ until end time $t_C$ of the drying treatment, the rotation speed of the substrate 11 is controlled in accordance with the function: $R=2.5e^{0.7t}$.

For the second and subsequent substrates, the rotation speed of the substrate 11 may be controlled in accordance with the control function: $R=2.5e^{0.7t}$.

Note that the solid content does not move with the movement of the solution in the transverse direction of the substrate. In this case, the respective conditions such as the temperature of the substrate at the drying time, air current of the drying treatment, atmosphere concentration in the chamber, and pressure are changed using a test substrate beforehand. Moreover, the film thickness is measured by reflected light measurement in a plurality of points including at least the substrate center, coating start position, and coating end position. From these results, a condition on which the interference fringes of the reflected light are generated with respect to the film thickness of the liquid film in one direction, or toward the outer periphery from the substrate center may be determined.

As described above, the present embodiment comprises: forming a liquid film; subsequently continuously performing a leveling and drying treatments; controlling the film thickness difference of the liquid film as needed in each treatment step; and forming the film including the solid content on the substrate. Therefore, when the film thickness of the liquid film in each point is within the predetermined range after forming the liquid film on the substrate, the drying treatment can also be performed without performing the leveling treatment. Moreover, after the leveling treatment, depending on the material of the liquid film, the solid content hardly moves during the drying treatment. In this case, as described above, the film thickness is not particularly controlled, the solvent of the liquid film is vaporized in the related-art method, and the drying treatment can also be performed. In this case, a magnitude relation of the temperature may be reversed in the middle portion and peripheral edge of the substrate so as to perform the drying treatment. That is, in the process in which the drying treatment is performed, the temperature of the middle portion of the substrate is set to be lower than that of the peripheral edge, so that the solvent of the liquid film can also be vaporized.

Additionally, the constitution of the leveling/drying treatment apparatus can appropriately be changed without departing from the scope of the present invention, and the substrate to be actually coated and solution may be used to carry out the experiment described in the present embodiment and to determine each condition.

Sixth Embodiment

FIGS. 41A to 41E are process sectional views showing a manufacturing process of a semiconductor apparatus according to a sixth embodiment of the present invention.

Figure 41A:
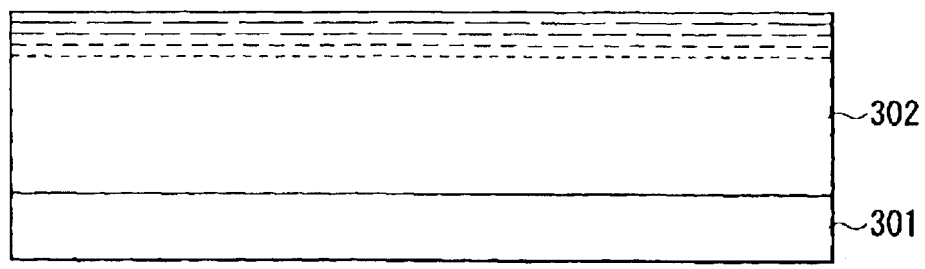
FIGS. 41A to 41E are process sectional views showing a manufacturing process of a semiconductor apparatus according to a sixth embodiment.

First, as shown in FIG. 41A, a liquid film 302 including a resist solution is formed on a substrate 301. The resist solution is obtained by dissolving a chemical amplification type resist material (first material) obtained by blending a resin, dissolution inhibitor material, and acid generating material at a given ratio in ethyl lactate (solvent). The resist solution is adjusted so as to set the film thickness of the resist film (solid film) including the resist material finally to 300 nm in the state in which the solvent in the liquid film is completely evaporated. Note that the substrate 301 includes the semiconductor substrate, and is in the middle of the manufacturing process of the semiconductor apparatus.

Figure 42:
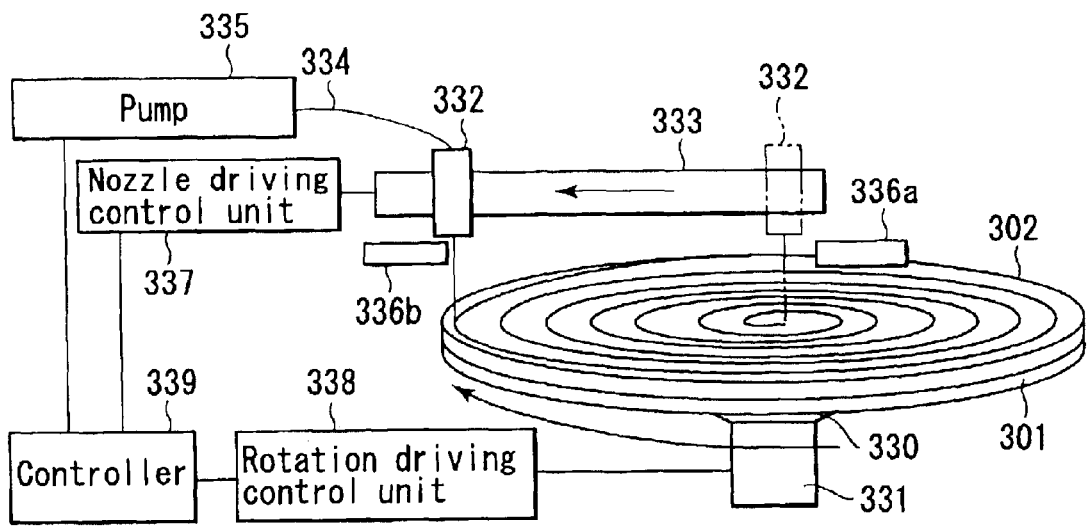
FIG. 42 is a diagram showing a schematic constitution of the liquid film forming apparatus according to the sixth embodiment.

An outline of the liquid film forming apparatus for use in forming the liquid film 302 is shown in FIG. 42.

The apparatus shown in FIG. 42 will next be described. As shown in FIG. 42, a substrate hold portion 330 on which the substrate 301 is mounted is connected to a driving system 331 which rotates centering on the substrate 301. Moreover, a solution discharge nozzle 332 which discharges the solution and which can be moved in the diameter direction by a nozzle driving system 333 is disposed above the substrate 301. The solution discharge nozzle 332 is connected to a solution supply pump 335 which supplies the solution to the solution discharge nozzle 332 via a solution supply tube 334. The discharge speed from the solution discharge nozzle 332 is controlled by controlling a solution supply pressure from the solution supply pump 335.

The solution discharge nozzle 332 starts movement substantially from the center of the substrate 301 by the nozzle driving system 333, and continuously supplies the solution onto the substrate 301 while substantially moving to the edge of the substrate 301. The solution supply ends when the solution discharge nozzle reaches the edge of the substrate 301. In movement start and end points of the solution discharge nozzle, solution cut-off functions 336a, 336b are disposed. The solution cut-off function 336a in the movement start point cuts off the solution discharged from the solution discharge nozzle 332 until the rotation speed of the substrate hold portion 330, movement speed of the nozzle driving system 333, and discharge speed from the solution discharge nozzle 332 reach predetermined values required at the coating start time, and prevents the solution from reaching the substrate 301. Moreover, the solution cut-off function 336b in the movement end point is on standby above the edge of the substrate 301 so as to prevent the solution from being supplied to the edge of the substrate 301, and cuts off the solution discharged from the nozzle 332, when the solution discharge nozzle 332 reaches the edge of the substrate 301. The solution is thus prevented from reaching the substrate 301.

While the solution is supplied onto the substrate 301, the rotation speed of the substrate hold portion 330, movement speed of the nozzle driving system 333, and discharge speed from the solution discharge nozzle 332 are managed by a rotation driving control unit 338, nozzle driving control unit 337, and solution supply pump 335. Note that a controller 339 for controlling the pump 335 and control units 337, 338 is disposed upstream.

The controller 339 determines the rotation speed of the substrate 301, movement speed of the solution discharge nozzle 332, and discharge speed from the solution discharge nozzle 332 based on position information of the solution discharge nozzle 332 on the substrate 301, and instructs the rotation driving control unit 338, nozzle driving control unit 337, and solution supply pump 335. When these operated based on the instruction, the solution is supplied in a spiral form onto the substrate 301. The solution supplied onto the substrate 301 spreads, and is combined with the adjacent liquid film to form one liquid film 302 on the substrate 301.

For the resist solution for use in the above-described two apparatuses, a solution having a small solid content, and low viscosity in a range of about 0.001 Pa·s to 0.010 Pa·s (1 cP to 10 cP) is used.

Figure 43:
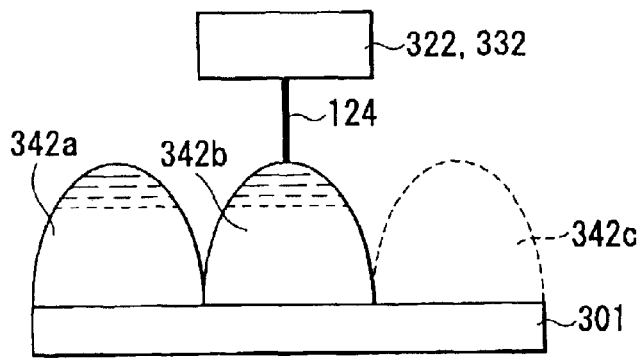
FIG. 43 is a diagram showing a forming process of the liquid film using the liquid film forming apparatus shown in FIG. 42.

The discharging of the solution onto the substrate 301 from the solution discharge nozzles 322, 332 by the above-described apparatus will be described with reference to FIG. 43. FIG. 43 is a sectional view for use in the description of the discharge state of the solution by the liquid film forming apparatus shown in FIG. 42. As shown in FIG. 43, the solution discharge nozzles 322, 332 spirally discharge solutions 342a, 342b, 342c in adjacent positions The spirally discharged solutions 342a, 342b, 342c spread by the fluidity of the solutions with time to form one liquid film. Moreover, as shown in FIG. 41A, the surface of the connected liquid film has a substantially flat shape by the surface tension of the liquid.

Subsequently, the solvent in the liquid film 302 is removed. To remove the solution, the substrate having the liquid film formed on the main surface thereof is exposed under a reduced pressure, or heated using an oven or hot plate, the solvent in the liquid film is evaporated, and the solvent can be removed.

Figure 41B:
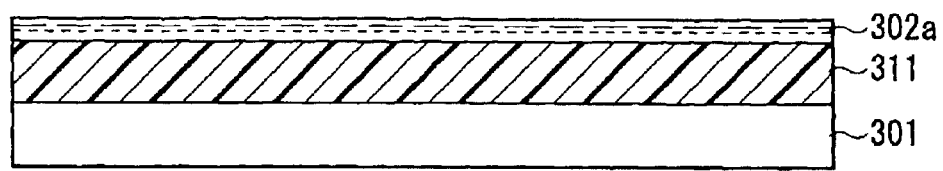

When the removal of the solvent proceeds to some degree, as shown in FIG. 41B, a first resist layer 311 of the lower layer including the resist material is formed from a direction of a lower part of the liquid film 302. Moreover, in the surface layer of a liquid film 302a in which the solvent is being evaporated, the viscosity is in a high state.

To remove the solvent, the film thickness of the first resist layer 311 being formed is measured. The film thickness of the first resist layer 311 can be obtained, for example, by irradiating the liquid film 302 with a light from the light source having a single wavelength as a collimated light, monitoring a reflected light intensity, capturing an interference waveform in the liquid film, and analyzing the waveform using an optical constant (refractive index and attenuation coefficient) of the liquid film.

When the film thickness of the first resist layer 311 being formed reaches 290 nm, the removing of the solvent once stops.

Figure 41C:
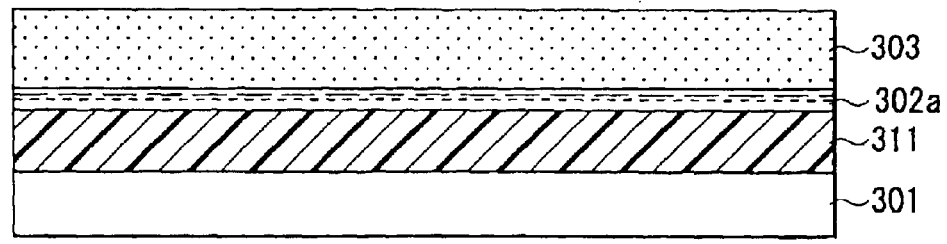

Subsequently, as shown in FIG. 41C, the removal of the solvent is once stopped, a second solution (second material solution) 303 in which the dissolution inhibitor material included in the above-described resist material is dissolved in ethyl lactate is sprayed onto the surface of the liquid film 302 in the process of solidifying, and the dissolution inhibitor material is supplied to the surface of the liquid film 302a. To spray the second solution 303, for example, the substrate 301 including the liquid film 302a remaining on the surface thereof is laid in a container filled with a mist solution.

Moreover, to spray the second solution 303, the substrate 301 is rotated, and the solution can be supplied in a mist form substantially from above the rotation center of the substrate 301. When the substrate 301 is rotated, the air current directed toward the outside of the substrate substantially from the rotation center is generated. When the mist solution is supplied substantially from above the rotation center, the mist solution rides on the air current, and the solution is substantially uniformly sprayed over the whole surface of the substrate 301.

Figure 41D:
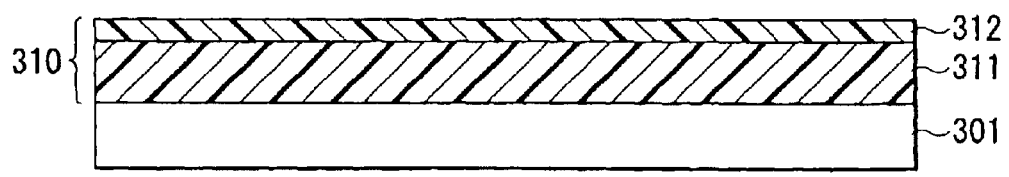

Thereafter, the solvent (ethyl lactate) is continuously removed, the solvent in the liquid film is completely removed, and a solid resist film (solid film) 310 is formed as shown in FIG. 41D. The resist film 310 is constituted of the first resist layer 311 and second resist layer 312 on the first resist layer 311. The second resist layer 312 has a film thickness of 10 nm. As a result of material analysis such as XPS, it has been confirmed that much dissolution inhibitor is distributed in the second resist layer 312 as compared with the first resist layer 311.

According to the above-described method, the dissolution inhibitor material is added to the surface of the liquid film 302a during the drying, the solvent is further removed, and it is possible to easily form the resist film 310 which has a different composition only in the surface layer. Since it is unnecessary to separately form the resist film having the different composition, a manufacturing time of the resist film different in the composition in the film thickness direction is shortened.

Figure 41E:
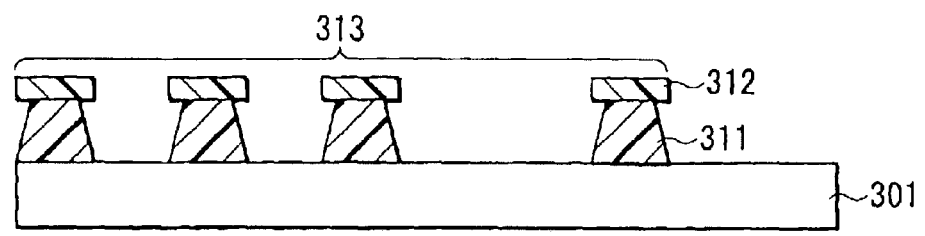

Subsequently, as shown in FIG. 41E, after exposure and post-exposure bake treatment (PEB) are performed, development is performed to form a resist pattern 313.

As shown in FIG. 41E, the upper part of the first resist layer 311 is rounded, but the upper surface of the second resist layer 312 is maintained in a rectangular shape.

The exposure, post-exposure bake treatment, and development of the chemical amplification type resist film will briefly be described. When the acid generating material in the chemical amplification type resist film is irradiated with light, the acid generating material is decomposed and acid molecules are generated. Moreover, the resist film is heated, then the acid molecules decompose the dissolution inhibitor material, and the dissolution inhibitor material is changed into a molecular structure which can be dissolved in a developer.

Figure 44:
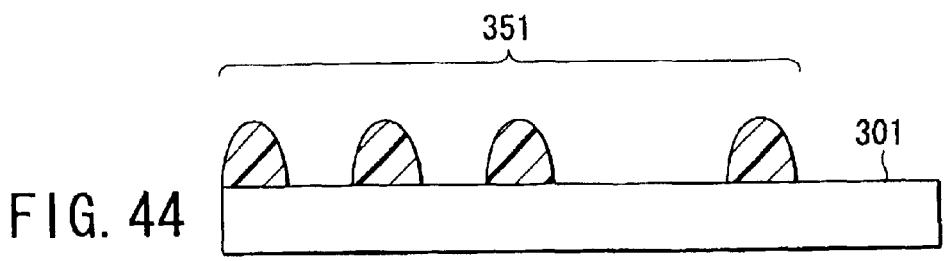
FIG. 44 is a diagram showing a shape of a resist pattern prepared from a resist film formed in a related-art method.

The shape of the resist pattern prepared from the resist film formed in the related-art method is shown in FIG. 44. A resist pattern 351 shown in FIG. 44 is prepared on the same conditions as those of the exposure and development of the resist pattern 313 shown in FIG. 41E.

The reason why the shape of the upper surface of the second resist layer 312 is maintained in the rectangular shape will be described hereinafter. The upper surface of the resist film is exposed to the developer for a long time. Therefore, with the resist film in which the dissolution inhibitor material is uniformly distributed, the upper part is rounded. However, when much dissolution inhibitor is included in the surface as in the present embodiment, the development speed in the upper part can be lowered, and the surface shape can be rectangular.

As described above, when the present method is used, the profile of the resist pattern can easily be improved.

Note that in the method described in the present embodiment, the evaporation is not performed at all, the second solution is supplied onto the liquid film in this state, and the dissolution inhibitor material in the second solution is diffused in the liquid film. Therefore, in the state in which the solvent is removed to some degree and the resist film is formed in the lower part, the second solution has to be supplied onto the liquid film.

Note that in the present embodiment the second resist layer 312 including much dissolution inhibitor is formed in a range of 10 nm from the surface, but this is not limited. This differs by the exposure, post-exposure bake, and development conditions. Therefore, in order to obtain the desired resist pattern, experiments are repeatedly conducted, and the film thickness width including much dissolution inhibitor and the amount of the dissolution inhibitor may be optimized. Moreover, the resist film described in the present embodiment is defined as a photo-sensitive resin film which contains photosensitive polyimide.

The film thickness of the layer including much dissolution inhibitor is determined by the timing to supply the second solution. That is, the thickness is determined by the amount of the liquid film formed on the solid film being formed.

Therefore, in the method described in the present embodiment, it is important to grasp the evaporation state of the solvent.

For the resist solution for use in the above-described two apparatuses, the solution containing a large amount of solvent in the liquid film is used. Therefore, much time is required for removing the solvent, and it is easy to grasp the evaporation state of the solvent. Therefore, in the method described in the present embodiment, the above-described liquid film forming apparatus is preferably used.

Note that the method described in the present embodiment can also be applied to the liquid film formed by a spin coating method. Moreover, the present invention can also be applied to the liquid film prepared in various methods such as a method of discharging or spraying the solution to form the film, and a method of using the meniscus phenomenon to form the film, as disclosed in Jpn. Pat. Appln. KOKAI Publication Nos. 2-220428, 6-151295, 7-321001, 2001-310155, and 11-243043.

Moreover, in the present embodiment, the same dissolution inhibitor material as that contained in the resist material is used as the dissolution inhibitor material, but this is not limited. As long as the desired resist pattern profile is obtained, any available material may also be used. Also in this case, the experiments are repeatedly conducted, the material is selected, and the film thickness width to be added and addition amount may be optimized.

Moreover, in the present embodiment, the removal of the solvent is once stopped, the solution in which the dissolution inhibitor material included in the above-described resist is dissolved in ethyl lactate is sprayed onto the liquid film surface in the process of solidification, and thereafter the solvent (ethyl lactate) is continuously removed, but this is not limited.

For example, while the solvent is removed, the spray amount of the solution containing the dissolution inhibitor material dissolved in the ethyl lactate is increased with time to form the resist film, and it is also possible to raise the concentration of the dissolution inhibitor material in the vicinity of the film surface.

Figure 45:
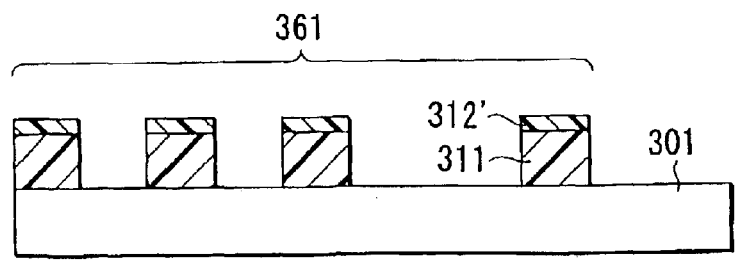
FIG. 45 is a sectional view showing the shape of the resist pattern prepared using the resist film having a profile which has a higher dissolution inhibitor material concentration closer to the surface.

When the resist film is subjected to this treatment, as shown in FIG. 45, a rectangular satisfactory resist pattern 361 can be obtained. In FIG. 45, a second resist layer 312' has a dissolution inhibitor material concentration higher than that of the first resist layer 311, and is a resist film which has a profile having the high dissolution inhibitor material concentration in the vicinity of the surface. FIG. 45 is a sectional view showing the shape of the resist pattern prepared using the resist film having the profile which has the higher dissolution inhibitor material concentration closer to the surface.

Moreover, in the present embodiment, the layer including more dissolution inhibitor in the resist film surface is formed in consideration of pattern deterioration during the development, but this is not limited.

For the film in which evaporation of acid at a bake or exposure time as a problem in the chemical amplification type resist is remarkably seen, in consideration of the amount of acid lost at the bake and exposure time, the acid generating material is selected as the second material, and the resist film containing more acid generating materials may be formed in the resist film surface in a method similar to that of the present embodiment. Also with respect to the acid generating material for use herein, the experiments are repeatedly conducted for the film thickness width to be added and addition amount with respect to the available material, the material is selected, and the film thickness width to be added and addition amount may be optimized.

The evaporation of acid occurs particularly remarkably in the film surface. Therefore, the spray amount of the solution obtained by dissolving the acid generating material in the solvent is preferably increased with time.

Of course, to establish both a countermeasure against the evaporation of acid at the bake or exposure time and a countermeasure against the pattern deterioration at the development time, the dissolution inhibitor material and acid generating material are selected as the second materials. The resist film which contains more dissolution inhibitor and acid generating materials in the resist film surface may also be formed in a method similar to that of the present embodiment. Also with respect to the acid generating material for use herein, the experiments are repeatedly conducted for the film thickness width to be added and addition amount with respect to the available material, the material is selected, and the film thickness width to be added and addition amount may be optimized. Also in this case, the spray amount of the solution obtained by dissolving the acid generating material and dissolution inhibitor material in the solvent is preferably increased with time.

Examples of the resist as the object to which the present technique is applied include: chemical amplification type resists which have photo sensitivity with respect to deep-UV and vacuum ultraviolet light, such as KrF, ARF, and $F_2$ lasers (energy line); chemical amplification type resists which have photo sensitivity to high and low-acceleration electron beams (energy lines); and chemical amplification type resists which have photo sensitivity to ion beams (energy lines).

Note that the second material is scattered without being dissolved in the solvent, the solvent remains in the surface layer in the liquid film, and the second material may be supplied to the liquid film in this state.

Moreover, when a goal of changing the composition of a film thickness direction can be achieved using the same composition for the first and second materials, the same composition may be used in the first and second materials.

Seventh Embodiment

It is proposed to use an SiOC composition film whose permittivity is lower than that of an $SiO_2$ film as the interlayer insulating film for use in the semiconductor apparatus. Since the SiOC composition film is not dense, the material of a wiring formed in the surface is easily diffused. Therefore, the dense film such as the $SiO_2$ film is formed on the surface of the SiOC composition film in order to prevent the material from being diffused.

The SiOC composition film and $SiO_2$ film have to be thus separately formed, and the number of steps has increased. In the present embodiment, a manufacturing method of the semiconductor apparatus will be described in which the SiOC composition film and $SiO_2$ film are continuously formed so as to reduce the number of steps.

Figure 46A:
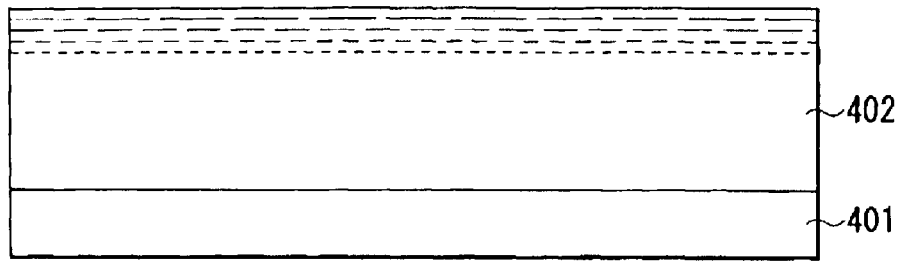
FIGS. 46A to 46C are a process sectional view showing the manufacturing process of the semiconductor apparatus according to a seventh embodiment.
Figure 46B:
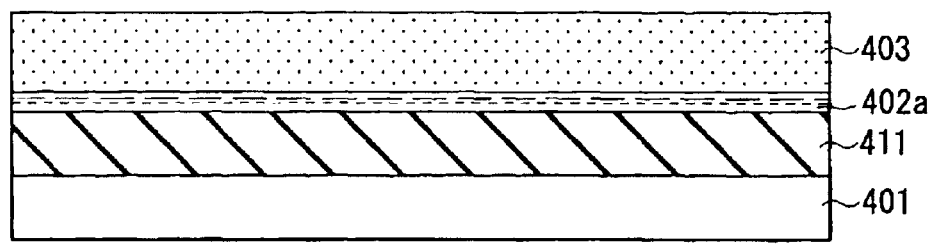
Figure 46C:
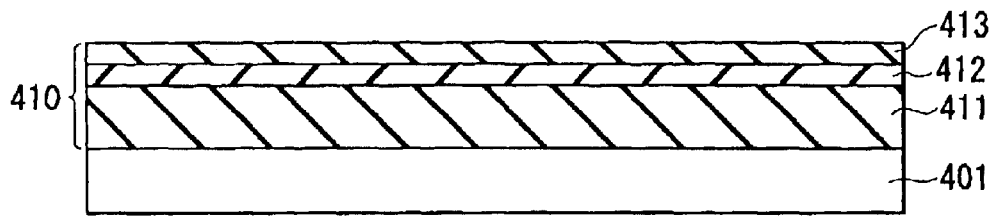

FIGS. 46A to 46C are process sectional views showing the manufacturing process of the semiconductor apparatus according to a seventh embodiment.

First, as shown in FIG. 46A, on a substrate 401, a liquid film 402 is formed including a solution (solid content of 10%) in which the first material mixed at a ratio of $SiO_2:SiOCH_3=1:r_1$ is dissolved in the solvent. The liquid film 402 is formed in a method similar to the forming method described in the first embodiment. Note that the substrate 401 includes the semiconductor substrate and is in the middle of the manufacturing process of the semiconductor apparatus.

Subsequently, the substrate 401 on which the liquid film 402 is formed is contained in the pressure reduction chamber. The liquid film is exposed to the reduced pressure substantially equal to the vapor pressure of the solvent included in the liquid film 402, and the solvent in the liquid film is slowly removed. The liquid film surface is vertically irradiated with a monochromatic light of 470 nm, the reflected light intensity change is monitored, and the removal process of the solvent is detected.

At a forming time of the liquid film 402, the thickness was about 10 μm (solid content of 10%). As shown in FIG. 46B, in a stage in which the height of the surface of a liquid film 402a from the surface of the substrate 401 is 1.5 μm, a second solution (second material solution) 403 in which a second material mixed at a ratio of $SiO_2:SiOCH_3=1:r_2$ $(r_1 > r_2)$ is dissolved in the solvent starts to be introduced into the pressure reduction chamber. A numeral number 411 denotes an SiOC composition film.

The second solution 403 is supplied in a state in which the pressure in the pressure reduction chamber is maintained. It has been confirmed that the second solution 403 is sprayed as mist onto the liquid film 402a surface in the pressure reduction chamber. The ratio $r_2$ is gradually reduced toward 0 with respect to a supply start time of the second solution 403, the supply amount of $SiOCH_3$ is changed. Moreover, in a stage in which the ratio $r_2$ turns to 0, the pressure in the pressure reduction chamber is lowered, and the second solution 403 containing only $SiO_2$ is introduced into the pressure reduction chamber. After an elapse of 30 seconds, the introduction of the second solution 403 is stopped.

The reduced pressure state is held for one minute after the introduction is stopped. The solvent is removed, and as shown in FIG. 46C, an SiOC composition film (solid film) 410 is formed. After the SiOC composition film 410 is formed, the pressure reduction chamber is opened, and the substrate 401 is removed. The thickness of the finally formed SiOC composition film 410 was 1.2 μm.

Figure 47:
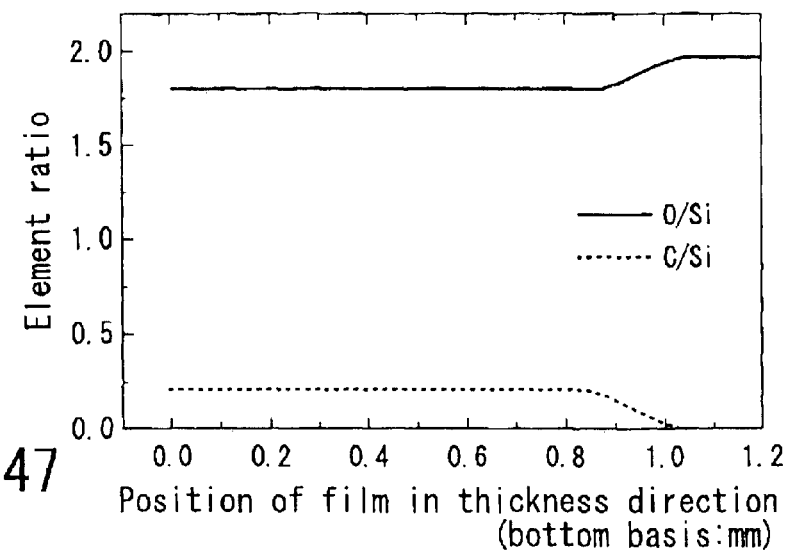
FIG. 47 is a diagram showing a distribution of film thickness direction of oxygen and carbon with respect to Si in an interlayer insulating film.

A distribution of the film thickness direction of oxygen and carbon with respect to Si in the obtained SiOC composition film 410 was obtained by analysis, and the result is shown in FIG. 47. As shown in FIG. 47, it is seen that a layer having a uniform composition of O/Si=1.8, C/Si=0.2 is obtained in the lower-layer film 411 in 0.8 μm from a bottom surface. It has been confirmed that a ratio of O gradually increases and ratio of C gradually decreases in an intermediate-layer film 412 between 0.8 μm and 1.1 μm. Furthermore, for an upper-layer film 413 having a film thickness of 0.1 μm on the intermediate-layer film 412, the existence of C is not seen, and it has been confirmed that the film having an $SiO_2$ composition is formed.

As described above, in a pressure reduction solvent removal process, the solution in which $SiO_2$ is dissolved is supplied to the liquid film being solidified, and thereby the low-permittivity interlayer insulating layers (0 to 1.1 μm) 411, 412 and upper-layer film (1.1 to 1.2 μm) 413 can easily be obtained.

Here, since the film to be finally formed is the $SiO_2$ film, the solution with only $SiO_2$ dissolved therein may be supplied to the liquid film. However, as described above, the supply amount of $SiOCH_3$ is gradually reduced, and finally only $SiO_2$ is supplied to the liquid film. The reason why the supply amount of $SiOCH_3$ is gradually reduced will be described hereinafter. $SiO_2$ is hydrophilic, and $SiOCH_3$ has properties between hydrophilic and hydrophobic properties. For the liquid film, $SiO_2$ and $SiOCH_3$ are dissolved in the solvent. When the solution with only $SiO_2$ dissolved therein is supplied in the mist form onto the liquid film in this state, the properties of the liquid film and solution differ from each other, and the solution with $SiO_2$ dissolved therein is condensed. Then, in order to inhibit the solution containing $SiO_2$ from being condensed, the supply amount of $SiOCH_3$ is gradually reduced, and the property of the solution is gradually changed.

Note that even with the supply of the second solution onto the liquid film, the material included in the second solution is not condensed, and in this case it is unnecessary to gradually change the mixture ratio.

Note that the film having a different composition ratio in the film thickness direction can be formed even using materials other than the above-described materials. The material whose composition ratio is known can be applied to the formation of the film constituted of any material.

Note that the supply timing of the second solution may be adjusted so as to obtain the desired permittivity. To determine the actual supply timing and the materials included in the liquid film and second solution, the composition ratio of the materials included in the liquid film, concentration of the solid content in the liquid film, pressure reduction condition, composition ratio of the materials included in the second solution, solid content concentration in the second solution, supply speed into the chamber, and supply time are used as parameters to form a plurality of films. Subsequently, with respect to the formed films, the composition of the film thickness direction is analyzed by element analysis, the permittivity is measured, and the parameters may be determined so as to obtain the predetermined film conditions.

Moreover, the above-described method is not limited to the formation of the SiOC composition film, and can also be applied to the forming of an electrode or wiring. In this case, an electrode or wiring material may be used in the first material, and a diffusion inhibitor material may be used in the second material for the purpose of preventing the first material from being diffused. To determine the materials or supply timing of the second material, in the same manner as in the above-described interlayer film formation, the composition ratio of the first materials, concentration of the materials dissolved in the solvent, solvent, pressure reduction condition, composition ratio of the second materials, concentration of the materials dissolved in the solvent, solvent, supply speed into the chamber, and supply time are used as the parameters to form the films. Subsequently, with respect to the formed films, the composition of the film thickness direction is analyzed by element analysis, the permittivity is measured, resistance value is also measured, and the respective parameters may be determined so as to obtain the desired film conditions.

Eighth Embodiment

The present invention relates to a method of using a coating type silica glass film to form a film which has a distribution of photo acid generating materials on the surface.

As described as the problem in Jpn. Pat. No. 2842909, when the conventional silica glass film is used, acid generated by the chemical amplification type resist at the exposure time is diffused in the silica glass film, and problems such as an opening defect are caused.

In Jpn. Pat. No. 2842909, it is described that an acid material is introduced into the surface of the silica glass film, and thereby opening defects can be prevented.

In an eighth embodiment, a method of using the above-described method to manufacture the silica glass film (silica dioxide compound) which contains the acid material in the surface will be described.

FIGS. 48A to 48E are sectional views showing the manufacturing processes of the semiconductor apparatus according to the eighth embodiment of the present invention.

Figure 48A:
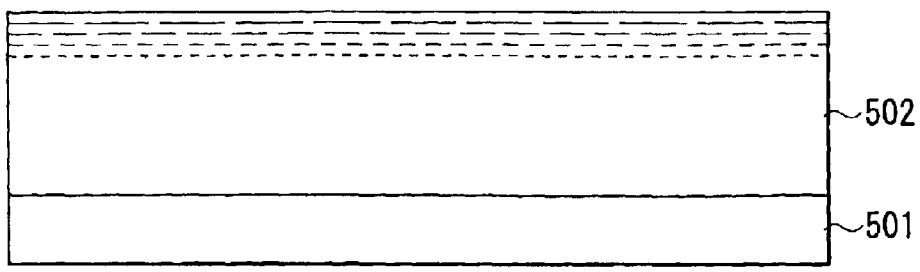
FIGS. 48A to 48E are a process sectional view showing the manufacturing process of the semiconductor apparatus according to an eighth embodiment.

First, as shown in FIG. 48A, on a substrate 501, a liquid film 502 is formed including a first solution in which the first material mixed at a ratio of $SiO_2:SiOCH_3=1:a_1$ is dissolved in the solvent. For the forming method of the liquid film, a method similar to that described in the first embodiment is preferably used. The solid content in the liquid film 502 is 3%, and the thickness at the liquid film forming time is about 10 $\mu$m. Note that the substrate 501 includes the semiconductor substrate and is in the middle of the manufacturing process of the semiconductor apparatus.

Subsequently, the substrate 501 on which the liquid film 502 is formed is inserted into the pressure reduction chamber. The liquid film is exposed to the reduced pressure substantially equal to the vapor pressure of the solvent included in the liquid film 502, and the solvent in the liquid film 502 is slowly removed. The surface of the liquid film 502 is vertically irradiated with monochromatic light of 470 nm, and the removing process of the solvent is monitored from the reflected light intensity change.

Figure 48B:
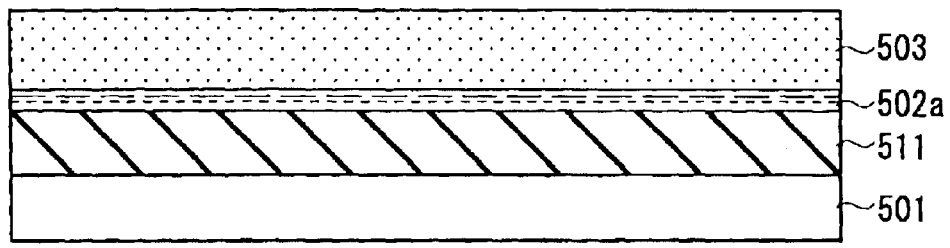

As shown in FIG. 48B, in a stage in which the height of the surface of a liquid film 502a is 0.4 $\mu$m, the pressure in the pressure reduction chamber is maintained, and a second solution 503 in which photo acid generating materials such as sulfonate are dissolved in the solvent starts to be introduced into the pressure reduction chamber. It has been confirmed that the second solution 503 is sprayed as mist onto the liquid film 502a surface in the pressure reduction chamber. After the elapse of 30 seconds, the pressure reduction chamber is opened and the substrate is removed. Note that a numeral number 511 denotes a lower-layer film from which the solvent is removed and which includes $SiO_2$ and $SiOCH_3$.

Figure 48C:
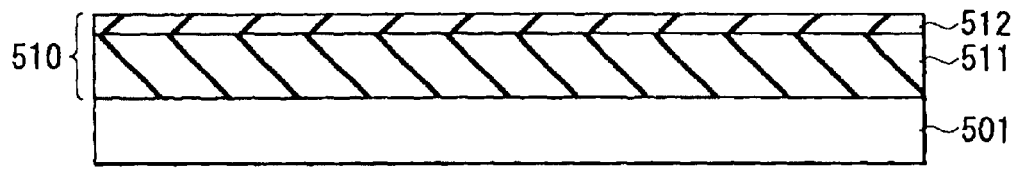

As shown in FIG. 48C, the thickness of a silica glass film 510 formed by removing the solvent was 0.3 $\mu$m. As a result of physicochemical analysis, it has been confirmed that the acid generating material is included in an upper-layer film 512 in a range of 20 nm from the film surface.

Figure 48D:
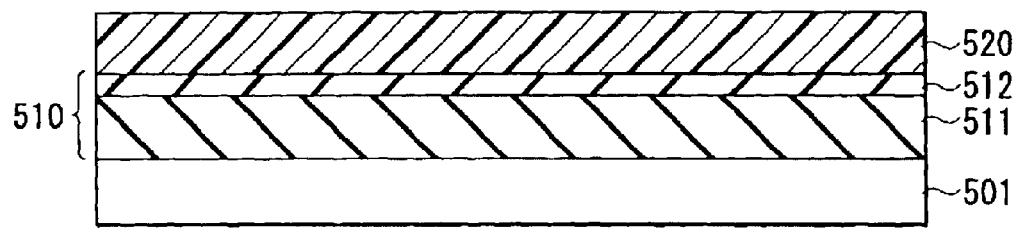

Subsequently, as shown in FIG. 48D, a chemical amplification type resist film 520 is formed on the silica glass film 510. The chemical amplification type resist film 520 is successively subjected to pre-exposure baking and cooling. Thereafter, with respect to the chemical amplification type resist film 520, the predetermined pattern is exposed. After exposure, post-exposure baking and cooling are performed.

Figure 48E:
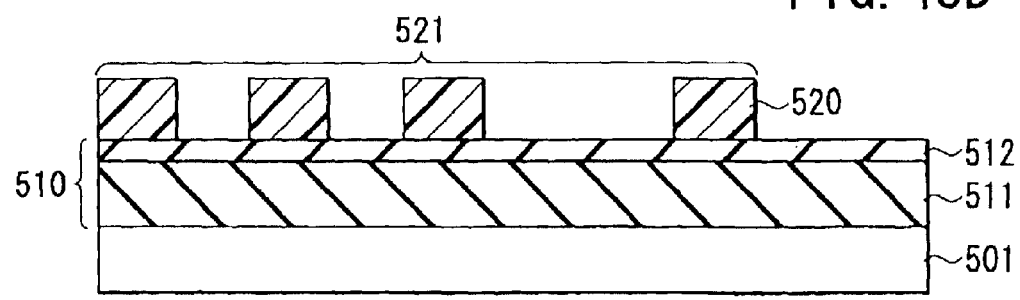

Subsequently, as shown in FIG. 48E, the chemical amplification type resist film 520 is developed to form a resist pattern 521.

For the silica glass film 510 prepared according to the present embodiment, since the photo acid generating material is distributed in the upper-layer film 512 of the surface, the above-described problem can be solved. Even when the film is coated with the chemical amplification type resist, exposed, and developed to prepare the device pattern, a resist process superior in dimensional uniformity can be performed without any opening defect.

The present invention is superior to Jpn. Pat. No. 2842909 in that the acid generation amount of silica glass as a foundation can easily be adjusted for each chemical amplification type resist film. This can solve problems that depending on the chemical amplification type resist film, a slight opening defect has heretofore been generated because of acid shortage with the use of silica glass with the same photo acid generating material introduced therein, and a pattern lower part becomes thin and falls because of excess acid.

Note that the actually prepared film is coated with the chemical amplification type and exposed/developed to form the pattern, the shape and dimension of the pattern are measured, defects are checked, and thereby the thickness and amount of a region including the photo acid generating material in the present embodiment may be optimized.

Ninth Embodiment

Figure 49A:
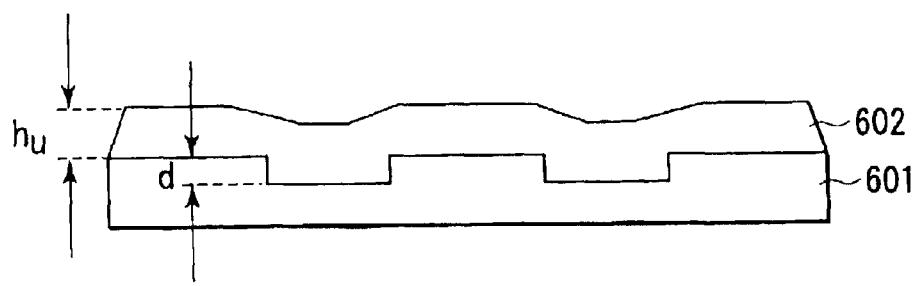
FIGS. 49A to 49C are a process sectional view showing the manufacturing process of the semiconductor apparatus according to a ninth embodiment.
Figure 49B:
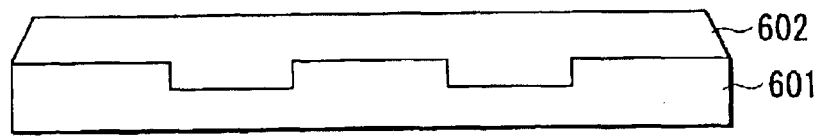
Figure 49C:
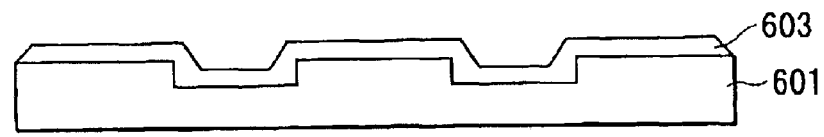

A solid film forming method according to the present embodiment will be described with reference to the process sectional views of FIGS. 49A to 49C. FIGS. 49A to 49C are the process sectional views showing the manufacturing processes of the semiconductor apparatus according to a ninth embodiment of the present invention.

First, as shown in FIG. 49A, a liquid film 602 including the resist solution is formed on a substrate 601 which includes a 1 µm stepped portion and whose area ratio of a convex portion to a concave portion is 1:1. At the forming time of the liquid film 602, the liquid film is formed so that a thickness h of the liquid film 602 is larger than 10.5 µm. In the present embodiment, the liquid film 602 was formed so as to set an average height to 15 µm.

The liquid film 602 is formed using the liquid film forming apparatus described in the sixth embodiment and shown in FIG. 42. As a concrete condition, on the substrate fixed onto the stage, the solution discharge nozzle (Φ40 µm) is reciprocated/moved by the nozzle driving unit in the column-direction at a speed of 1 m/s. When the solution discharge nozzle is positioned outside the substrate, the stage is successively moved by the stage driving unit at a pitch of 0.3 mm in the row-direction, and the resist solution (solid content of 3.0%) is linearly discharged to form the liquid film 602.

Note that to adjust the thickness of the liquid film 602, any one of the solid content in the solution, relative movement pitch of the substrate and solution discharge nozzle, relative movement speed, and discharge amount of the solution is controlled.

Subsequently, as shown in FIG. 49B, the substrate 601 on whose surface the liquid film 602 is formed is sealed in the treatment container filled with the atmosphere of the solvent for 60 seconds, and the liquid film 602 surface is leveled (flatted).

Figure 50:
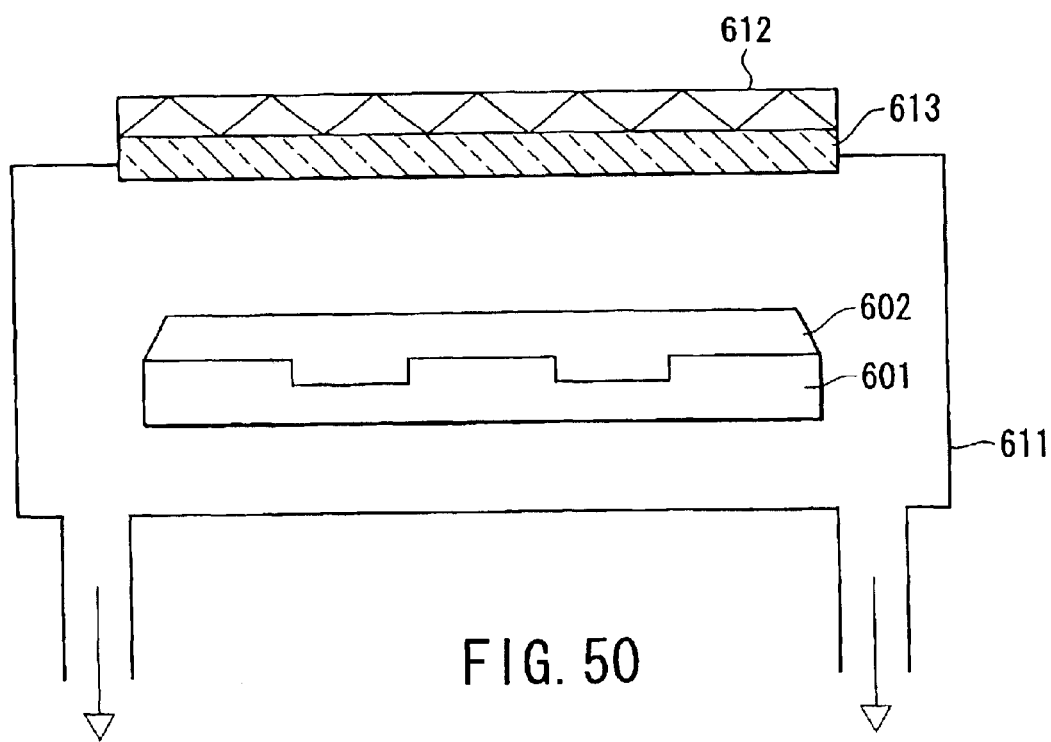
FIG. 50 is a diagram showing a schematic constitution of a pressure reduction drying treatment unit according to the ninth embodiment.

Next, as shown in FIG. 49C, the solvent in the liquid film 602 is removed, and a resist film 603 including the solid content in the liquid film 602 is formed. One example of the removal of the solvent in the liquid film 602 will be described hereinafter. The substrate is contained in a pressure reduction drying treatment unit including an infrared irradiation portion shown in FIG. 50, and the treatment container is exhausted at a pressure reduction speed of −100 Torr/sec. When the pressure in a treatment container 611 reaches 2 Torr as the vapor pressure of the solvent in the liquid film, the liquid film 602 on the substrate 601 is irradiated with infrared rays from an infrared irradiation portion 612. Note that an infrared wavelength is set to a range of 2.5 to 3.0 µm including a wavelength to be absorbed by the solvent of a coat liquid for use. The whole substrate surface is irradiated with the infrared rays through a quartz window 613 from the outside of the treatment container 611. By the pressure reduction effect and the heating by the infrared rays, the solvent in the liquid film 602 is rapidly vaporized, and the resist film 603 constituted of the solid content included in the solution is formed on the substrate 601 in two seconds.

The film thickness distribution of the coat film which is formed by the above-described process and which includes a 1.0 µm stepped portion on the substrate is shown in FIG. 51A. As shown in FIG. 51A, the thickness of the resist film 603 formed in the concave portion of the substrate 601 was 0.465 µm, and the thickness of the resist film 603 formed in the convex portion was 0.435 µm. A difference in the thickness between the coat films formed on the concave and convex portions is about 7% with respect to an average film thickness of 0.450 µm and the coat film can thus be formed along the substrate surface with good uniformity.

Two samples including liquid films having different film thicknesses were formed in a method different from the above-described film forming method, and were compared with the resist film formed in the method described in the present embodiment. Additionally, the solid content in the solution was changed so that the average value of the film thicknesses of the resist films in the concave and convex portions formed in two samples was 0.450 µm, in the same manner as in the resist film formed in the above-described method.

Sample B: formed using a resist solution including a solid content of 6.4% so that the average height of the liquid film is 7 µm.

Sample C: formed using the liquid film of the resist solution including a solid content of 9% so that the average height of the liquid film is 5 µm.

The film thickness distributions of the coat films in the respective samples B, C are shown in FIGS. 51B, 51C. With the sample B, the film thickness of the concave portion of a resist film 603' was 0.48 µm, and the film thickness of the convex portion of the resist film 603' was 0.416 µm. The film thickness difference with respect to the average film thickness of 0.45 µm deteriorated at about 14%. With the sample C, the film thickness of the concave portion of a resist film 603'' was 0.495 µm, and the film thickness of the convex portion of the resist film 603'' was 0.405 µm. The film thickness difference with respect to the average film thickness of 0.45 µm greatly deteriorated at about 20%.

The above-described results are shown in a graph of FIG. 52. As shown in FIG. 52 and as described above, the coat film can uniformly (film thickness difference within 10%) be formed along the concave/convex portion on the concave/convex substrate only with the sample using the present method. Note that FIG. 52 shows the sample formed in the method described in the present embodiment as the sample A.

The effect of the present invention will next be described.

By the above-described coating method, the liquid film is formed on the substrate including the stepped portion at a ratio of the concave portion to the convex portion, which is 1:1. Thereafter, the liquid film flows into the concave portion from the convex portion by the fluidity of the liquid film and is smoothed. Therefore, after the leveling step, there is no stepped portion in the concave/convex portion in the liquid film surface (FIG. 49B). Therefore, when the solvent is rapidly vaporized from the liquid film in this state, each solid film thickness formed in the concave/convex portion in a unit area of the solid content is represented by the following equations (12), (13):

$$\frac{(h+0.5d)p \cdot c_L}{c_S} \tag{12}$$

$$\frac{(h-0.5d)p \cdot c_L}{c_S} \tag{13}$$

h: average liquid film thickness
d: stepped portion height
p: solid content (ratio)
$c_S$: density of the liquid film
$c_L$: density of the solid content in the solid film A condition on which the difference of the film thicknesses of the concave and convex portions is 10% is represented by equation (14):

$$\frac{(h+0.5d)p \cdot c_L}{c_S} : \frac{(h-0.5d)p \cdot c_L}{c_S} = 1.1:1 \quad (14)$$

Therefore, in order to set the difference of the film thickness of the concave/convex portion to be within 10%, the condition of equation (15) obtained by solving the equation (14) needs to be satisfied.

$$h > 10.5d \quad (15)$$

As shown in the equation (15), the average liquid film thickness needs to be larger than 10.5 times the stepped portion height.

In the above-described method, since the relation is satisfied, the film thickness difference can be set to be within the predetermined range, and the film having a substantially uniform film thickness along the stepped portion can be obtained. Moreover, the parameters described in the equation (15) include only shelf height and liquid thickness, and the solid content and density in the liquid film are not used.

The concave/convex portion will be described in which a ratio of the area of the convex portion to the whole area is a (1>a>0), and a ratio of the area of the concave portion to the whole area is 1−a. In the leveled state, a film thickness $h_1$ in the concave portion and film thickness $h_u$ in the convex portion are as follows:

$$h_1 = h + ad$$

$$h_u = h + (a-1)d$$

Therefore, when the solvent is rapidly vaporized from the liquid film in the leveled state, each solid film thickness formed in the concave/convex portion in the unit area of the solid content is represented by the following equations (16), (17):

$$\frac{(h+ad)p \cdot c_L}{c_S} \quad (16)$$

$$\frac{(h+(a-1)d)p \cdot c_L}{c_S} \quad (17)$$

The condition on which the difference of the film thicknesses of the concave and convex portions is 10% is represented by equation (18):

$$\frac{(h+ad)p \cdot c_L}{c_S} : \frac{(h+(a-1)d)p \cdot c_L}{c_S} = 1.1:1 \quad (18)$$

Therefore, in order to set the difference of the film thickness of the concave/convex portion to be within 10%, the condition of equation (19) obtained by solving the equation (18) needs to be satisfied:

$$h > (11-a)d \quad (19)$$

As represented by the equation (19), with the concave/convex substrate whose ratio of the concave portion is a, the thickness needs to be larger than (11−a) times the stepped portion height d.

On the other hand, the resist including the solid content of 1.8% is used, and the average thickness of the concave and convex portions of the liquid film is set to 25 µm so that the film thickness of the solid content after the drying of the solvent is 0.450 µm. In this case, since the relation of the equation (15) is satisfied, the film thickness of the concave portion is 0.459 µm, that of the convex portion is 0.441 µm, the film thickness difference is 4%, and the film is thus formed with high precision as compared with the present invention.

Figure 53:
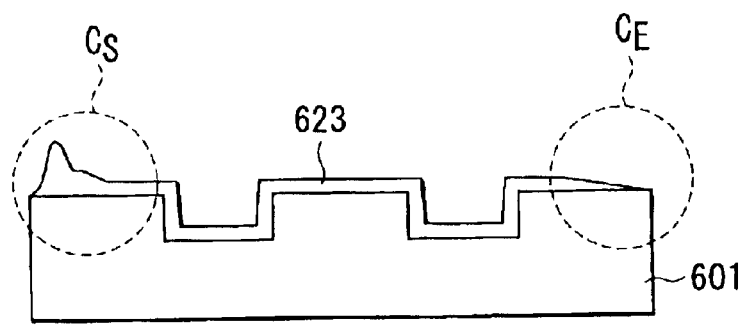
FIG. 53 is a sectional view showing the film thickness distribution of the resist film formed on the substrate according to the ninth embodiment.

However, as shown in FIG. 53, as seen from the film thickness distribution over the whole surface of a substrate 601, it has been confirmed that the film thickness of a resist film 623 largely fluctuates in substrate peripheral edge regions in the coating start and end portions, and the film thickness uniformity is largely deteriorated. This film thickness fluctuation was not seen when the film was formed with an average liquid film thickness of 15 µm as described above.

Figure 54:
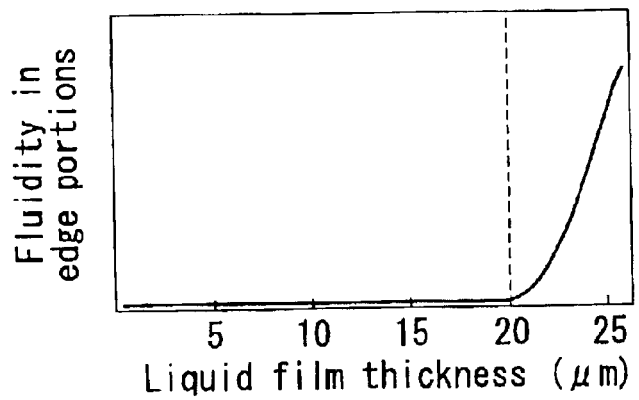
FIG. 54 is a characteristic diagram showing dependence of fluidity in an edge portion on the liquid film thickness.
Figure 55:
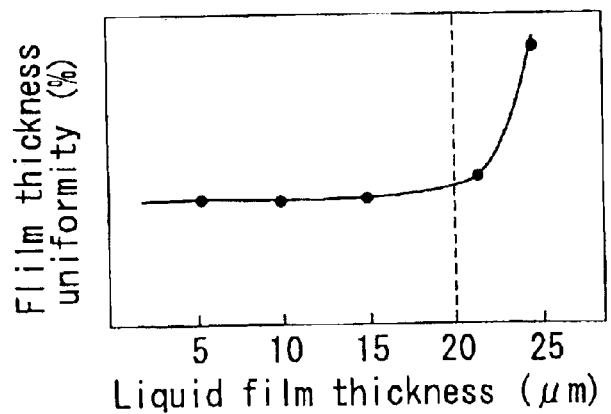
FIG. 55 is a characteristic diagram showing dependence of film thickness uniformity of a convex portion in the whole substrate surface on the liquid film thickness.

As disclosed in Jpn. Pat. KOKAI Publication No. 2001-168021 by the present inventors, the reason why the film thickness fluctuation is caused is that the flow by gravity is caused with a liquid thickness not less than the thickness which can be supported by the substrate. FIG. 54 shows dependence of fluidity in edge portions on the liquid film thickness. It is seen that the fluidity rapidly increases with the thickness exceeding 20 µm. FIG. 55 shows the dependence of the film thickness uniformity of the convex portion in the whole substrate surface on the liquid film thickness. The drawings also show the film prepared with a liquid thickness of 22 µm. It is seen from FIGS. 54, 55 that the film thickness uniformity is correlated with fluidity and the film thickness uniformity rapidly deteriorated at a boundary of 20 µm. As described above, also in the present invention method, in order to obtain the uniform coat film over the whole concave/convex substrate surface, it is preferable to satisfy the equation (19) and to set the liquid film thickness to be less than 20 µm.

As described above, for the film forming method described in the present embodiments, various conditions can be changed. The liquid film forming method is not limited to the above-described coating or spiral coating method. Moreover, the present method can also be applied to the liquid film prepared in various methods such as a method of discharging or spraying the solution to form the film, and a method of using the meniscus phenomenon to form the film as disclosed in Jpn. Pat. Appln. KOKAI Publication Nos. 2-220428, 6-151295, 7-321001, 2001-310155, and 11-243043.

Moreover, the drying method is not limited to the present invention method. For example, a baking method of heating/drying the substrate directly with a hot plate, air-current drying method, and the like may also be used. Additionally, the conditions can be changed as long as the conditions do not run counter to the scope of the present invention.

Note that the present invention is not limited to the above-described embodiments, and can variously modified and carried out without departing from the scope.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A film forming method comprising:
   forming a liquid film including a solution in which a first material is dissolved in a solvent on a substrate;

removing the solvent from the liquid film, until a substrate side of the liquid film solidifies and the solvent remains on a side opposite to the substrate side;

supplying a second material into the liquid film in a state in which the solvent remains in a surface layer of the liquid film; and removing the solvent remaining in the liquid film to form a solid film.

2. The film forming method according to claim 1, wherein the second material is different from the first material in a material or composition.

3. The film forming method according to claim 1, wherein the second material includes the material included in the first material.

4. The film forming method according to claim 1, further comprising:

adjusting the solution so as to spread over the substrate by a given amount; and continuously discharging the solution onto a substrate from a nozzle, holding the discharged solution on the substrate, and moving the discharge nozzle and substrate with respect to each other to form the liquid film.

5. The film forming method according to claim 1, wherein the supplying of the second material comprises: supplying a second solution in which the second material is dissolved in the solvent onto the surface of the liquid film.

6. The film forming method according to claim 1, wherein the solid film is a resist film, the first material includes a resist material including a material which has photosensitivity to an energy line, and the second material includes a dissolution inhibitor material which inhibits the resist film from being dissolved by a developer.

7. The film forming method according to claim 1, wherein the first and second materials include an acid generating material which generates acid molecules in response to an energy line, and the solid film is a chemical amplification type resist film.

8. The film forming method according to claim 1, wherein the first material includes a silicon oxide compound, and the second material includes a photo acid generating material.

9. The film forming method according to claim 1, wherein the second material includes a plurality of materials, and the second material whose mixture ratio of the materials is changed with time is supplied onto the liquid film.

10. The film forming method according to claim 9, wherein the first material includes a silicon oxide compound containing $SiO_2$ and carbon, and the first material whose mixture ratio of the silicon oxide compound containing $SiO_2$ and carbon is changed with time is supplied onto the liquid film.

11. A film forming method comprising:

preparing a substrate which includes a concave/convex portion having a stepped portion height of d and in which a rate of an area of the convex portion to the whole area is a (1>a>0) and a rate of an area of the concave portion to the whole area is 1−a;

discharging a solution in which a solid content is dissolved in a solvent, moving a discharge nozzle and substrate with respect to each other, and forming a liquid film on the substrate; and removing the solvent in the liquid film, and forming a solid film including the solid content, wherein the liquid film is formed so that a thickness h of the liquid film satisfies a relation of h>(11−a)d.

12. The film forming method according to claim 11, further comprising: flatting the surface of the liquid film before removing the solvent.

13. The film forming method according to claim 11, wherein the thickness h of the liquid film is smaller than 20 $\mu$m.

* * * * *